(12) United States Patent
Shiba et al.

(10) Patent No.: US 7,732,261 B2
(45) Date of Patent: Jun. 8, 2010

(54) SEMICONDUCTOR DEVICE AND A METHOD OF MANUFACTURING THE SAME

(75) Inventors: Kazuyoshi Shiba, Tokyo (JP); Hideyuki Yashima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 124 days.

(21) Appl. No.: 12/137,955

(22) Filed: Jun. 12, 2008

(65) Prior Publication Data

US 2009/0008690 A1    Jan. 8, 2009

(30) Foreign Application Priority Data

Jul. 3, 2007    (JP) .............................. 2007-174683

(51) Int. Cl.
*H01L 21/82* (2006.01)

(52) U.S. Cl. ..................... 438/129; 438/128; 438/257; 438/599; 257/E21.179; 257/E21.422; 257/E21.68

(58) Field of Classification Search ................. 438/599; 257/E21.179, E21.662

See application file for complete search history.

(56) References Cited

U.S. PATENT DOCUMENTS 7,601,581 B2 * 10/2009 Taniguchi et al. ........... 438/201

2007/0058441 A1    3/2007 Oka et al.
2007/0210388 A1    9/2007 Shiba
2009/0093096 A1 *  4/2009 Shiba ........................ 438/238

FOREIGN PATENT DOCUMENTS

| JP | 2002-16249 A | 1/2002 |
|----|---|---|
| JP | 2007-110073 A | 4/2007 |
| WO | WO 2005/101519 A1 | 10/2005 |

* cited by examiner

*Primary Examiner*—Savitri Mulpuri
*Assistant Examiner*—Cheung Lee
(74) *Attorney, Agent, or Firm*—Miles & Stockbridge P.C.

(57) ABSTRACT

In a memory cell array on a main surface of a semiconductor substrate, a floating gate electrode for accumulating charges for information is arranged. The floating gate electrode is covered with a cap insulating film and a pattern of a first insulating film formed thereon. Further, over the entire main surface of the semiconductor substrate, a second insulating film is deposited so that it covers the pattern of the first insulating film and a gate electrode. The second insulating film is formed by a silicon nitride film formed by a plasma CVD method. The first insulating film is formed by a silicon nitride film formed by a low-pressure CVD method. By the provision of such a first insulating film, it is possible to suppress or prevent water or hydrogen ions from diffusing to the floating gate electrode, and therefore, the data retention characteristics of a flash memory can be improved.

5 Claims, 40 Drawing Sheets

SEMICONDUCTOR DEVICE AND A METHOD OF MANUFACTURING THE SAME

CROSS-REFERENCE TO RELATED APPLICATION

The present application claims priority from Japanese patent application No. 2007-174683 filed on Jul. 3, 2007, the content of which is hereby incorporated by reference into this application.

BACKGROUND OF THE INVENTION

The present invention relates to a semiconductor device and its manufacturing technique and more particularly to a technique which is useful for the semiconductor device having a nonvolatile memory.

Some semiconductor devices include a nonvolatile memory circuit portion therein for storing a comparatively small amount of information, such as information used at the time of, for example, trimming, recovering, and LCD (Liquid Crystal Device) image adjustment, and the production number of a semiconductor device.

For example, Japanese Unexamined Patent Publication No. 2007-110073 (Patent Document 1) describes a semiconductor device having a nonvolatile memory circuit portion of this kind. In Patent Document 1, a configuration is disclosed, in which data rewrite (write and erase) is carried out by means of an FN tunnel current over the entire channel surface in a capacity portion for data write and erase of a nonvolatile memory cell. In the nonvolatile memory cell in Patent Document 1, a single layer floating gate electrode is formed over the main surface of a semiconductor substrate via a gate insulating film. At each position of the plane of the floating gate electrode, the capacity portion, the capacity portion for write/erase, and a read portion are arranged. The floating gate electrode is covered with a silicon nitride film and a silicon oxide film deposited thereover. The silicon nitride film has a function as an etching stopper when forming a contact hole in the silicon oxide film.

For example, in International Publication WO2005/101519 pamphlet (Patent Document 2), a configuration is disclosed, in which a silicon oxide film is provided between the silicon nitride film and the floating gate electrode in the semiconductor device having a nonvolatile memory circuit portion with the same configuration as that in Patent Document 1.

For example, Japanese Unexamined Patent Publication No. 2002-16249 (Patent Document 3) discloses a technique for providing a silicon nitride film formed by the low-pressure CVD method as a film for suppressing hydrogen from diffusing outwardly in the upper layer side of a film containing hydrogen, which covers a MIS, in order to effectively supply hydrogen to a gate insulating film of a MIS type element.

SUMMARY OF THE INVENTION

The present inventors, however, have found for the first time that the semiconductor device having the nonvolatile memory circuit as described in Patent Documents 1 and 2 has the following problems.

There may be a case where water ($H_2O$) is floating on a semiconductor substrate in a state where water is separated into hydrogen ions ($H^+$) and hydroxide ions ($OH^-$). If the hydrogen ions diffuse to the floating gate electrode of the nonvolatile memory circuit, electrons in the floating gate electrode contributing to the storage of information are neutralized by the hydrogen ions and data is deleted.

As described above, the floating gate electrode of the nonvolatile memory circuit is covered with the silicon nitride film that functions as an etching stopper and therefore the floating gate electrode seems to be protected against water and hydrogen ions. However, according to the discussion of the present inventors, the barrier property of the silicon nitride film is low against hydrogen ions. Further, in the silicon nitride film formed by the plasma CVD method, cracks are likely to occur at its foot covering the floating gate electrode, and therefore, water or hydrogen ions are allowed to invade the floating gate electrode side therethrough. As a result, there arises a problem that data retention characteristics of the nonvolatile memory circuit are deteriorated.

An object of the present invention is to provide a technique capable of improving the data retention characteristics of a nonvolatile memory circuit.

The above and further objects and novel features of the invention will more fully appear from the following detailed description in this specification and the accompanying drawings.

Preferred embodiments of the invention which will be disclosed herein are briefly outlined below.

That is, the present embodiment has a first circuit region having a nonvolatile memory and a second circuit region having circuits other than the nonvolatile memory, having a floating gate electrode constituting the nonvolatile memory in the first circuit region and having gate electrodes constituting circuits other than the nonvolatile memory in the second circuit region, wherein: on a first main surface of a semiconductor substrate, an insulating film containing nitrogen, and an insulating film containing oxygen formed by the plasma chemical vapor deposition method are deposited sequentially so that they cover the floating gate electrode and the gate electrode; in the first circuit region, on the main surface of the semiconductor substrate, a pattern of a first insulating film containing nitrogen is formed so that it covers the floating gate electrode; on the main surface of the semiconductor substrate, a second insulating film containing nitrogen and a third insulating film containing oxygen are deposited sequentially so that they cover the pattern of the first insulating film and the gate electrode; and the first insulating film is formed by a film finer than the second insulating film.

The effect brought about by preferred embodiments of the invention is briefly described as follows.

The data retention characteristics of a nonvolatile memory circuit can be improved.

BRIEF DESCRIPTION OF THE DRAWINGS

FIG. 4(*b*) is a graph showing the dependency of the threshold value of the memory cell on the location in a wafer after countermeasures.

DETAILED DESCRIPTION OF THE PREFERRED EMBODIMENTS

Figure 1:
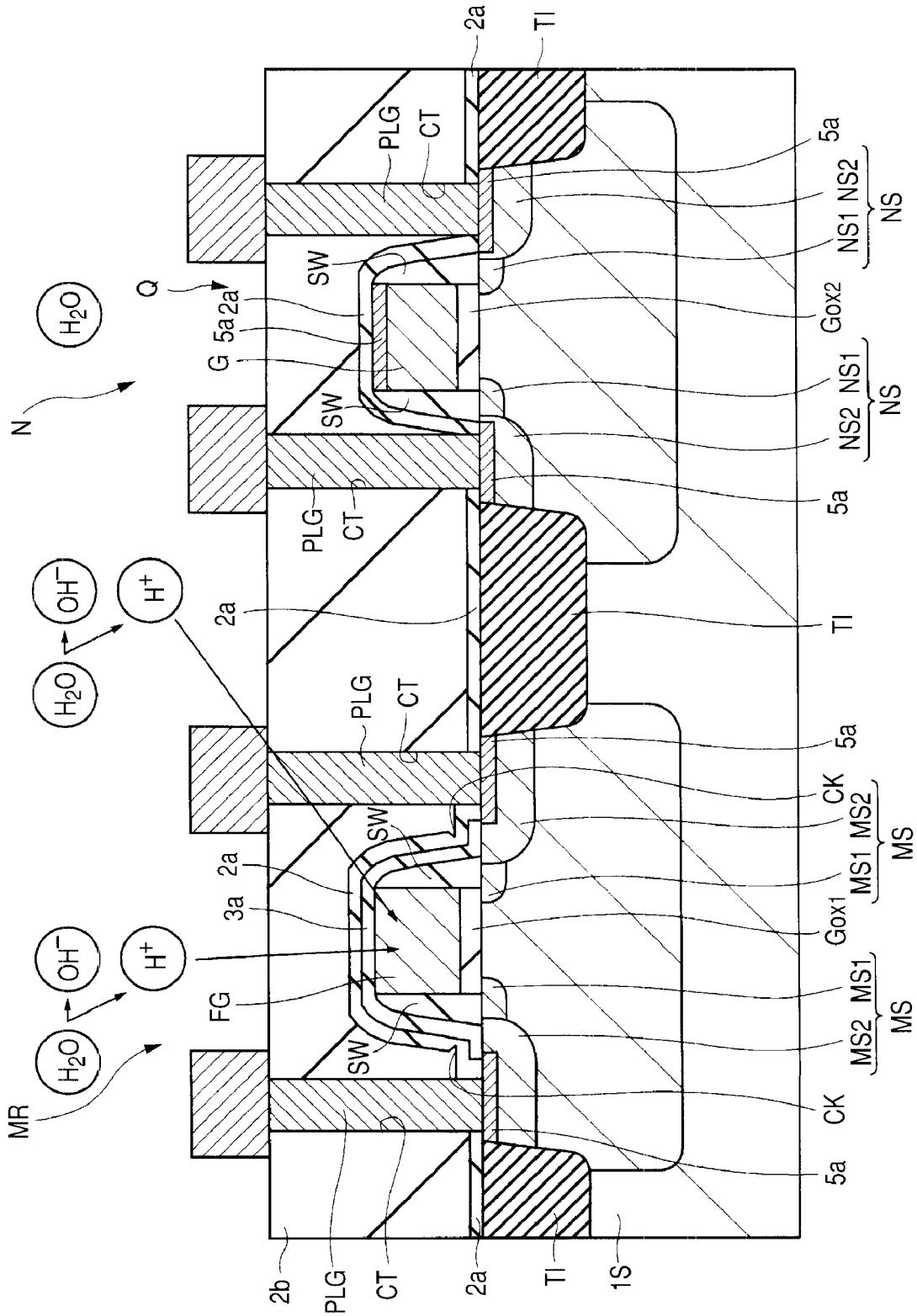
FIG. 1 is a cross sectional view of essential parts of a semiconductor device having a flash memory discussed by the present inventors.

In the following embodiments, description is given by dividing an embodiment into a plurality of sections or embodiments when necessary from the standpoint of convenience, however, except when explicitly specified in particular, these sections are not unrelated to one another but they are in a relationship in which one of them is a modification, detail, supplementary description, etc., of part of the others or all of them. Further, in the following embodiments, when the number of elements etc. (including counts, numeric values, quantities, ranges, etc.) is referred to, it is not limited to the specific number but may be more or less than the specific number except when explicitly specified in particular or except when the number is obviously limited to the specific number in principle. Furthermore, in the following embodiments, the components (including constitutional steps) are not always indispensable except when explicitly specified in particular or except when they are obviously considered to be indispensable in principle. Similarly, in the following embodiments, when the shape, positional relationship, etc., of the components etc. are referred to, those substantially approximate or similar to them in shape etc. are also included except when explicitly specified in particular or when they are obviously considered to be excluded in principle. The above also applies similarly to the numeric values and ranges. In all the drawings that illustrate the preferred embodiments, elements with like functions are designated by like reference numerals and repeated description of such elements is omitted whenever possible. Hereinafter, embodiments of the present invention will be described in detail, referring to drawings.

First Embodiment

First, the problem of a semiconductor substrate having a flash memory as a nonvolatile memory discussed by the present inventors will be described.

FIG. 1 shows a cross sectional view of essential parts of a semiconductor device having a flash memory discussed by the present inventors. Symbol MR denotes a memory region (first circuit region) of the flash memory and symbol N denotes essential parts of a main circuit region (second circuit region). Here, the main circuit region N is illustrated as the second circuit region, however, the second circuit region includes regions in which circuits other than the flash memory are arranged, such as the arrangement region of peripheral circuits of the flash memory, in addition to the main circuit region N.

A semiconductor substrate (hereinafter, referred to as a substrate) 1S constituting a semiconductor chip is formed by, for example, a p-type (second conductivity type) silicon (Si) single crystal. The substrate 1S has a main surface (first main surface) and an undersurface (second main surface) located in opposition to each other along a thickness direction. Over the main surface of the substrate 1S, an isolation portion TI is formed. The isolation portion T1 is a portion that defines an active region. Here, the isolation portion TI is formed as a groove-shaped isolation portion, which is formed by, for example, embedding an insulating film made of a silicon oxide film etc. in a shallow groove dug in the main surface of the substrate IS, and referred to as a so-called SGI (Shallow Groove Isolation) or STI (Shallow Trench Isolation).

A floating gate electrode FG of the memory cell array MR is a portion that accumulates charges contributing to the storage of information. The floating gate electrode FG is made of a conductive film, such as a low-resistance polycrystal silicon film and formed in a state of being electrically floated (a state of being insulated from other conductors).

On the right and left substrates 1S in a width direction of the floating gate electrode FG of the memory cell array MR (on both sides with a channel sandwiched in between), a semiconductor region MS is formed. The semiconductor region MS has a semiconductor region MS1 with a low impurity concentration and a semiconductor region MS2 with a high impurity concentration higher than that of MS1.

The semiconductor region MS1 with a low impurity concentration is formed at a position nearer to the channel than the semiconductor region MS2 with a high impurity concentration. The semiconductor region MS1 with a low impurity concentration and the semiconductor region MS2 with a high impurity concentration are caused to have the same conductivity type and electrically coupled to each other.

However, the conductivity type of the semiconductor regions MS (MS1, MS2) on both the right and left sides in the width direction of the floating gate electrode FG may be the same, or may be of different conductivity types, as will be described later. That is, if one is of p-type ($p^-$-type, $p^+$-type), the other may be n-type ($n^-$-type, $n^+$-type). The reason for that will be described later using a specific example.

A gate electrode G of the main circuit region N is a MIS•FETQ gate electrode for forming the main circuit. The gate electrode G is formed by a conductive film, such as a low-resistance polycrystal silicon film.

On the right and left substrates 1S in the width direction of the gate electrode G of the main circuit region N (on both sides with a channel sandwiched in between), a semiconductor region NS is formed. The semiconductor region NS has a semiconductor region NS1 with a low impurity concentration and a semiconductor region NS2 with a high impurity concentration higher than that of NS1.

The semiconductor region NS1 with a low impurity concentration is formed at a position nearer to the channel than the semiconductor region NS2 with a high impurity concentration. The semiconductor region NS1 with a low impurity concentration and the semiconductor region NS2 with a high impurity concentration are caused to have the same conductivity type and electrically coupled to each other. The conductivity type of the semiconductor regions NS (NS1, NS2) on the right and left sides in the width direction of the gate electrode G is the same to each other.

Over the main surface of the above substrate 1S, an insulating film 2a is deposited so that it covers the floating gate electrode FG and the gate electrode G and an interlayer insulating film (insulating film) 2b is further deposited thereon with a thickness greater than that of the insulating film 2a in the lower layer.

The insulating film 2a is made of, for example, a silicon nitride film formed by the plasma chemical vapor deposition (CVD) method and the interlayer insulating film 2b thereover is made of, for example, a silicon oxide film formed by the CVD method. The insulating film 2a and the interlayer insulating film 2b are formed by a material capable of taking a large etching selection ratio at the time of etching of each film. That is, the insulating film 2a in the lower layer is an insulating film for L-SAC (Self Aligned Contact) and adapted to function as an etching stopper at the time of etching for forming a contact hole CT. By providing such an insulating film 2a, it is made possible to reduce mainly the dimensions of the elements of the main circuit region N.

In the memory cell array MR, between the floating gate electrode FG and the insulating film 2a, a cap insulating film (insulating film) 3a formed by, for example, a silicon oxide film is interposed. Due to this, a silicide layer 5a is prevented from being formed over the floating gate electrode FG. In addition, the insulating film 2a is prevented from coming into direct contact with the floating gate electrode FG.

In the top surface of the gate electrode G and in the top surface of the semiconductor regions MS2, NS2 with a high impurity concentration, the silicide layer 5a such as a cobalt silicide ($CoSi_2$) is formed. On the side surface of the floating gate electrode FG and the gate electrode G, a side wall SW formed by, for example, a silicon oxide film is formed. In the contact hole CT, a plug PLG formed by a conductive film is embedded.

By the way, there may be a case where water ($H_2O$) is floating over the substrate 1S in a state where water is separated into hydrogen ions ($H^+$) and hydroxide ions ($OH^-$). If the hydrogen ions diffuse to the floating gate electrode FG of the nonvolatile memory circuit, electrons in the floating gate electrode FG contributing to the storage of information are neutralized by the hydrogen ions and data is deleted.

As described above, the floating gate electrode FG of the nonvolatile memory circuit is covered with the silicon nitride film (insulating film 2a) that functions as an etching stopper and therefore the floating gate electrode FG seems to be protected against hydrogen ions, however, according to the discussion of the present inventors, the barrier property of the silicon nitride film is low against hydrogen ions. Further, in the silicon nitride film formed by the plasma CVD method, cracks are likely to occur at its foot covering the floating gate electrode FG, and therefore, hydrogen ions are allowed to invade the floating gate electrode FG therethrough. In addition, there may be a case where water invades the floating gate electrode FG. As a result, there arises a problem that data retention characteristics of the nonvolatile memory circuit are deteriorated. Here, symbols Gox1, Gox2 denote gate insulating films.

Figure 2:
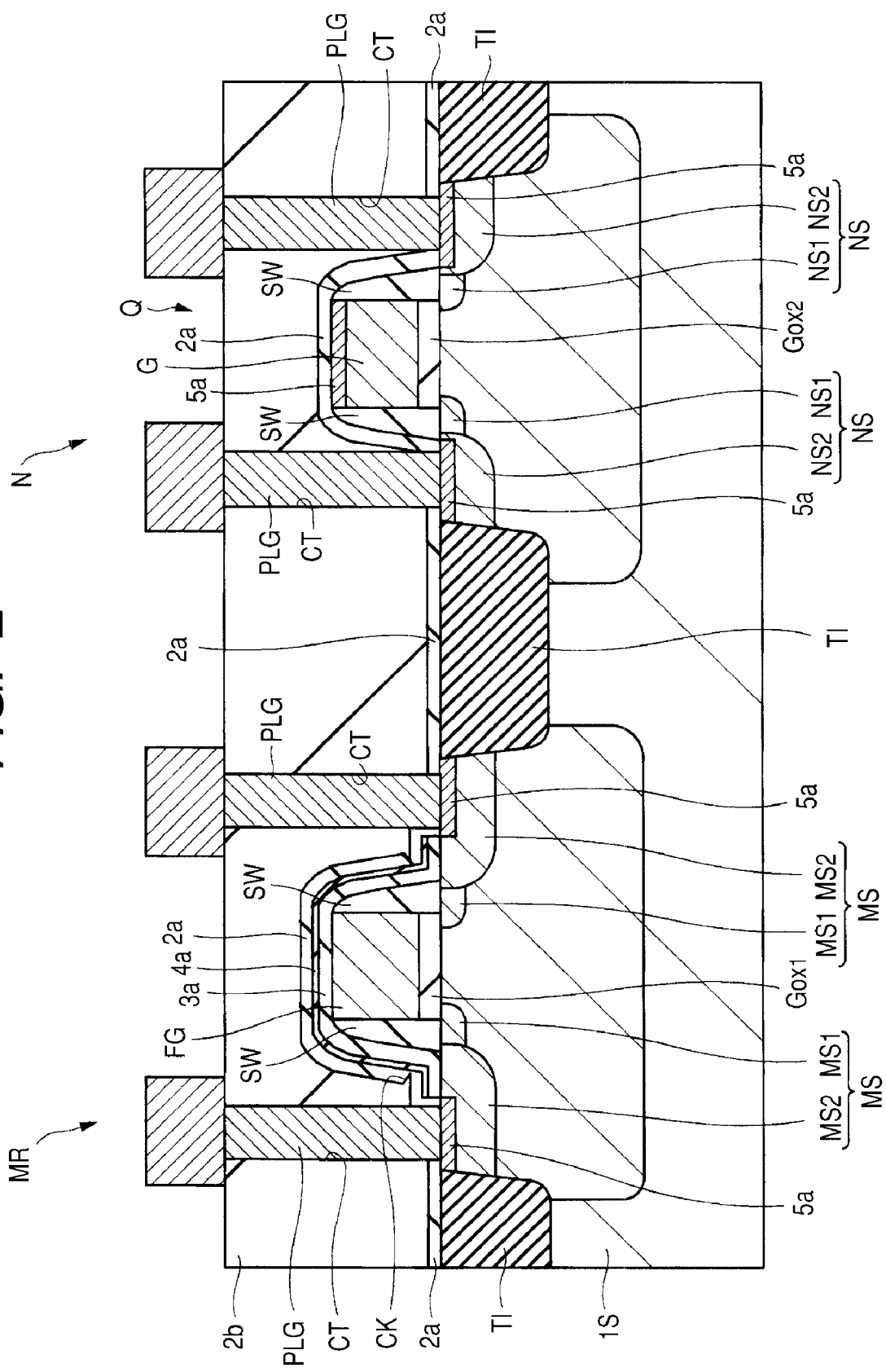
FIG. 2 is a cross sectional view of essential parts of a semiconductor device in an embodiment of the present invention.

Next, FIG. 2 shows a cross sectional view of essential parts of the semiconductor device having the flash memory in the present first embodiment. In order to solve the above problem, in the semiconductor device in the present first embodiment, in the memory cell array MR of the flash memory, a pattern of an insulating film 4a made of, for example, a silicon nitride film is formed between the insulating film 2a and the cap insulating film 3a so that it covers the top surface and the side surface of the floating gate electrode FG.

The insulating film 4a is formed by, for example, the low-pressure (depressurized) CVD method (thermal CVD method), and therefore, it is formed by a finer and more excellent quality film than that of the insulating film 2a formed by the plasma CVD method. That is, in the insulating film 4a, the density of coupled silicon (Si) and nitrogen (N) per unit volume is higher than that in the insulating film 2a and the barrier property against water and hydrogen ions is higher. The insulating film 4a is less in thickness than the insulating film 2a.

By providing such an insulating film 4a, it is possible to suppress or prevent water, hydrogen ions, etc., from diffusing to the floating gate electrode FG even if a crack CK occurs at the foot of the insulating film 2a.

Figure 3:
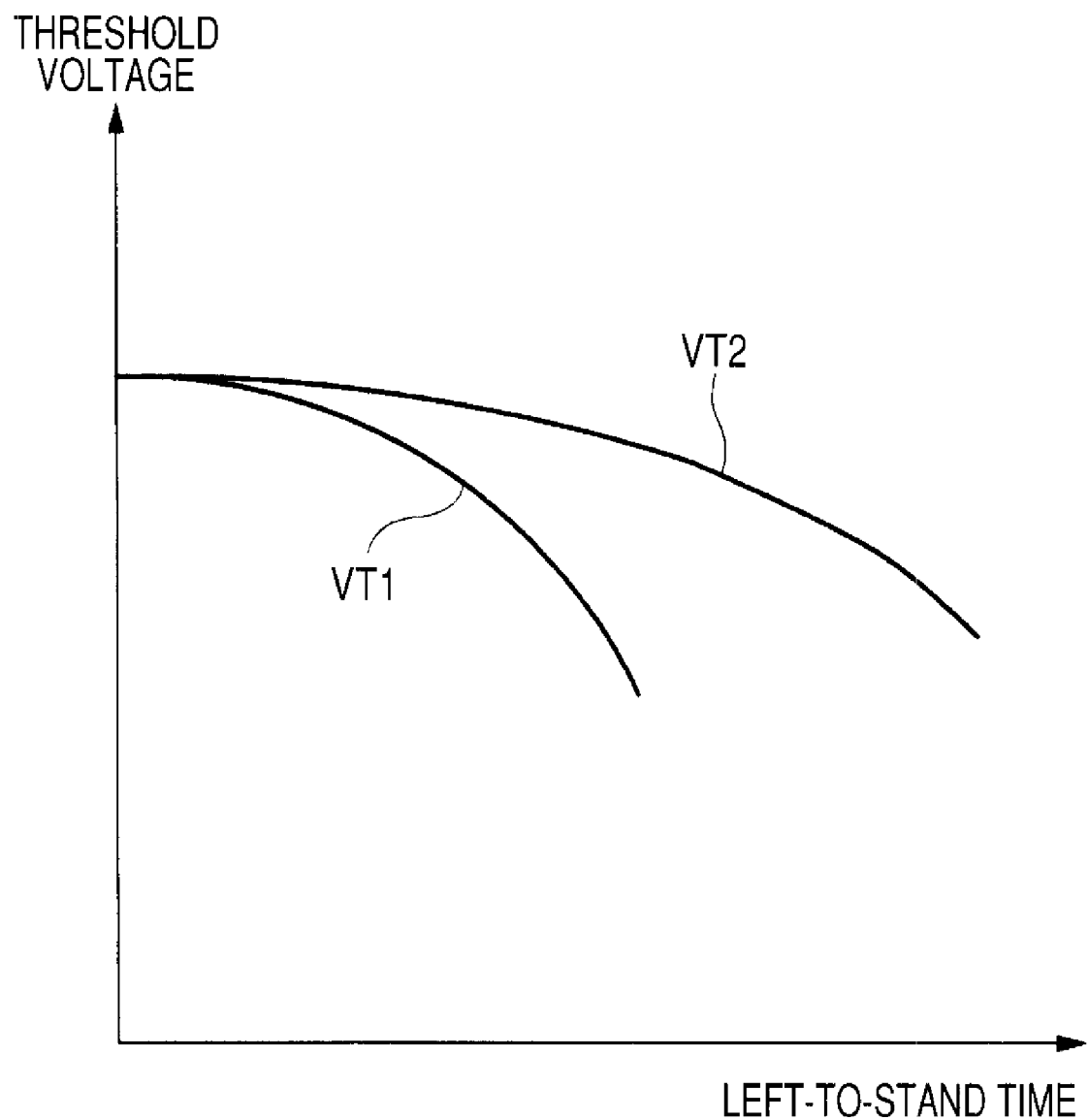
FIG. 3 is a graph showing the comparison of the data retention characteristics between the flash memories of the semiconductor devices in FIG. 1 and FIG. 2.

FIG. 3 shows a graph showing a comparison of the data retention characteristics of the flash memory between that in FIG. 1 (symbol VT1) and that in FIG. 2 (symbol VT2). According to the present first embodiment, because water or hydrogen ions can be suppressed or prevented from diffusing to the floating gate electrode FG, it is possible to improve the data retention characteristics of the flash memory.

Figure 4A:
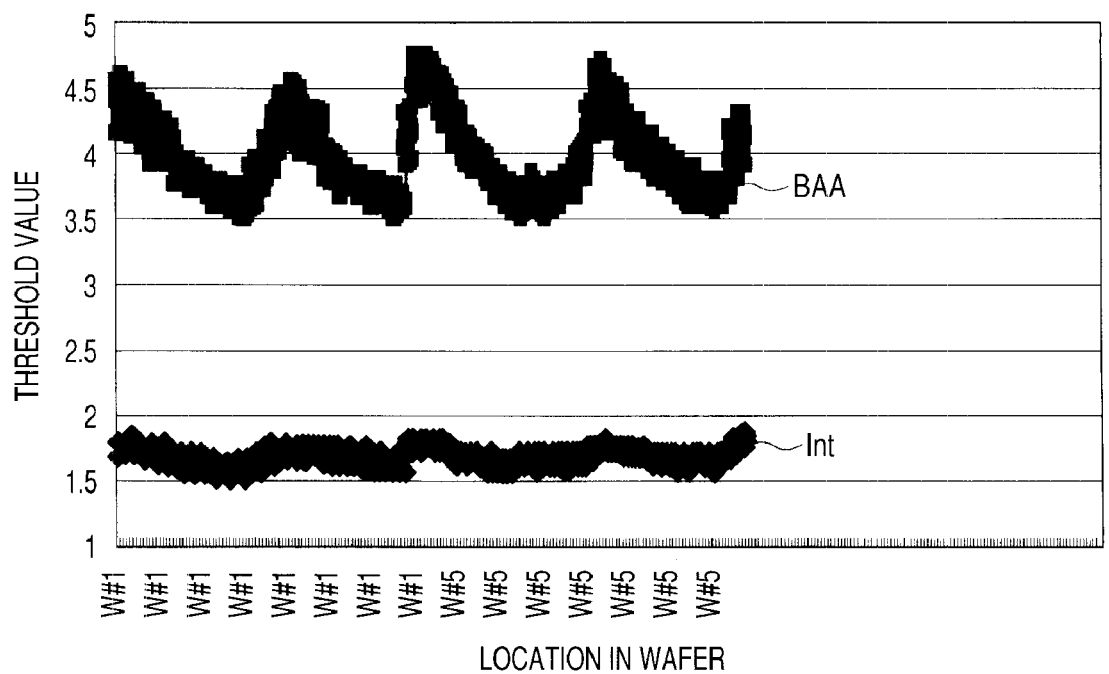
FIG. 4(*a*) is a graph showing the dependency of the threshold value of the memory cell on the location in a wafer before countermeasures.

FIG. 4(a) shows the dependency of the threshold value of the memory cell on the location in a wafer before countermeasures and 4(b) shows the dependency of the threshold value of the memory cell on the location in a wafer after countermeasures, respectively. The horizontal axis denotes the location in a wafer and the vertical axis denotes the threshold value. Symbol Int denotes the initial value, symbol BAA denotes measurement results after baking processing (for example, the threshold value after left to stand for five hours at 250° C.), and symbol BAB denotes measurement results before baking processing, respectively.

Figure 4B:
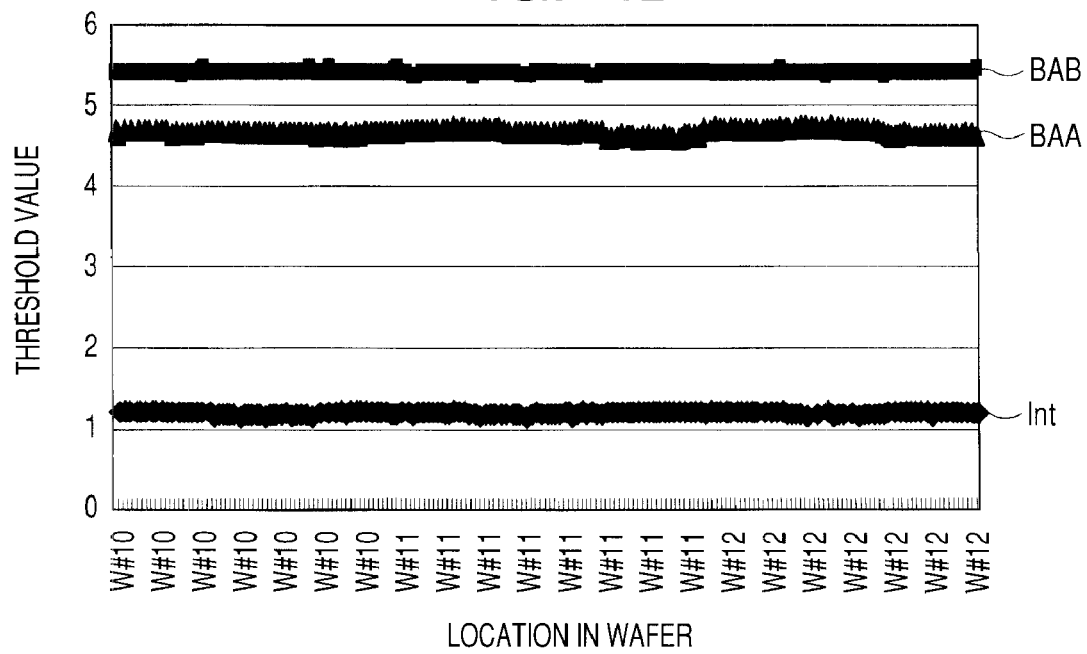

It can be seen that while the threshold value considerably fluctuates at each location in the wafer after the baking processing as shown in the case of FIG. 4(a) before countermeasures, the threshold value is stable at each location in the wafer after the baking processing as shown in the case of the present first embodiment (FIG. 4(b)). It can also be seen that there is no large fluctuation in comparison between that before the baking processing and that after the baking processing in the case of the present first embodiment.

As will be described later, the insulating film 4a may be provided in the main circuit region N. However, there may be a case where the electrical characteristic of the element of the main circuit region N changes by the provision of the insulating film 4a in the main circuit region N. Because of this, there may arise a case where it is necessary to investigate the influence on the element of the main circuit region N by the provision of the insulating film 4a or change the design of the element of the main circuit region N. In contrast to this, in the present first embodiment, the insulating film 4a is formed only in the memory cell array MR, and therefore, it is unlikely that the electrical characteristic of the element of the main circuit region N changes due to the insulating film 4a. As a result, it is not necessary to investigate the characteristic of the element of the main circuit region N or change the design of the main circuit region N even if the insulating film 4a is provided.

If the silicide layer 5a grows as far as the inside of the semiconductor region MS1 with a low impurity concentration, the possibility is raised that a junction leak current occurs between the silicide layer 5a and the substrate 1S. In particular, if the semiconductor region MS1 with a low impurity concentration is formed at the same time with the semiconductor region with a low impurity concentration (with the same impurity concentration) of the low-voltage resistant MIS•FET of the main circuit region N, the possibility that the problem occurs is further raised. Because of this, in the present first embodiment (FIG. 2), the cap insulating film 3a is formed so that it covers the top surface of the floating gate electrode FG and the surface of the sidewall SW on the side surface of the floating gate electrode FG, and further covering part of the main surface of the substrate 1S. Due to this, the silicide layer 5a over the substrate 1S is formed at a position matching the cap insulating film 3a. Because of this, the end portion of the silicide layer 5a over the substrate 1S can be separated from the side surface of the floating gate electrode FG (that is, the semiconductor region MS1 with a low impurity concentration). As a result, it is possible to suppress or prevent a junction leak from occurring between the silicide layer 5a and the substrate 1S described above.

However, as will be described later, the cap insulating film 3a can be obviated. In this case, the insulating film 4a comes into direct contact with the top surface of the floating gate electrode FG. However, in this case, there may be a case where charges for data in the floating gate electrode FG flow to the plug PLG through the insulating films 4a, 2a and therefore the data retention characteristics will degrade. Consequently, although the cap insulating film 3a can be obviated, it is possible to improve the data retention characteristics by providing the cap insulating film 3a as in the present embodiment 1.

Next, a specific example of the semiconductor device in the present first embodiment will be described.

In the semiconductor chip constituting the semiconductor device in the present first embodiment, a region of the main circuit (second circuit region) and a region of a flash memory that stores a comparatively small amount of desired information about the main circuit (nonvolatile memory circuit, first circuit region) are formed.

The main circuit described above includes memory circuits, for example, DRAM (Dynamic Random Access Memory) and SRAM (Static RAM). Further, the main circuit includes logic circuits, for example, CPU (Central Processing Unit) and MPU (Micro Processing Unit). Furthermore, the main circuit includes a mixed circuit of the memory circuit and the logic circuit described above, an LCD (Liquid Crystal Device) driver circuit, etc.

The above-mentioned desired information includes, for example, the arrangement address information of an effective (used) element used for trimming in the semiconductor chip, the arrangement address information of an effective memory cell (memory cell without defect) and an effective LCD element used for recovering a memory and LCD, the trimming tap information of an adjustment voltage used when adjusting an LCD image, the production number of a semiconductor device, etc.

As an external power supply supplied from the outside of the semiconductor device (semiconductor chip, semiconductor substrate), a single power supply is used. The power supply voltage of the single power supply is, for example, about 3.3 V.

Figure 5:
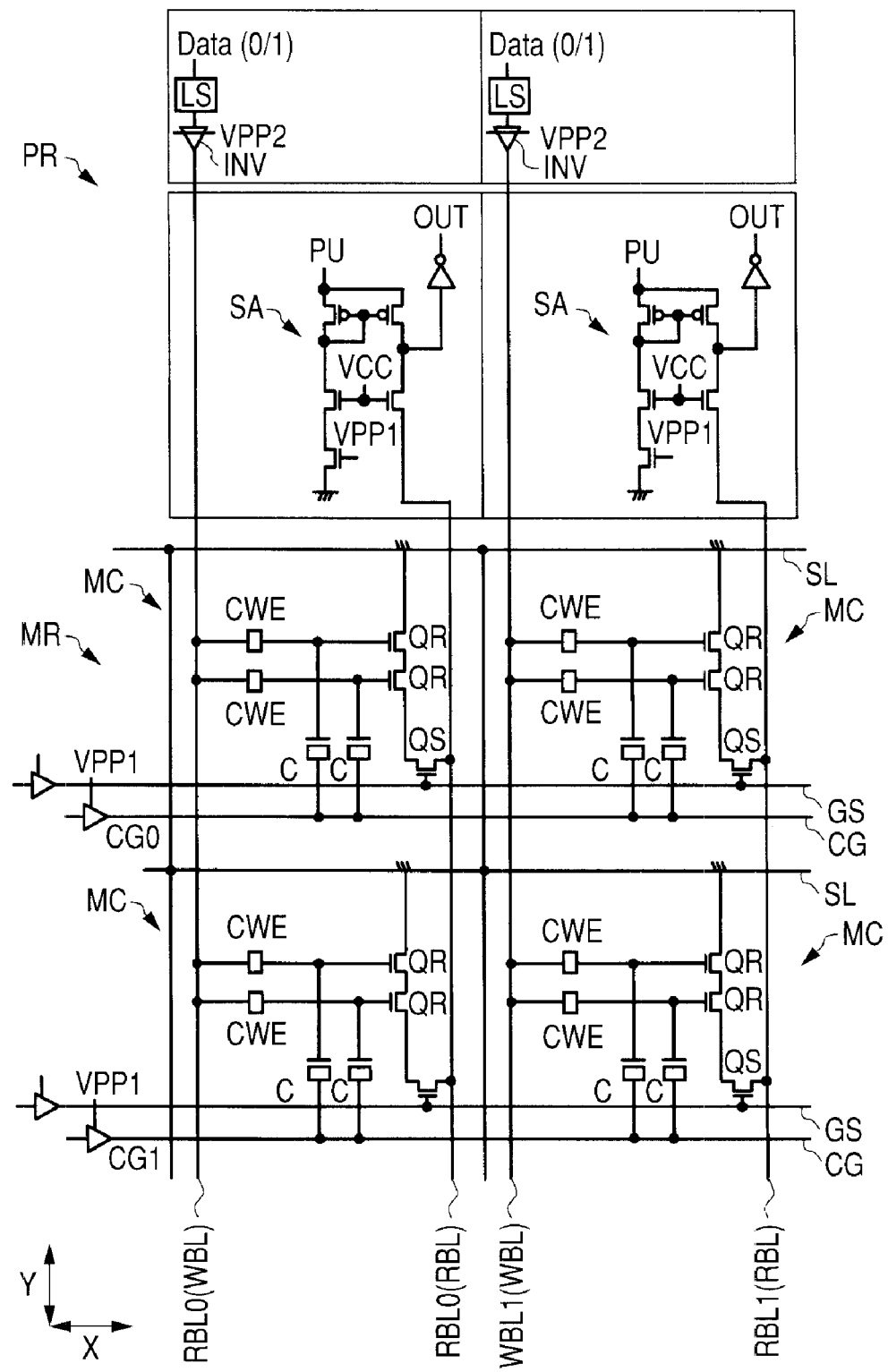
FIG. 5 is a circuit diagram of essential parts of the flash memory in the semiconductor device in an embodiment of the present invention.

FIG. 5 shows a circuit diagram of essential parts of the flash memory in the semiconductor device in the present first embodiment. This flash memory has the memory cell array MR and a peripheral circuit region PR. In the memory cell array MR, a plurality of bit lines WBL (WBL0, WBL1, . . . ) for data write/erase and bit lines RBL (RBL0, RBL1, . . . ) for data read extending in a first direction Y are arranged along a second direction X. In the memory cell array MR, a plurality of control gate wires (word lines) CG (CG0, CG1, . . . ), a plurality of source lines SL, and a plurality of selection lines GS extending along the second direction X perpendicular to the bit lines WBL, RBL are also arranged along the first direction Y.

Each bit line WBL for data write/erase is electrically coupled to an inverter circuit INV for inputting data (0/1) arranged in the peripheral circuit region PR. Each bit line RBL for data read is electrically coupled to a sense amplifier circuit SA arranged in the peripheral circuit region PR. The sense amplifier circuit SA is formed as, for example, a current mirror type. Then, in the vicinity of an intersection in a lattice pattern of the bit lines WBL, RBL, the control gate wire CG, the source line SL, and the selection line GS, a memory cell MC corresponding to one bit is electrically coupled. Here, a case where one bit is composed of the two memory cells MC is illustrated.

Each memory cell MC has a capacity portion (charge injection/discharge portion) CWE for data write/erase, a MIS•FETQR for data read, a capacity portion C, and a selection MIS•FETQS. Each of the capacity portions CWE, CWE for data write/erase of the two memory cells MC of each bit is electrically coupled so that they are in parallel. One of the electrodes of the respective capacity portions CWE for data write/erase is electrically coupled to the bit line WBL for data write/erase. The other electrode (the floating gate electrode FG) of the respective capacity portions CWE for data write/erase is electrically coupled to the individual gate electrodes (the floating gate electrodes FG) of the MIS•FETQR, QR for data read, respectively, and at the same time, is electrically coupled to one of the electrodes (the floating gate electrode FG) of the capacity portions C, C. Then, the other electrode (the control gate electrode CGW) of the capacity portions C, C is electrically coupled to the control gate wire CG. On the other hand, the MIS•FETQR, QR for data read of the two memory cells MC of each bit are electrically coupled in series to each other and the drain is electrically coupled to the bit line RBL for data read via the selection MIS•FETQS and the source is electrically coupled to the source line SL. The gate electrode of the selection MIS•FETQS is electrically coupled to the selection line GS.

Figure 6:
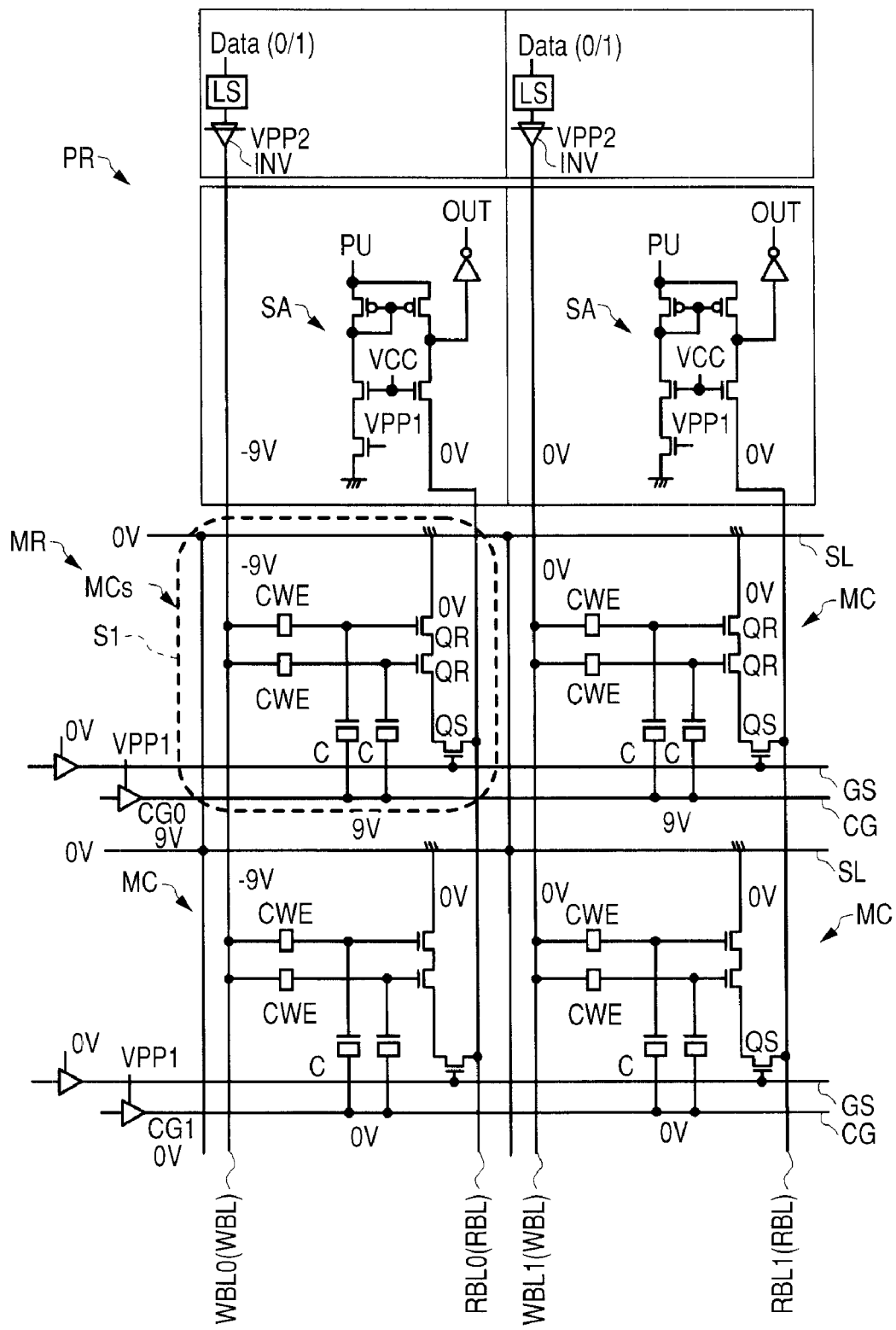
FIG. 6 is a circuit diagram showing a voltage to be applied to each portion at the time of data write operation of the nonvolatile memory in FIG. 5.

Next, an example of data write operation in such a flash memory is described with reference to FIG. 6 to FIG. 9. FIG. 6 shows a voltage to be applied to each portion at the time of data write operation of the flash memory in FIG. 5. The dashed line S1 indicates the memory cell MC to which data is written (hereinafter, referred to as selected memory cell MCs). Here, to inject electrons into the floating gate electrode is defined as to write data, however, conversely, it is also possible to define that to take out electrons from the floating gate electrode as to write data.

At the time of data write, a positive control voltage of about, for example, 9 V is applied to the control gate wire CG0 (CG) to which the other electrode of the capacity portion C of the selected memory cell MCs is coupled. To the other control gate wire CG1 (CG), a voltage of, for example, 0 V is applied. On the other hand, a negative voltage of about, for example, −9 V is applied to the bit line WBL0 (WBL) for data write/erase to which one of the electrodes of the capacity portion CWE for data write/erase of the selected memory cell MCs is electrically coupled. To the other bit line WBL1 (WBL) for data write/erase, a voltage of, for example, 0 V is applied. To the selection line GS, the source line SL, and the bit line RBL for data write, a voltage of, for example, 0 V is applied. Due to this, electrons are injected by means of the FN tunnel current over the entire channel surface into the floating gate electrode of the capacity portions CWE, CWE for data write/erase of the selected memory cell MCs and thus data is written.

Figure 7:
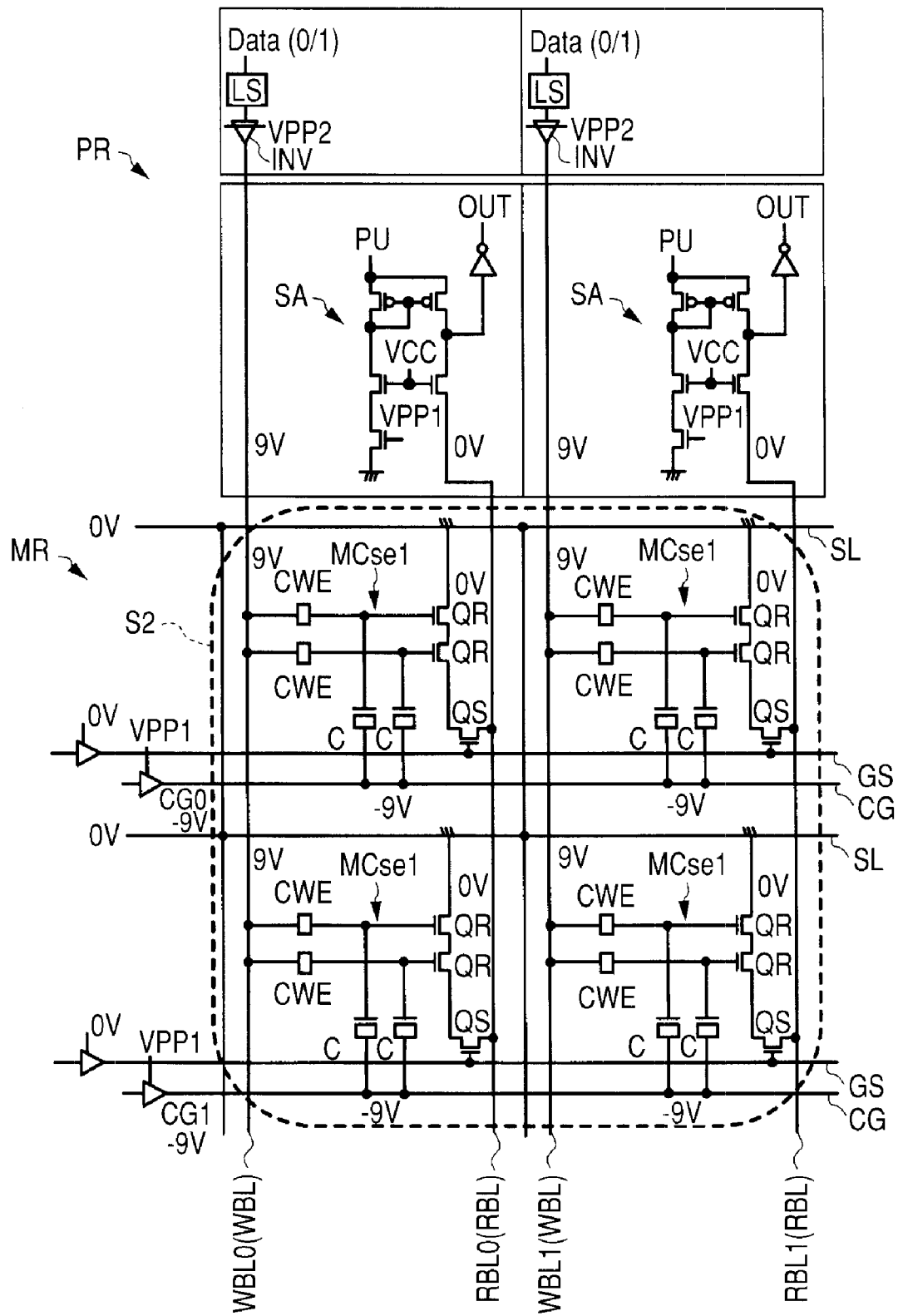
FIG. 7 is a circuit diagram showing a voltage to be applied to each portion at the time of simultaneous data erase operation of the nonvolatile memory in FIG. 5.

Next, FIG. 7 shows a voltage to be applied to each portion at the time of simultaneous data erase operation of the flash memory in FIG. 5. The dashed line S2 indicates the plurality of memory cells MC from which data is erased simultaneously (hereinafter, referred to as selected memory cell MCse1). Here, to take out electrons from the floating gate electrode is defined as to erase data, however, conversely, it is also possible to define that to inject electrons into the floating gate electrode as to erase data.

At the time of simultaneous data erase, a negative control voltage of about, for example, −9 V is applied to the control gate wires CG0, CG1 (CG) to which the other electrode of the capacity portion C of the plurality of the selected memory cells MCse1 is coupled. On the other hand, a positive voltage of about, for example, 9 V is applied to the bit lines WBL0, WBL1 (WBL) for data write/erase to which one of the electrodes of the capacity portion CWE for data write/erase of the selected memory cell MCse1 is electrically coupled. To the selection line GS, the source line SL, and the bit line RBL for data write, a voltage of, for example, 0 V is applied. Due to this, electrons accumulated in the floating gate electrode of the capacitor portions CWE, CWE for data write/erase of the plurality of the selected memory cells MCse1 from which data is erased simultaneously are discharged by means of the FN tunnel current over the entire channel surface and thus the data of the plurality of the selected memory cells MCse1 is erased simultaneously.

Figure 8:
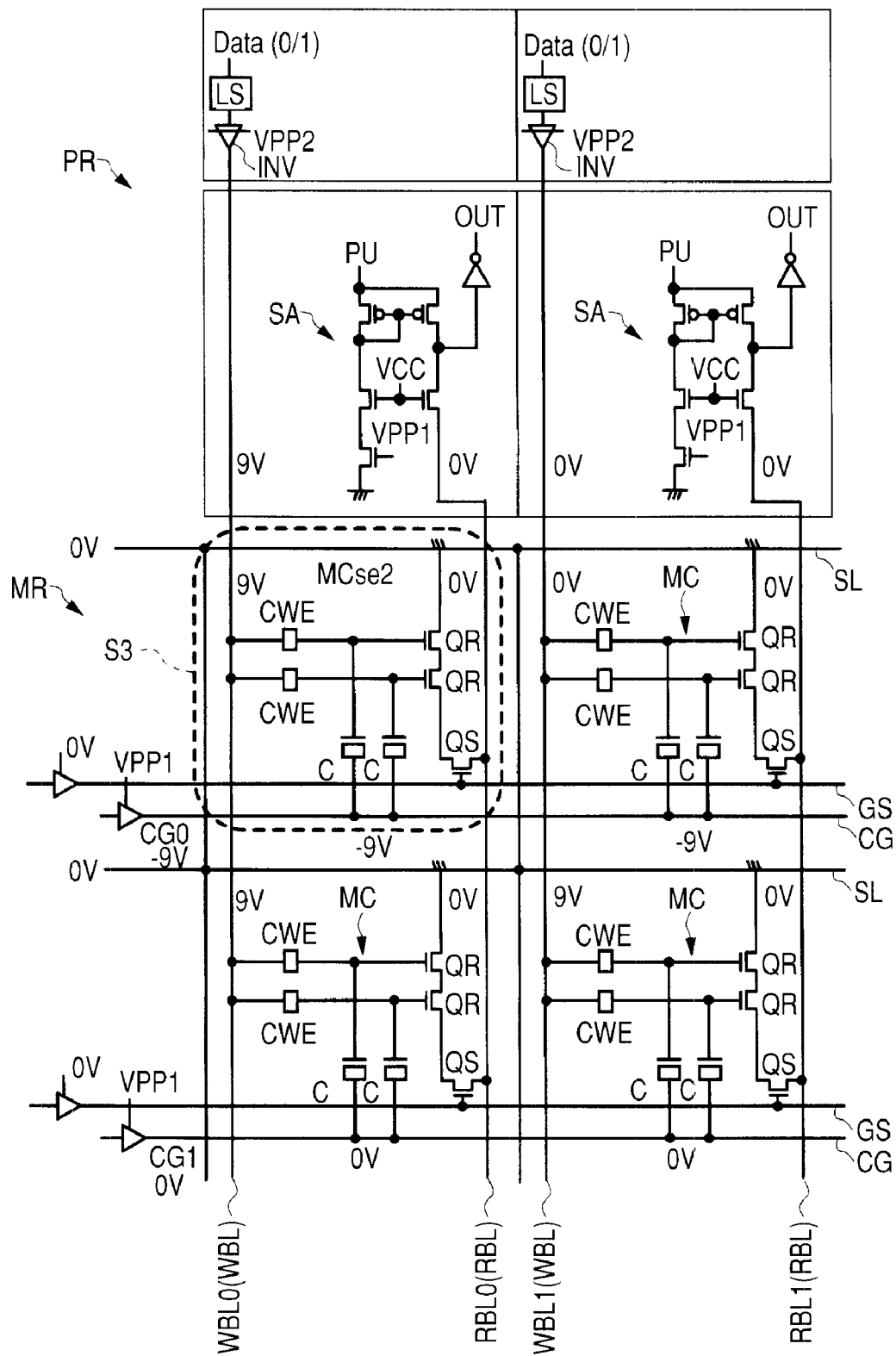
FIG. 8 is a circuit diagram showing a voltage to be applied to each portion at the time of in-units-of-bits data erase operation of the nonvolatile memory in FIG. 5.

Next, FIG. 8 shows a voltage to be applied to each portion at the time of in-units-of-bits data erase operation of the flash memory in FIG. 5. The dashed line S3 indicates the memory cell MC from which data is erased in units of bits (hereinafter, referred to as selected memory cell MCse2).

At the time of in-units-of-bits data erase, a negative control voltage of about, for example, −9 V is applied to the control gate wire CG0 (CG) to which the other electrode of the capacity portion C of the selected memory cell MCse2 is coupled. To the other control gate wire CG1 (CG), a voltage of, for example, 0 V is applied. On the other hand, a positive voltage of about, for example, 9 V is applied to the bit lines WBL0 (WBL) for data write/erase to which one of the electrodes of the capacity portion CWE for data write/erase of the selected memory cell MCse2 is electrically coupled. To the other bit line WBL1 (WBL) for data write/erase, a voltage of, for example, 0 V is applied. To the selection line GS, the source line SL, and the bit line RBL for data write, a voltage of, for example, 0 V is applied. Due to this, electrons accumulated in the floating gate electrode of the capacitor portions CWE, CWE for data write/erase of the selected memory cell MCse2 from which data is erased are discharged by means of the FN tunnel current over the entire channel surface and thus the data of the selected memory cell MCse2, the target of data erasure, is erased.

Figure 9:
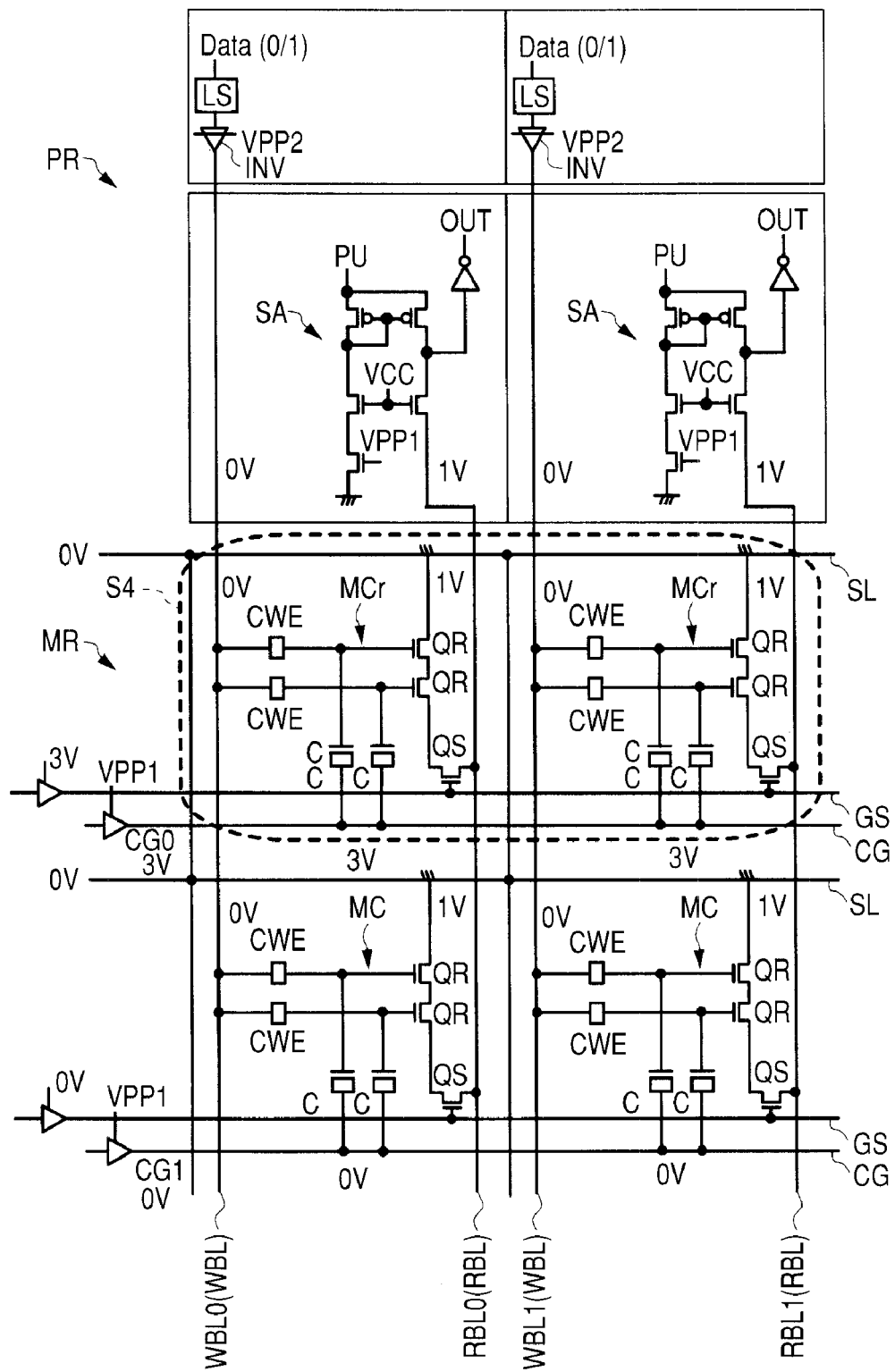
FIG. 9 is a circuit diagram showing a voltage to be applied to each portion at the time of data read operation of the nonvolatile memory in FIG. 5.

Next, FIG. 9 shows a voltage to be applied to each portion at the time of data read operation of the flash memory in FIG. 5. The dashed line S4 indicates the memory cell MC from which data is read (hereinafter, referred to as selected memory cell MCr).

At the time of data read, a control voltage of about, for example, 3 V is applied to the control gate wire CG0 (CG) to which the other electrode of the capacity portion C of the selected memory cell MCr is coupled. To the other control gate wire CG1 (CG), a voltage of, for example, 0 V is applied. On the other hand, a voltage of about, for example, 0 V is applied to the bit lines WBL0, WBL0 (WBL) for data write/erase to which one of the electrodes of the capacity portion CWE for data write/erase of the selected memory cell MCr is electrically coupled. To the selection line GS to which the gate electrode of the selection MIS•FETQS of the selected memory cell MCr is electrically coupled, a voltage of, for example, about 3 V is applied. Then, to the bit line RBL for data write, a voltage of, for example, about 1 V is applied. Further, to the source line SL, for example, 0 V is applied. Due to this, on the assumption that the MIS•FETQR for data read of the selected memory cell MCr from which data is read is on, it is read whether the data stored in the selected memory cell MCr is 0 or 1 depending on whether or not the drain current flows through the channel of the MIS•FETQR for data read.

Figure 10:
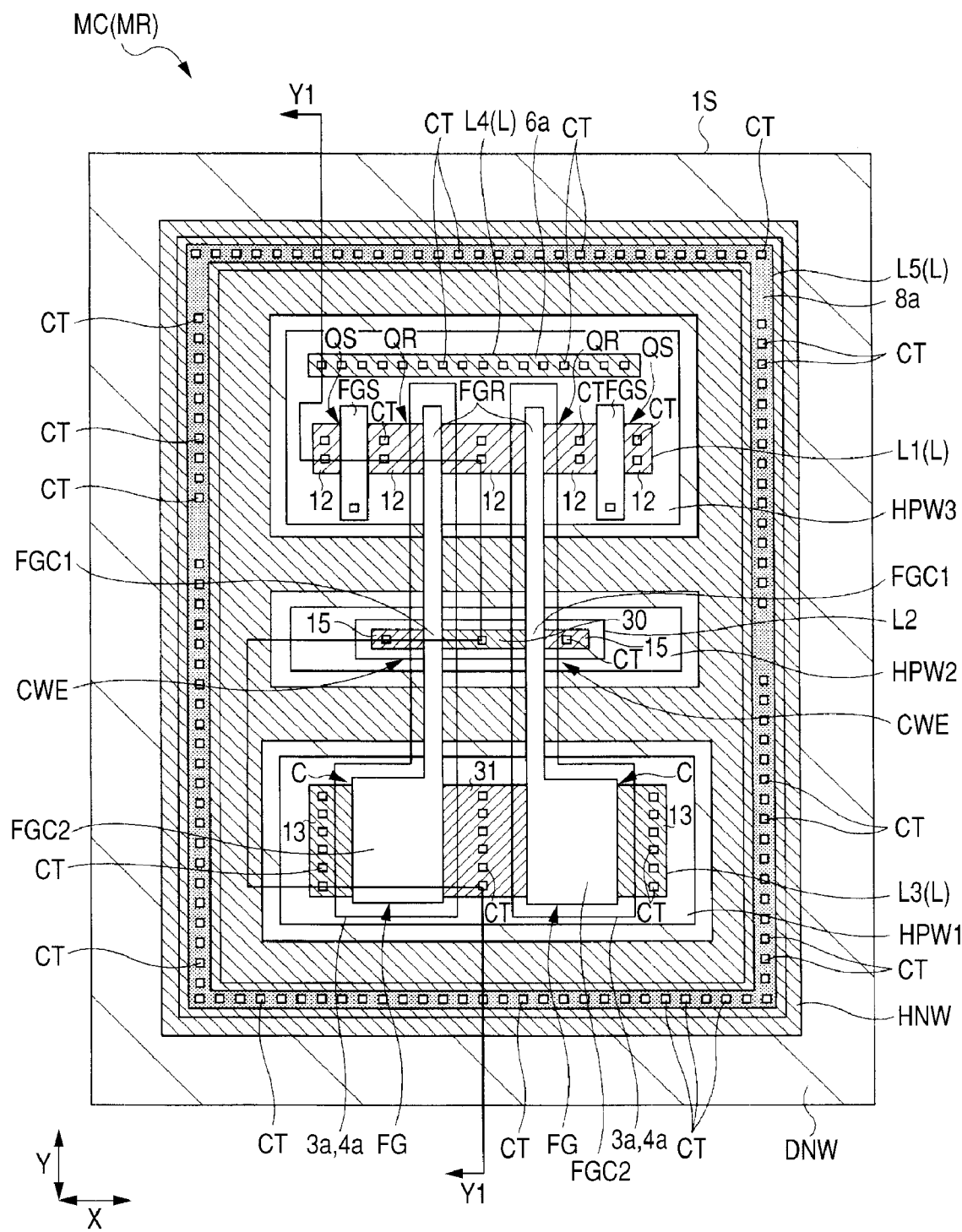
FIG. 10 is a plan view of a memory cell corresponding to one bit of the nonvolatile memory in the semiconductor device in an embodiment of the present invention.
Figure 11:
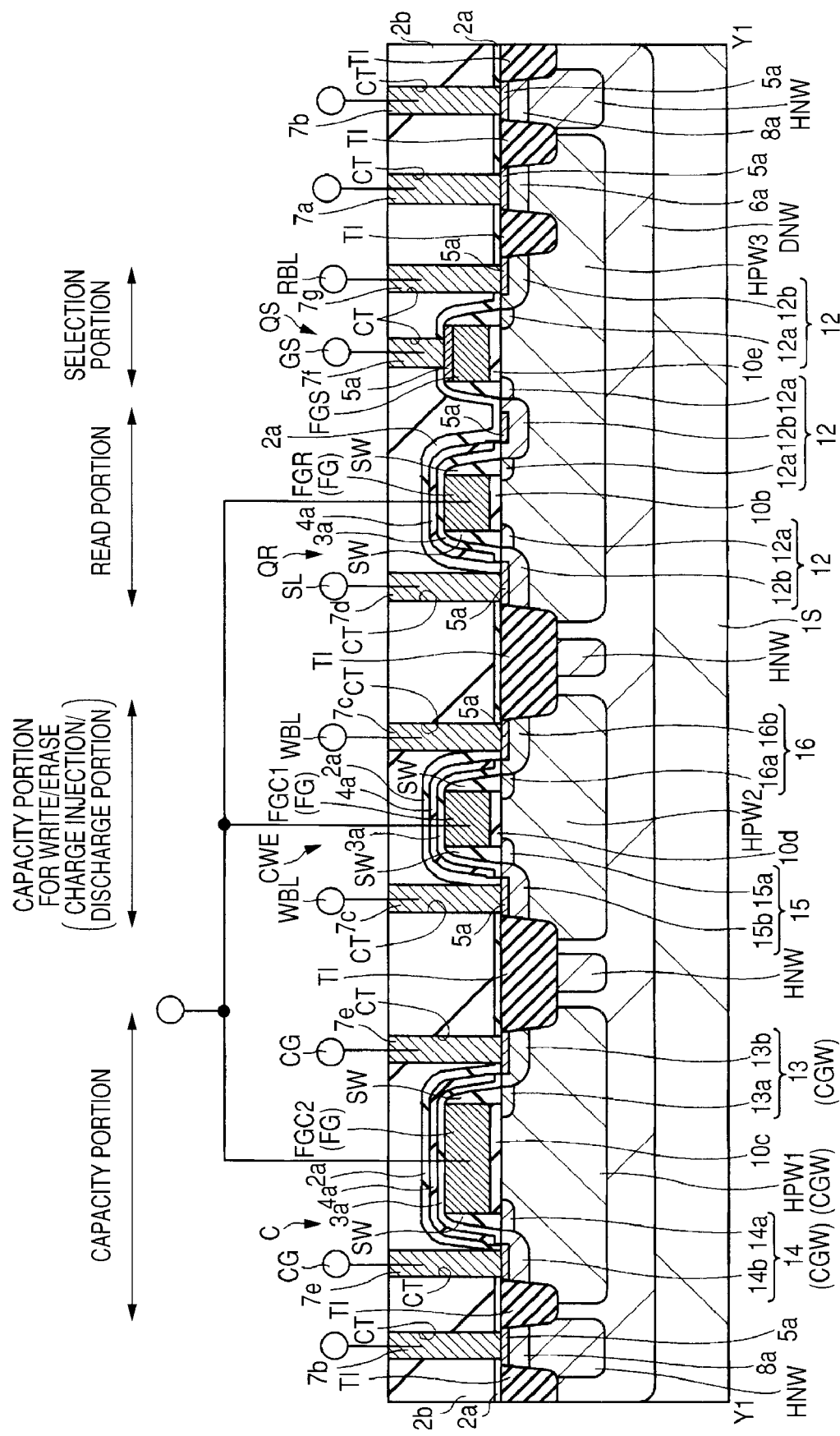
FIG. 11 is a cross sectional view along the Y1-Y1 line of FIG. 10.
Figure 12:
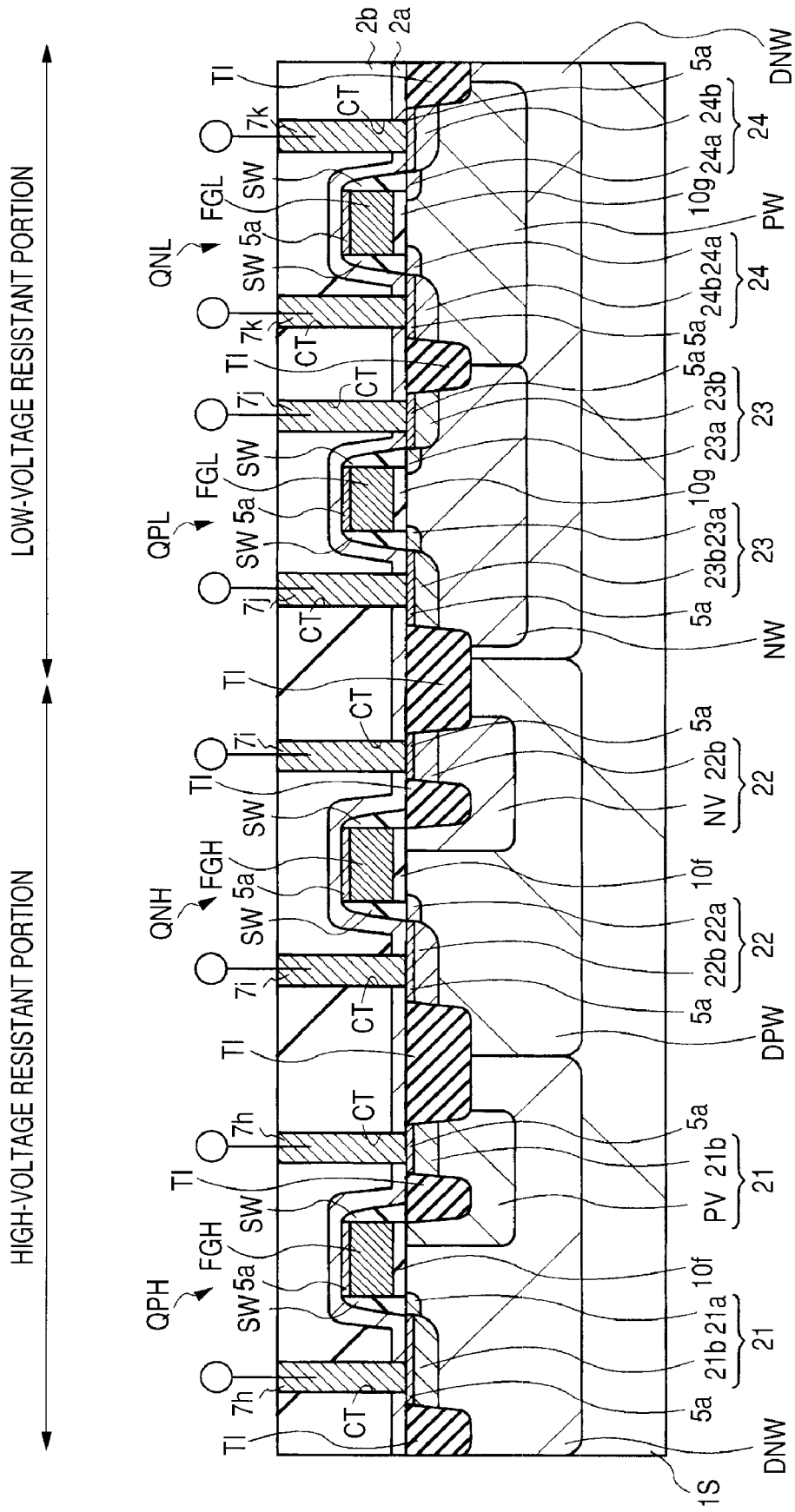
FIG. 12 is a cross sectional view of essential parts of a main circuit formation region in the semiconductor device in an embodiment of the present invention.

Next, FIG. 10 is a plan view of the memory cell MC corresponding to one bit of the flash memory in the semiconductor device in the present first embodiment, FIG. 11 is a cross sectional view along the Y1-Y1 line of FIG. 10, and FIG. 12 is a cross sectional view of essential parts of the main circuit region of the semiconductor device in the present first embodiment. In FIG. 10 part of the drawing is hatched for easier-to-see.

The semiconductor device in the present first embodiment is, for example, an LCD driver circuit (main circuit). In the semiconductor chip in which the LCD driver circuit is formed, a flash memory is formed, which stores a comparatively small amount of desired information about its LCD driver circuit etc.

A configuration example of the flash memory will be described first with reference to FIG. 10 and FIG. 11.

On the main surface (first main surface) of the p-type substrate 1S, the groove-shaped isolation portion TI that defines active regions L (L1, L2, L3, L4, L5) is formed. In an n-type (first conductivity type) embedded well (first well) DNW formed in the substrate 1S, p-type (second conductivity type) wells HPW1, HPW2, and HPW3, and an n-type well HNW are formed. The p-type wells HPW1, HPW2, and HPW3 are included in the embedded well DNW in a state where they are electrically isolated from one another by the embedded well DNW and the n-type well HNW.

In the p-type wells HPW1 to HPW3, impurities, such as boron (B) indicative of the p-type, are contained. On part of the upper layer of the p-type well HPW3, a $p^+$-type semiconductor region 6a is formed. Although the same impurities as those in the p-type well HPW3 are contained in the $p^+$-type semiconductor region 6a, the impurity concentration of the $p^+$-type semiconductor region 6a is set so that it is higher than the impurity concentration of the p-type well HPW3. The $p^+$-type semiconductor region 6a is electrically coupled to a conductor portion 7a in the contact hole CT formed in the insulating film 2a and the interlayer insulating film (insulating film) 2b over the main surface of the substrate 1S. In part of the surface layer of the $p^+$-type semiconductor region 6a with which the conductor portion 7a comes into contact, the silicide layer 5a, such as cobalt silicide, is formed.

In the n-type well HNW, impurities, such as phosphorus (P) or arsenic (As) indicative of the n-type, are contained. In part of the upper layer of the n-type well HNW, an $n^+$-type semiconductor region 8a is formed. Although the same impurities as those in the n-type well HNW are contained in the $n^+$-type semiconductor region 8a, the impurity concentration of the $n^+$-type semiconductor region 8a is set so that it is higher than the impurity concentration of the n-type well HNW. The $n^+$-type semiconductor region 8a is situated apart from the p-type wells HPW1 to HPW3 so that it does not come into contact with the p-type wells HPW1 to HPW3. That is, part of the n-type embedded well DNW is interposed between the $n^+$-type semiconductor region 8a and the p-type wells HPW1 to HPW3. The $n^+$-type semiconductor region 8a is electrically coupled to a conductor portion 7b in the contact hole CT formed in the insulating film 2a and the interlayer insulating film 2b. In part of the surface layer of the $n^+$-type semiconductor region 8a with which the conductor portion 7b comes into contact, the silicide layer 5a is formed.

The memory cell MC formed in the memory cell array MR of the flash memory in the present first embodiment has the floating gate electrode FG, the capacity portion CWE for data write/erase (charge injection/discharge portion CWE), the MIS•FETQR for data read, and the capacity portion C.

The floating gate electrode FG is a portion at which charges contributing to the storage of information are accumulated. The floating gate electrode FG is made of a conductive film, such as low-resistance polycrystal silicon, and formed in an electrically floating state (in a state of being insulated from other conductors). On the side surface of the floating gate electrode FG, the sidewall SW is formed.

As shown in FIG. 10, the floating gate electrode FG is formed in a state where it extends along the first direction Y so that it overlaps in a planar manner the p-type wells HPW1, HPW2, HPW3 adjacent to one another.

At a first position at which the floating gate electrode FG overlaps in a planar manner the active region L2 of the p-type well (second well) HPW2, the capacity portion CWE for data write/erase is arranged. The capacity portion CWE for data write/erase has a capacity electrode (first electrode) FGC1, a capacity insulating film (first insulating film) 10d, a p-type semiconductor region 15, an n-type semiconductor region 16, and the p-type well HPW2.

The capacity electrode FGC1 is formed by part of the floating gate electrode FG and is a portion at which the other electrode of the capacity portion CWE is formed. The capacity insulating film 10d is made of, for example, silicon oxide and formed between the capacity electrode FGC1 and the substrate 1S (p-type well HPW2). The thickness of the capacity insulating film 10d is set to, for example, 10 nm or more and 20 nm or less. However, in the case of the capacity portion CWE in the present first embodiment, electrons are injected into the capacity electrode FGC1 from the p-type well HPW2 via the capacity insulating film 10d or the electrons of the capacity electrode FGC1 are discharged to the p-type well HPW2 via the capacity insulating film 10d at the time of data rewrite, and therefore, the thickness of the capacity insulating film 10d is small and specifically, it is set to, for example, about 13.5 nm. The reason of setting the thickness of the capacity insulating film 10d to 10 nm or more is that if the capacity insulating film 10d is thinner than 10 nm, the reliability thereof cannot be ensured. The reason of setting the thickness of the capacity insulating film 10d to 20 nm or less is that if it is thicker than 20 nm, it is difficult to pass electrons and the data rewrite cannot be done successfully.

The p-type semiconductor region 15 and the n-type semiconductor region 16 of the capacity portion CWE are formed in a self-aligned manner with respect to the capacity electrode FGC1 at a position where the capacity electrode FGC1 is sandwiched in the p-type well HPW2. The semiconductor region 15 has a $p^-$-type semiconductor region 15a on the channel side and a $p^+$-type semiconductor region 15b coupled thereto. In the $p^-$-type semiconductor region 15a and the $p^+$-type semiconductor region 15b, impurities of the same conductivity type, such as boron (B), are contained, however, the impurity concentration of the $p^+$-type semiconductor region 15b is set so that it is higher than the impurity concentration of the $p^-$-type semiconductor region 15a. The semiconductor region 16 has an $n^-$-type semiconductor region 16a on the channel side and an $n^+$-type semiconductor region 16b coupled thereto. In the $n^-$-type semiconductor region 16a and the $n^+$-type semiconductor region 16b, impurities of the same conductivity type, such as arsenic (As) and phosphorus (P), are contained, however, the impurity concentration of the $n^+$-type semiconductor region 16b is set so that it is higher than the impurity concentration of the $n^-$-type semiconductor region 16a. The p-type semiconductor region 15, the n-type semiconductor region 16, and the p-type well HPW2 are portions that form one of the electrodes of the capacity portion CWE. The p-type semiconductor region 15 and the n-type semiconductor region 16 are electrically coupled to a conductor portion 7c in the contact hole CT formed in the interlayer insulating film 2b. The conductor portion 7c is electrically coupled to the bit line WBL for data write/erase. In part of the surface layer of the $p^+$-type semiconductor region 15b and the $n^+$-type semiconductor region 16b with which the conductor portion 7c comes into contact, the silicide layer 5a is formed.

As described above, in the present first embodiment, the conductivity types of the semiconductor regions 15, 16 on the right and left sides of the capacity electrode FGC1 of the capacity portion CWE are made to differ, that is, they are in a horizontal asymmetry. Here, the reason of providing the n-type semiconductor region 16 is described. The addition of the n-type semiconductor region 16 will promote the formation of an inversion layer under the capacity electrode FGC1 at the time of data write operation. Electrons are minority carriers in number in the p-type semiconductor but are majority carriers in number in the n-type semiconductor. Because of this, by providing the $n^+$-type semiconductor region 16, it is possible to easily supply injected electrons to the inversion layer immediately under the capacity electrode FGC1. As a result, the effective coupling capacity can be increased, and therefore, it is possible to efficiently control the potential of the capacity electrode FGC1. Consequently, it is possible to increase the speed of data write. In addition, it is also possible to reduce the variations in speed of data write.

Next, at a second position at which the floating gate electrode FG overlaps in a planar manner the active region L1 of the p-type well (third well) HPW3, the MIS•FETQR for data read is arranged. The MIS•FETQR for data read has a gate electrode (second electrode) FGR, a gate insulating film (second insulating film) 10b, and a pair of n-type semiconductor regions 12, 12. The channel of the MIS•FETQR for data read is formed in the upper layer of the p-type well HPW3 at which the gate electrode FGR and the active region L1 overlap in a planar manner.

The gate electrode FGR is formed by part of the floating gate electrode FG. The gate insulating film 10b is made of, for example, silicon oxide, and formed between the gate electrode FGR and the substrate 1S (p-type well HPW3). The thickness of the gate insulating film 10b is, for example, about 13.5 nm. The pair of the n-type semiconductor regions 12, 12 of the MIS•FETQR for data read is formed in a self-aligned manner with respect to the gate electrode FGR at a position where the gate electrode FGR is sandwiched in the p-type well HPW3. The pair of the n-type semiconductor regions 12, 12 has an $n^-$-type semiconductor region 12a on the channel sides and an $n^+$-type semiconductor region 12b coupled thereto, respectively. In the $n^-$-type semiconductor region 12a and the $n^+$-type semiconductor region 12b, impurities of the same conductivity type, such as phosphorus (P) or arsenic (As), are contained, however, the impurity concentration of the $n^+$-type semiconductor region 12b is set so that it is higher than the impurity concentration of the $n^-$-type semiconductor region 12a. One of the semiconductor regions 12, 12 of the MIS•FETQR for data read is electrically coupled to a conductor portion 7d in the contact hole CT formed in the insulating film 2a and the interlayer insulating film 2b. The conductor portion 7d is electrically coupled to the source line SL. In part of the surface layer of the $n^+$-type semiconductor region 12b with which the conductor portion 7d comes into contact, the silicide layer 5a is formed. On the other hand, the other of the semiconductor regions 12, 12 of the MIS•FETQR for data read is shared by one of the n-type semiconductor regions 12 for the source and drain of the selection MIS•FETQS.

The selection MIS•FETQS has a gate electrode FGS, a gate insulating film 10e, and the pair of the n-type semiconductor regions 12, 12 for source and drain. The channel of the selection MIS•FETQS is formed in the upper layer of the p-type well HPW3 at which the gate electrode FGS and the active region L1 overlap in a planar manner.

The gate electrode FGS is formed by, for example, low-resistance polycrystal silicon, and in the top surface thereof, the silicide layer 5a is formed. The gate electrode FGS is electrically coupled to a conductor portion 7f in the contact hole CT formed in the insulating film 2a and the interlayer insulating film 2b. The conductor portion 7f is electrically coupled to the selection line GS. The gate insulating film 10e is made of, for example, silicon oxide, and formed between the gate electrode FGS and the substrate 1S (p-type well HPW3). The thickness of the gate insulating film 10e is, for example, about 13.5 nm. The configuration of the pair of the n-type semiconductor regions 12, 12 of the selection MIS•FETQS is the same as that of the n-type semiconductor region 12 of the MIS•FETQR for data read. The other n-type semiconductor region 12 of the selection MIS•FETQS is electrically coupled to a conductor portion 7g in the contact hole CT formed in the insulating film 2a and the interlayer insulating film 2b. The conductor portion 7g is electrically coupled to the bit line RBL for data read. In part of the surface layer of the n⁺-type semiconductor region 12b with which the conductor portion 7g comes into contact, the silicide layer 5a is formed.

Next, at a position where the floating gate electrode FG overlaps in a planar manner the p-type well (fourth well) HPW1, the capacity portion C is formed. The capacity portion C has a control gate electrode CGW, a capacity electrode (third electrode) FGC2, a capacity insulating film (third insulating film) 10c, a p-type semiconductor region 13, an n-type semiconductor region 14, and the p-type well HPW1.

The capacity electrode FGC2 is formed by the floating gate electrode FG portion in opposition to the control gate electrode CGW, and is a portion that forms one of electrodes of the capacity portion C. In this manner, by constructing the gate configuration of the memory cell MC as a single layer configuration, it is possible to easily match the memory cell MC of the flash memory and the element in the main circuit at the time of manufacture, and therefore, it is possible to make an attempt to reduce the manufacturing time and cost of the semiconductor device.

In addition, the capacity electrode FGC2 is formed so that its length in the second direction X is longer than the length in the second direction X of the capacity electrode FGC1 of the capacity portion CWE for data write/erase and that of the gate electrode FGR of the MIS•FETQR for data read. Due to this, a large area can be ensured for the capacity electrode FGC2, and therefore, the coupling ratio can be increased and the voltage supply efficiency from the control gate wire CGW can be improved.

The capacity insulating film 10c is made of, for example, silicon oxide, and formed between the capacity electrode FGC2 and the substrate IS (p-type well HPW1). The capacity insulating film 10c is formed simultaneously by the thermal oxidation process for forming the gate insulating films 10b, 10e and the capacity insulating film 10d and its thickness is, for example, about 13.5 nm.

The p-type semiconductor region 13 and the n-type semiconductor region 14 of the capacity portion C are formed in a self-aligned manner with respect to the capacity electrode FGC2 at a position where the capacity electrode FGC2 is sandwiched in the p-type well HPW1. The semiconductor region 13 has a p⁻-type semiconductor region 13a on the channel side and a p⁺-type semiconductor region 13b coupled thereto. In the p⁻-type semiconductor region 13a and the p⁺-type semiconductor region 13b, impurities of the same conductivity type, such as boron (B), are contained, however, the impurity concentration of the p⁺-type semiconductor region 13b is set so that it is higher than the impurity concentration of the p⁻-type semiconductor region 13a. The semiconductor region 14 has an n⁻-type semiconductor region 14a on the channel side and an n⁺-type semiconductor region 14b coupled thereto. In the n⁻-type semiconductor region 14a and the n⁺-type semiconductor region 14b, impurities of the same conductivity type, such as arsenic (As) and phosphorus (P), are contained, however, the impurity concentration of the n⁺-type semiconductor region 14b is set so that it is higher than the impurity concentration of the n⁻-type semiconductor region 14a. The p-type semiconductor region 13, the n-type semiconductor region 14, and the p-type well HPW1 are portions that form the control gate electrode CGW (the other electrode described above) of the capacity portion C. The p-type semiconductor region 13 and the n-type semiconductor region 14 are electrically coupled to a conductor portion 7e in the contact hole CT formed in the insulating film 2a and the interlayer insulating film 2b. The conductor portion 7e is electrically coupled to the control gate wire CG. In part of the surface layer of the p⁺-type semiconductor region 13b and the n⁺-type semiconductor region 14b with which the conductor portion 7e comes into contact, the silicide layer 5a is formed.

As described above, in the present first embodiment, the conductivity types of the semiconductor regions 13, 14 on the right and left sides of the capacity electrode FGC2 of the capacity portion C are made to differ, that is, they are in a horizontal asymmetry. Here, the reason of providing the n-type semiconductor region 14 is described. The addition of the n-type semiconductor region 14 enables the smooth supply of electrons to immediately under the capacity insulating film 10c at the time of data erase operation. Because of this, an inversion layer can be quickly formed under the capacity electrode FGC2, and therefore, it is possible to quickly fix the p-type well HPW1 to −9V. As a result, the effective coupling capacity can be increased, and therefore, it is possible to efficiently control the potential of the capacity electrode FGC2. Consequently, the data erase speed can be increased. Further, the variations in the data erase speed can be reduced.

As described above, according to the present first embodiment, because both the p-type semiconductor regions 15, 13 and the n-type semiconductor regions 16, 14 are provided in the charge injection/discharge portion CWE and the capacity portion C, and then the n-type semiconductor region 16 acts as a supply source of electrons at the time of electron injection in the electron injection/discharge portion CWE, and the n-type semiconductor region 14 acts as a supply source of electrons to the inversion layer in the capacity portion C, the data write speed and erase speed of the memory cell MC can be increased.

On the main surface of the substrate 1S, the insulating film 2a is deposited so that it covers the side surface and the top surface of the floating gate electrode FG. The insulating film 2a is formed by a silicon nitride film formed by the plasma CVD method. The thickness of the insulating film 2a is, for example, about 30 to 100 nm. Over the insulating film 2a, the interlayer insulating film 2b thicker than the insulating film 2a is deposited.

Between the insulating film 2a and the main surface of the substrate 1S, the cap insulating film 3a and the pattern of the insulating film 4a formed thereover are formed so that they cover the floating gate electrode FG. That is, in the memory cell MC, the cap insulating film 3a, the insulating film 4a, and the insulating film 2a are deposited in order from the lower layer over the main surface of the substrate 1S so that they cover the floating gate electrode FG.

The cap insulating film 3a is formed so that it covers the top surface of the floating gate electrode FG and the surface of the sidewall SW on the side surface of the floating gate electrode FG, and further covers part of the main surface of the substrate 1S. Since the main surface part of the right and left substrates 1S in the width direction (in the direction of short side) of the floating gate electrode FG is covered with the cap insulating film 3a in this manner, it is possible to separate the end portion of the silicide layer 5a over the substrate 1S from the side surface of the floating gate electrode FG (that is, the n⁻-type semiconductor region 12a, the p⁻-type semiconductor region 13a, the n⁻-type semiconductor region 14a, the p⁻-type semiconductor region 15a, and the n⁻-type semiconductor region 16a) in the memory cell MC. As a result, it is possible to suppress or prevent the junction leak from occurring between the silicide layer 5a and the substrate 1S.

The insulating film 4a is formed between the insulating film 2a and the cap insulating film 3a. The insulating film 4a is formed by a silicon nitride film formed by the low-pressure (depressurized) CVD method. The thickness of the insulating film 4a is, for example, 5 to 20 nm. According to the present first embodiment, because water or hydrogen ions can be suppressed or prevented from diffusing to the floating gate electrode FG by the insulating film 4a, it is possible to improve the data retention characteristics of the flash memory.

Next, a configuration example of elements of the LCD driver circuit is described using FIG. 12.

A high-voltage resistant portion and a low-voltage resistant portion are formation regions of the MIS•FET constituting the LCD driver circuit.

In the active region surrounded by the isolation portion TI of the high-voltage resistant portion, high-voltage resistant p-channel type MIS•FETQPH and n-channel type MIS•FETQNH are arranged. The operating voltage of the MIS•FETQPH, QNH of the high-voltage resistant portion is, for example, about 25 V.

The high-voltage resistant p-channel type MIS•FETQPH has a gate electrode FGH, a gate insulating film 10f, and a pair of p-type semiconductor regions 21, 21. The channel of the MIS•FETQPH is formed in the upper layer of the n-type embedded well DNW at which the gate electrode FGH and the active region overlap in a planar manner.

The gate electrode FGH is formed by, for example, low-resistance polycrystal silicon, and in the top surface thereof, the silicide layer 5a is formed. The gate insulating film 10f is made of, for example, silicon oxide, and formed between the gate electrode FGH and the substrate 1S (n-type embedded well DNW).

The pair of the p-type semiconductor regions 21, 21 of the high-voltage resistant p-channel type MIS•FETQPH is formed at the position where the gate electrode FGH is sandwiched in the n-type embedded well DNW.

One of the pair of the p-type semiconductor regions 21, 21 has a p⁻-type semiconductor region 21a on the channel side and a p⁺-type semiconductor region 21b coupled thereto. In the p⁻-type semiconductor region 21a and the p⁺-type semiconductor region 21b, impurities of the same conductivity type, such as boron (B), are contained, however, the impurity concentration of the p⁺-type semiconductor region 21b is set so that it is higher than the impurity concentration of the p⁻-type semiconductor region 21a.

The other of the pair of the p-type semiconductor regions 21, 21 has a p-type semiconductor region PV on the channel side and the p⁺-type semiconductor region 21b coupled thereto. The impurity concentration of the p-type semiconductor region PV is set so that it is higher than that of the p-type embedded well DPW and lower than that of the p⁺-type semiconductor region 21b.

The semiconductor regions 21, 21 of the high-voltage resistant MIS FETQPH are electrically coupled to a conductor portion 7h in the contact hole CT formed in the interlayer insulating film 2b and the insulating film 2a. In part of the surface layer of the p⁺-type semiconductor region 21b with which the conductor portion 7h comes into contact, the silicide layer 5a is formed.

The high-voltage resistant n-channel type MIS•FETQNH has the gate electrode FGH, the gate insulating film 10f, and the pair of the p-type semiconductor regions 22, 22. The channel of the MIS•FETQNH is formed in the upper layer of the p-type embedded well DPW at which the gate electrode FGH and the active region overlap in a planar manner.

The gate electrode FGH of the high-voltage resistant MIS•FETQNH is formed by, for example, low-resistance polycrystal silicon, and in the top surface thereof, the silicide layer 5a is formed. The gate insulating film 10f of the high-voltage resistant MIS•FETQNH is made of, for example, silicon oxide, and formed between the gate electrode FGH and the substrate 1S (p-type embedded well DPW).

The pair of the n-type semiconductor regions 22, 22 of the high-voltage resistant MIS•FETQNH are formed at the position where the gate electrode FGH is sandwiched in the p-type embedded well DPW.

One of the pair of the n-type semiconductor regions 22, 22 has an n⁻-type semiconductor region 22a on the channel side and an n⁺-type semiconductor region 22b coupled thereto. In the n⁻-type semiconductor region 22a and the n⁺-type semiconductor region 22b, impurities of the same conductivity type, such as phosphorus or arsenic (As), are contained, however, the impurity concentration of the n⁺-type semiconductor region 22b is set so that it is higher than the impurity concentration of the n⁻-type semiconductor region 22a.

The other of the pair of the n-type semiconductor regions 22, 22 has an n-type semiconductor region NV on the channel side and the n⁺-type semiconductor region 22b coupled thereto. The impurity concentration of the n-type semiconductor region NV is set so that it is higher than that of the n-type embedded well DNW and lower than that of the n⁺-type semiconductor region 22b.

The semiconductor regions 22, 22 of the high-voltage resistant MIS•FETQNH are electrically coupled to a conductor portion 7i in the contact hole CT formed in the interlayer insulating film 2b and the insulating film 2a. In part of the surface layer of the n⁺-type semiconductor region 22b with which the conductor portion 7i comes into contact, the silicide layer 5a is formed.

On the other hand, in the active region surrounded by the isolation portion TI of the low-voltage resistant portion, a p-channel type MIS•FETQPL and an n-channel type MIS•FETQNL are arranged. The operating voltage of the MIS•FETQPL, QNL of the low-voltage resistant portion is, for example, about 6.0 V. The gate insulating film of the MIS•FETQPL, QNL of the low-voltage resistant portion is formed so that its film thickness is less than that of the high-voltage resistant MIS•FETQNH, QPH, and its gate electrode length in the lengthwise direction of the gate is also small.

The MIS FETQPL, QNL of the low-voltage resistant portion include a MIS•FET the operating voltage of which is 1.5 V, in addition to those the operating voltage of which is 6.0 V. The MIS•FET having an operating voltage of 1.5 V is provided because it operates at higher speed than the MIS•FET having an operating voltage of 6.0 V, constituting the LCD driver circuit along with other MIS•FETs. In addition, the gate insulating film of the MIS•FET having an operating voltage of 1.5 V is thinner than the gate insulating film of the MIS•FET having an operating voltage of 6.0 V and its film thickness is set to about 1 to 3 nm. In the subsequent drawings and specification, the MIS•FET of the high-voltage resistant portion having an operating voltage of 25 V and the MIS•FET of the low-voltage resistant portion having an operating voltage of 6.0 V are mainly shown and the MIS•FET having an operating voltage of 1.5 V is not shown for the simplicity of description.

The low-voltage resistant p-channel type MIS•FETQPL has a gate electrode FGL, a gate insulating film 10g, and a pair of p-type semiconductor regions 23, 23. The channel of the MIS•FETQPL is formed in the upper layer of an n-type well NW at which the gate electrode FGL and the active region overlap in a planar manner.

The gate electrode FGL is formed by, for example, low-resistance polycrystal silicon, and in the top surface thereof, the silicide layer 5a is formed. The gate insulating film 10g is made of, for example, silicon oxide, and formed between the gate electrode FGL and the substrate 1S (n-type well NW).

The pair of the p-type semiconductor regions 23, 23 of the low-voltage resistant p-channel type MIS•FETQPL is formed at the position where the gate electrode FGL is sandwiched in the n-type well NW.

Each of the pair of the p-type semiconductor regions 23, 23 has a $p^-$-type semiconductor region 23a on the channel side and a $p^+$-type semiconductor region 23b coupled thereto. In the $p^-$-type semiconductor region 23a and the $p^+$-type semiconductor region 23b, impurities of the same conductivity type, such as boron (B), are contained, however, the impurity concentration of the $p^+$-type semiconductor region 23b is set so that it is higher than the impurity concentration of the $p^-$-type semiconductor region 23a.

The semiconductor regions 23, 23 of the low-voltage resistant MIS•FETQPL are electrically coupled to a conductor portion 7j in the contact hole CT formed in the interlayer insulating film 2b and the insulating film 2a. In part of the surface layer of the $p^+$-type semiconductor region 23b with which the conductor portion 7j comes into contact, the silicide layer 5a is formed.

The low-voltage resistant n-channel type MIS•FETQNL has the gate electrode FGL, the gate insulating film 10g, and a pair of n-type semiconductor regions 24, 24. The channel of the MIS•FETQNL is formed in the upper layer of a p-type well PW at which the gate electrode FGL and the active region overlap in a planar manner.

The gate electrode FGL of the low-voltage resistant MIS•FETQNL is formed by, for example, low-resistance polycrystal silicon, and in the top surface thereof, the silicide layer 5a is formed. The gate insulating film 10g of the low-voltage resistant MIS•FETQNL is made of, for example, silicon oxide, and formed between the gate electrode FGL and the substrate 1S (p-type well PW).

The pair of the n-type semiconductor regions 24, 24 of the low-voltage resistant MIS•FETQNL are formed at the position where the gate electrode FGL is sandwiched in the p-type well PW.

Each of the pair of the n-type semiconductor regions 24, 24 has an $n^-$-type semiconductor region 24a on the channel side and an $n^+$-type semiconductor region 24b coupled thereto. In the $n^-$-type semiconductor region 24a and the $n^+$-type semiconductor region 24b, impurities of the same conductivity type, such as phosphorus or arsenic (As), are contained, however, the impurity concentration of the $n^+$-type semiconductor region 24b is set so that it is higher than the impurity concentration of the $n^-$-type semiconductor region 24a.

The semiconductor regions 24, 24 of the low-voltage resistant MIS FETQNL are electrically coupled to a conductor portion 7k in the contact hole CT formed in the interlayer insulating film 2b and the insulating film 2a. In part of the surface layer of the $n^+$-type semiconductor region 24b with which the conductor portion 7k comes into contact, the silicide layer 5a is formed.

In the present first embodiment, as shown in FIG. 12, also in the circuit region other than the flash memory, such as the LCD driver circuit region, the peripheral circuit region of the flash memory, the insulating film 2a is formed. Due to this, the miniaturization of elements in the circuit region other than the flash memory, such as the LCD driver circuit region, the peripheral circuit region of the flash memory, can be maintained.

In the semiconductor device (semiconductor chip, substrate 1S) in the present first embodiment, a single power supply is employed as the power supply provided from outside. In the present first embodiment, the voltage (for example, 3.3 V) of the outside single power supply of the semiconductor device can be converted into the voltage (for example, −9 V) used at the time of data write of the memory cell MC by the negative voltage step-up circuit (internal step-up circuit) for the LCD driver circuit. In addition, the voltage (for example, 3.3 V) of the outside single power supply can be converted into the voltage (for example, 9 V) used at the time of data erase of the memory cell MC by the positive voltage step-up circuit (internal step-up circuit) for the LCD driver circuit. That is, it is not necessary to newly provide an internal step-up circuit for the flash memory. Because of this, the scale of the internal circuit of the semiconductor device can be kept small, and therefore, the miniaturization of the semiconductor device can be promoted.

Figure 13:
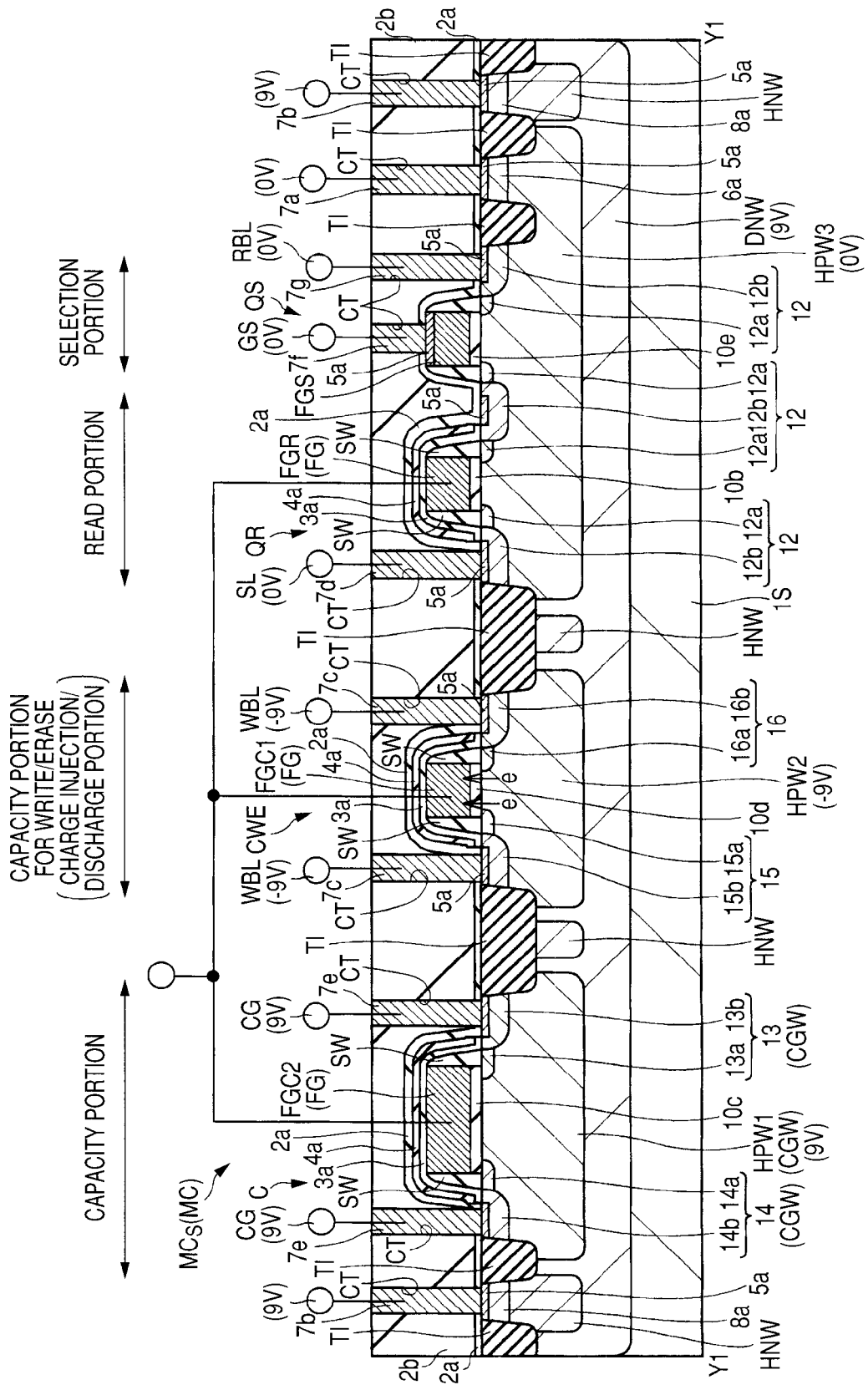
FIG. 13 is a cross sectional view along the Y1-Y1 line of FIG. 10 showing an example of a voltage to be applied to each portion of the memory cell at the time of data write operation of the nonvolatile memory in the semiconductor device in an embodiment of the present invention.

Next, FIG. 13 is a cross sectional view along the Y1-Y1 line of FIG. 10 showing an example of a voltage to be applied to each portion of the selected memory cell MCs at the time of data write operation of the flash memory in the present first embodiment.

Here, the substrate 1S and the p-type wells HPW1 to HPW3 are electrically isolated by applying a voltage of, for example, about 9 V to the n-type well HNW and the n-type embedded well DNW via the conductor portion 7b. A positive control voltage of, for example, about 9 V is applied to the control gate electrode CGW of the capacity portion C from the control gate wire CG via the conductor portion 7e. A negative voltage of, for example, about −9 V is applied to one of the electrodes of the capacity portion CWE (p-type semiconductor region 15 and p-type well HPW2) from the bit line WBL for data write/erase via the conductor portion 7c. A voltage of, for example, 0 V is applied to the p-type well HPW3 via the conductor portion 7a. A voltage of, for example, 0 V is applied to the gate electrode FGS of the selection MIS•FETQS from the selection line GS via the conductor portion 7f. A voltage of, for example, 0 V is applied to one of the n-type semiconductor regions 12 of the MIS•FETQR for data read from the source line SL via the conductor portion 7d. A voltage of, for example, 0 V is applied to one of the n-type semiconductor regions 12 of the selection MIS•FETQS from the bit line RBL for data write via the conductor portion 7g. Due to this, electrons e of the p-type well HPW2 of the capacity portion CWE for data write/erase of the selected memory cell MCs are injected into the capacity electrode FGC1 (floating gate electrode FG) by means of the FN tunnel current over the entire channel surface via the capacity insulating film 10d, and thus, data is written.

Figure 14:
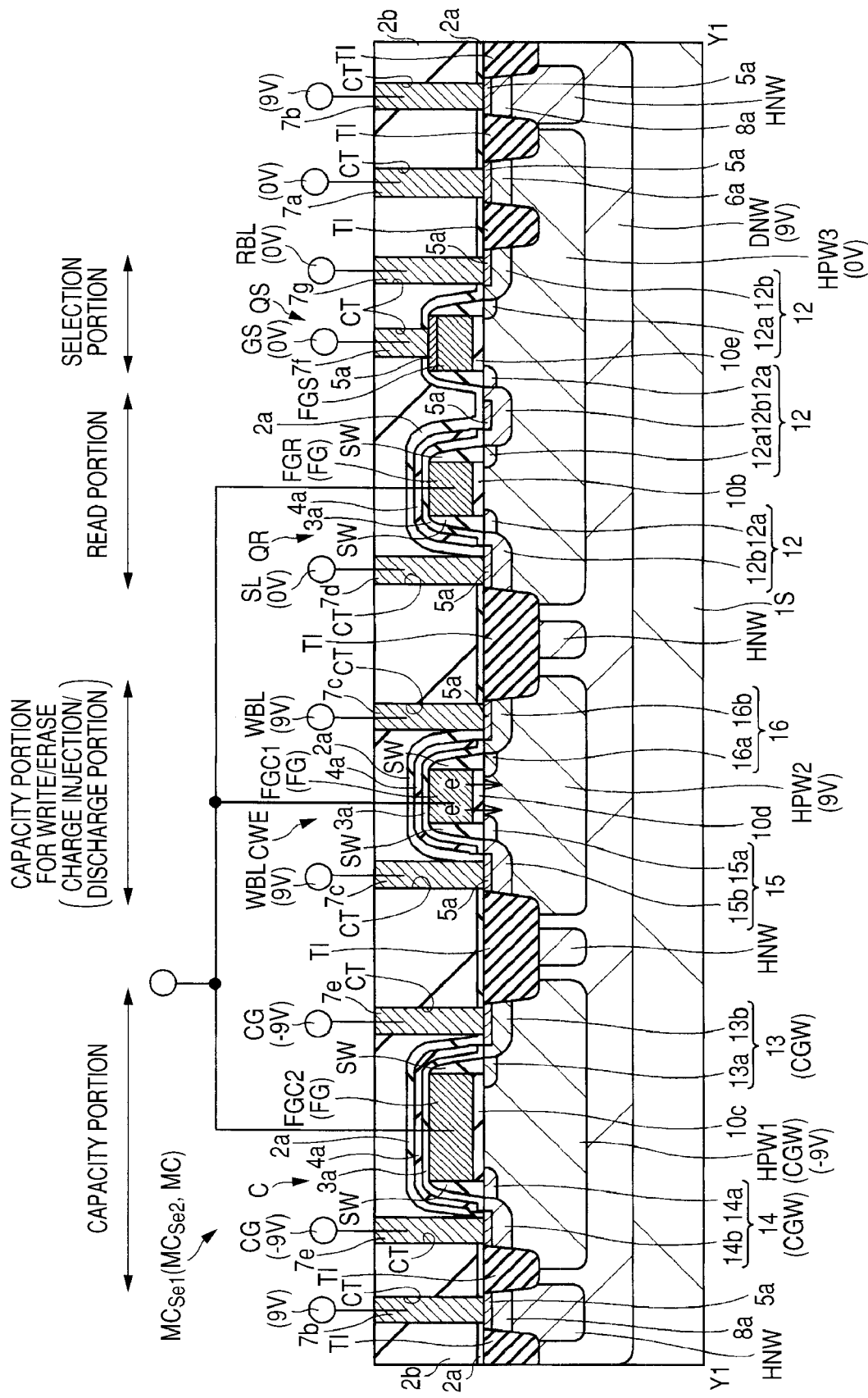
FIG. 14 is a cross sectional view along the Y1-Y1 line of FIG. 10 showing a voltage to be applied to each portion at the time of data erase operation of the nonvolatile memory in the semiconductor device in an embodiment of the present invention.

Next, FIG. 14 is a cross sectional view along the Y1-Y1 line of FIG. 10 showing a voltage to be applied to each portion at the time of data erase operation of the flash memory in the present first embodiment.

Here, the substrate IS and the p-type wells HPW1 to HPW3 are electrically isolated by applying a voltage of, for example, about 9 V to the n-type well HNW and the n-type embedded well DNW via the conductor portion 7b. A negative control voltage of, for example, about −9 V is applied to the control gate electrode CGW of the capacity portion C from the control gate wire CG via the conductor portion 7e. A positive voltage of, for example, about 9 V is applied to one of the electrodes of the capacity portion CWE (p-type semiconductor region 15 and p-type well HPW2) from the bit line WBL for data write/erase via the conductor portion 7c. A voltage of, for example, 0 V is applied to the p-type well HPW3 via the conductor portion 7a. A voltage of, for example, 0 V is applied to the gate electrode FGS of the selection MIS•FETQS from the selection line GS via the conductor portion 7f. A voltage of, for example, 0 V is applied to one of the n-type semiconductor regions 12 of the MIS•FETQR for data read from the source line SL via the conductor portion 7d. A voltage of, for example, 0 V is applied to one of the n-type semiconductor regions 12 of the selection MIS•FETQS from the bit line RBL for data write via the conductor portion 7g. Due to this, the electrons e accumulated in the capacity electrode FGC1 (floating gate electrode FG) of the capacity portion CWE for data write/erase of the selected memory cell MCse1 (MCse2) are discharged to the p-type well HPW2 by means of the FN tunnel current over the entire channel surface via the capacity insulating film 10d, and thus, data is erased.

Figure 15:
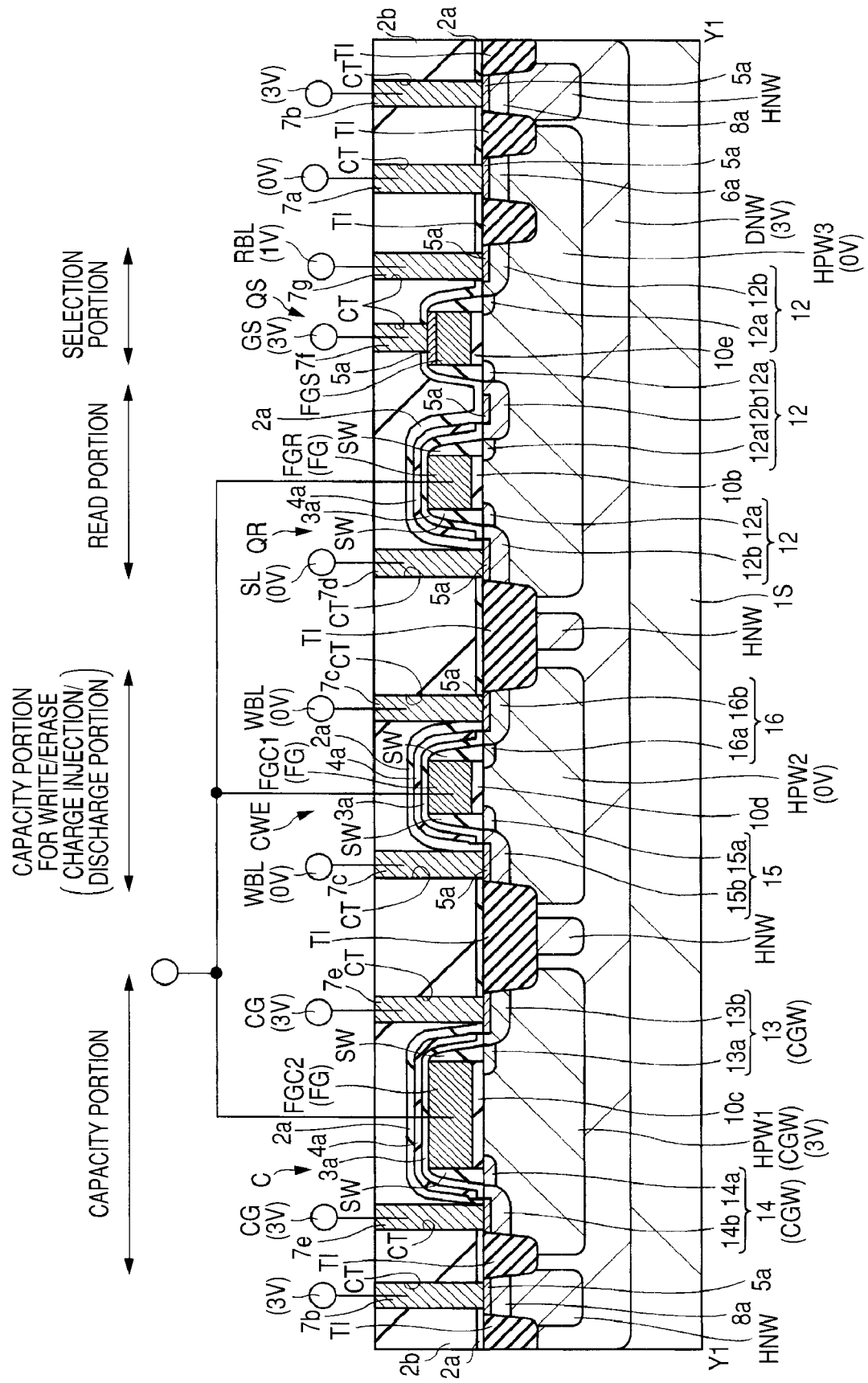
FIG. 15 is a cross sectional view along the Y1-Y1 line of FIG. 10 showing a voltage to be applied to each portion at the time of data read operation of the nonvolatile memory in the semiconductor device in an embodiment of the present invention.

Next, FIG. 15 is a cross sectional view along the Y1-Y1 line of FIG. 10 showing a voltage to be applied to each portion at the time of data read operation of the flash memory in the present first embodiment.

Here, the substrate 1S and the p-type wells HPW1 to HPW3 are electrically isolated by applying a voltage of, for example, about 3 V to the n-type well HNW and the n-type embedded well DNW via the conductor portion 7b. In addition, a positive control voltage of, for example, about 3 V is applied to the control gate electrode CGW of the capacity portion C from the control gate wire CG via the conductor portion 7e. Due to this, a positive voltage is applied to the gate electrode FGR of the MIS•FETQR for data read. In addition, a voltage of, for example, 0 V is applied to the p-type well HPW3 via the conductor portion 7a. A voltage of, for example, 3 V is applied to the gate electrode FGS of the selection MIS•FETQS from the selection line GS via the conductor portion 7f. A voltage of, for example, 0 V is applied to one of the n-type semiconductor regions 12 of the MIS•FETQR for data read from the source line SL via the conductor portion 7d. A voltage of, for example, 1 V is applied to one of the n-type semiconductor regions 12 of the selection MIS•FETQS from the bit line RBL for data write via the conductor portion 7g. A voltage of, for example, 0 V is applied to one of the electrodes of the capacity portion CWE (p-type semiconductor region 15 and p-type well HPW2) from the bit line WBL for data write/erase via the conductor portion 7c. Due to this, on the assumption that the MIS•FETQR for data read of the selected memory cell MCr is on, it is read whether the data stored in the selected memory cell MCr is 0 or 1 depending on whether or not the drain current flows through the channel of the MIS•FETQR for data read.

According to the present first embodiment as described above, the data rewrite region (capacity portion CWE), the data read region (MIS•FETQR for data read), and the capacity coupling region (capacity portion C) are formed separately in the p-type wells HPW1 to HPW3, respectively, and each of them is isolated by the n-type well HNW and the n-type embedded well DNW.

Due to the separate formation of the data rewrite region (capacity portion CWE) and the data read region (MIS•FETQR for data read) in the respective p-type wells HPW2, HPW3, the data rewrite can be stabilized. Because of this, the reliability of the operation of the flash memory can be improved.

Next, an example of a method of manufacturing the semiconductor device in the present first embodiment will be described with reference to FIG. 16 to FIG. 29. FIG. 16 to FIG. 29 are cross sectional views of essential parts of the same substrate 1S (here, a semiconductor thin plate with a plane-circular shape, referred to as a semiconductor wafer) in the manufacturing process of the semiconductor device in the present first embodiment.

Figure 16:
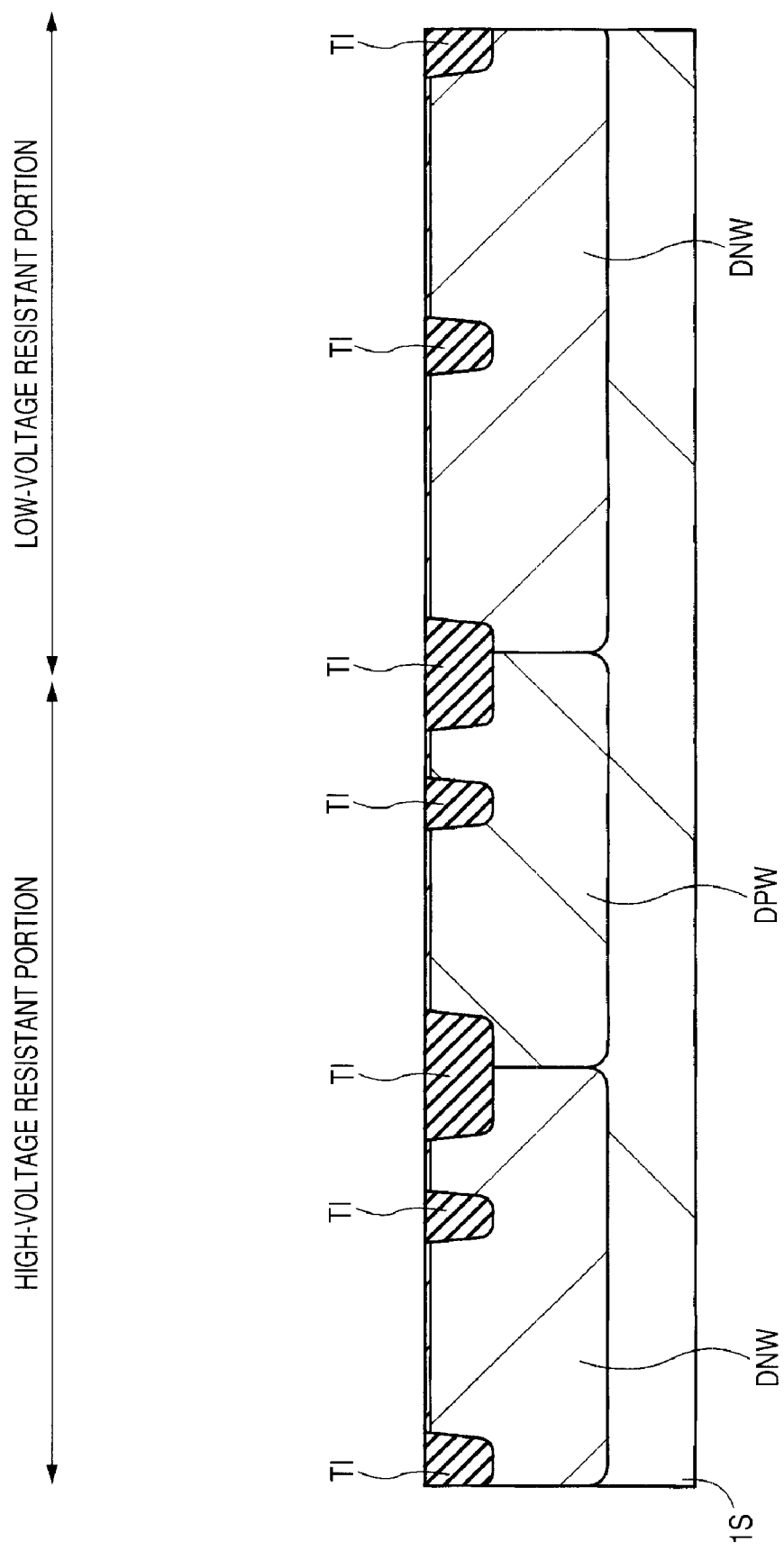
FIG. 16 is a cross sectional view of essential parts of a semiconductor substrate in the main circuit formation region during the period of the manufacturing process of the semiconductor device in another embodiment of the present invention.
Figure 17:
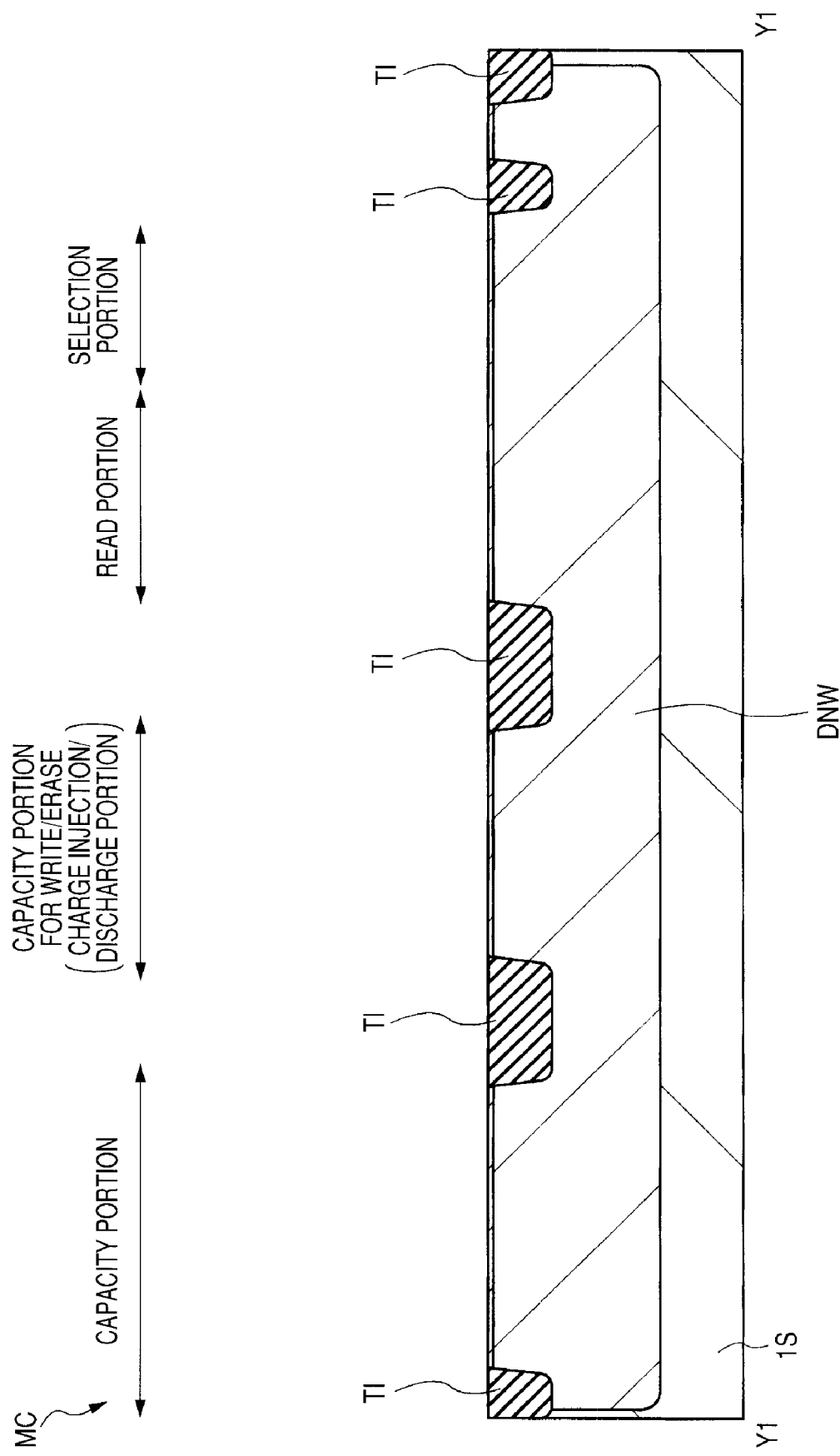
FIG. 17 is a cross sectional view of essential parts of the semiconductor substrate in a nonvolatile memory region during the period of the same process as that in FIG. 16.

First, as shown in FIG. 16 and FIG. 17, the p-type substrate 1S (semiconductor wafer) is prepared and the p-type embedded well DPW is formed in its high-voltage resistant portion by the photolithography (hereinafter, referred to simply as lithography) process, the ion implantation process, etc. The lithography process includes a series of processes for forming a desired resist pattern by the application, exposure, development, etc. of the photoresist (hereinafter, referred to simply as resist). In the ion implantation process, desired impurities are selectively introduced to a desired part of the substrate 1S using a resist pattern formed over the main surface of the substrate 1S after having been subjected to the lithography process as a mask. This resist pattern is a pattern in which the region into which impurities have been introduced is exposed and other regions are covered.

Subsequently, the n-type embedded well DNW is formed simultaneously in the high-voltage resistant portion, the low-voltage resistant portion, and the memory cell array of the flash memory by the lithography process, the ion implantation process, etc. Then, after an isolation groove is formed in the isolation region on the main surface of the substrate 1S, the isolation portion TI having the shape of a groove is formed by embedding an insulating film in the isolation groove. Due to this, the active region is defined.

Figure 18:
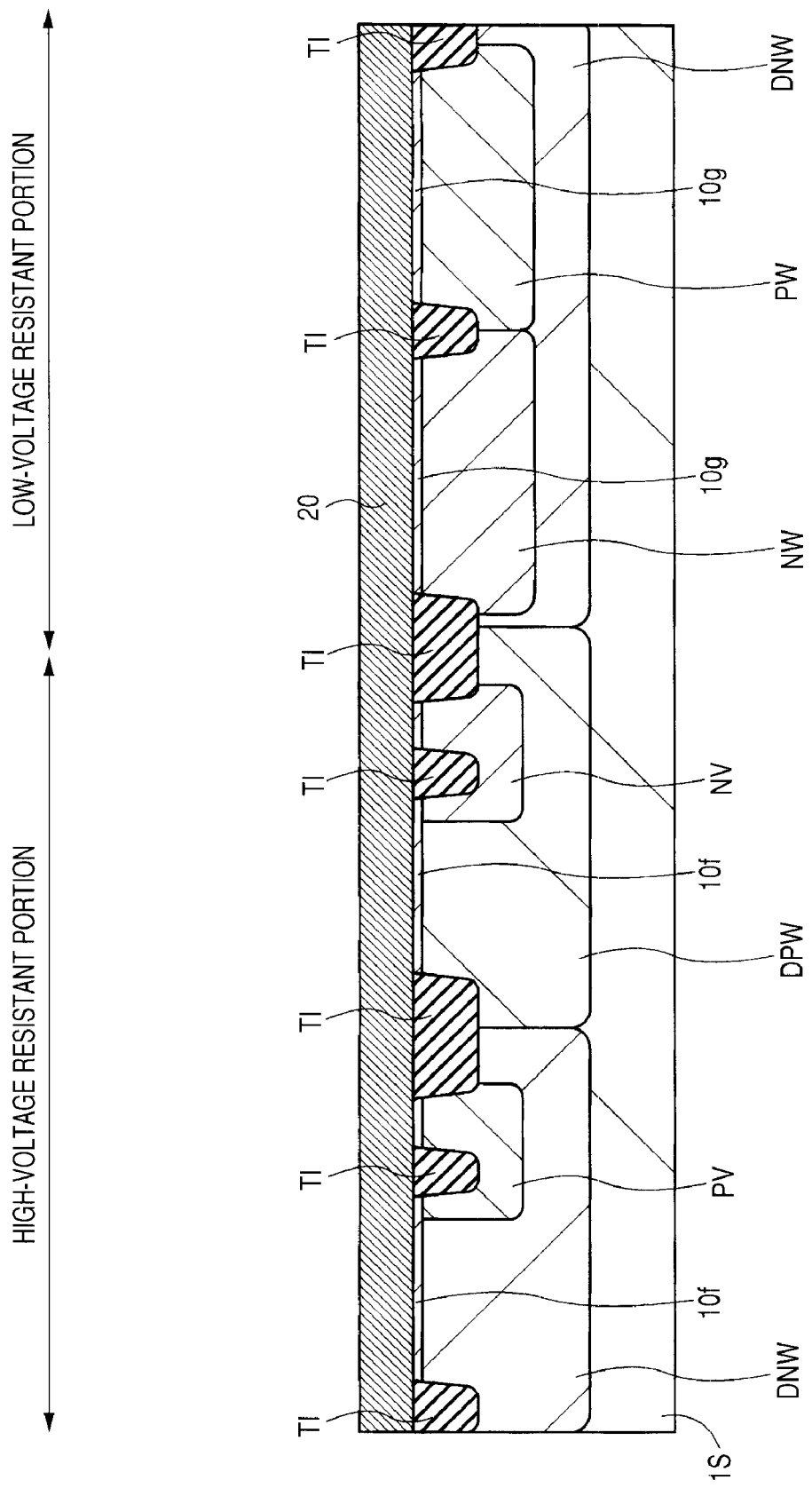
FIG. 18 is a cross sectional view of essential parts of the semiconductor substrate in the main circuit formation region during the period of the manufacturing process of the semiconductor device, following FIG. 16 and FIG. 17.
Figure 19:
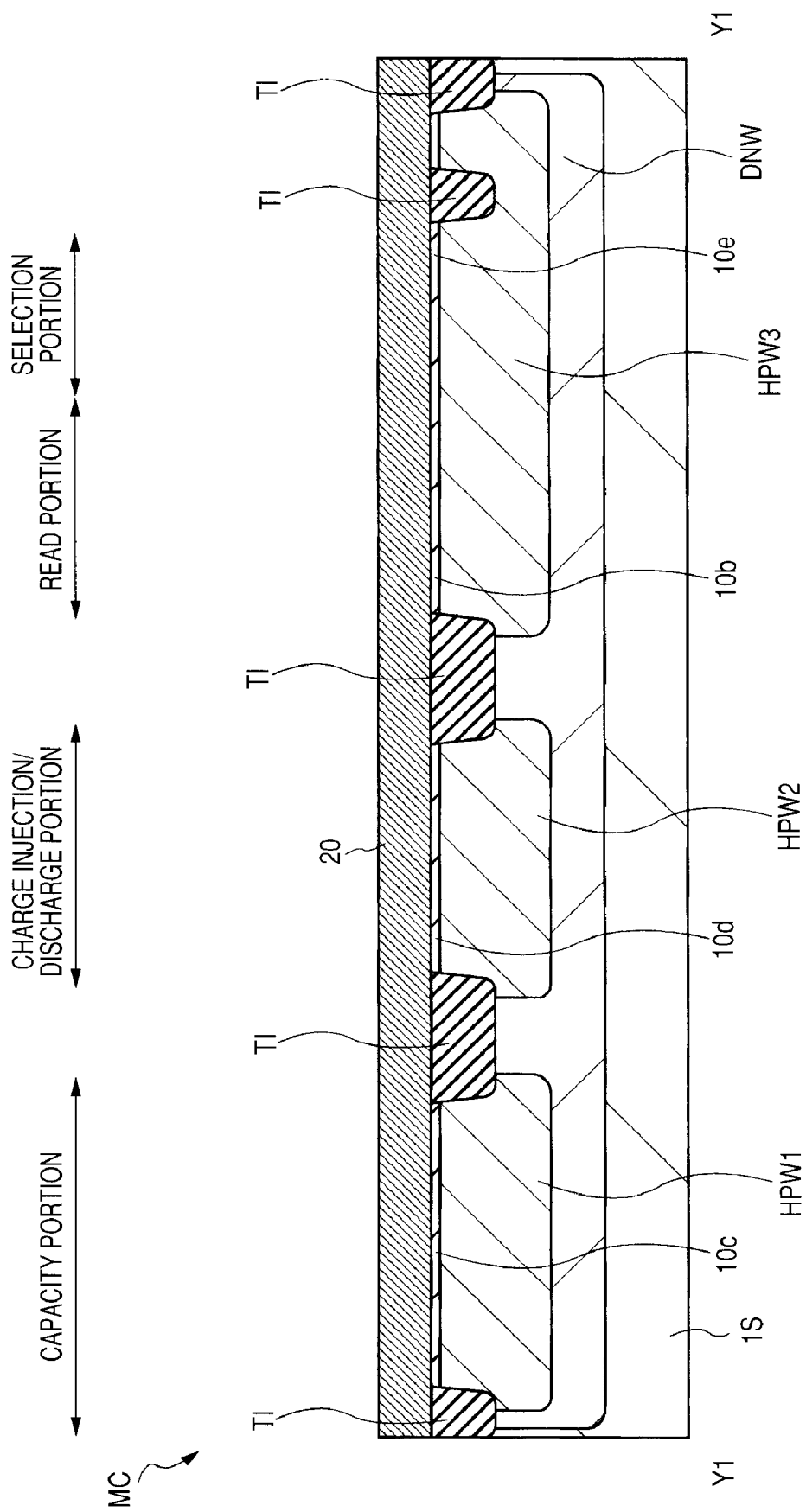
FIG. 19 is a cross sectional view of essential parts of the semiconductor substrate in the nonvolatile memory region during the period of the same process as that in FIG. 18.

Next, as shown in FIG. 18 and FIG. 19, the n-type semiconductor region NV is formed in the formation region of the n-channel type MIS•FET of the high-voltage resistant portion by the lithography process, the ion implantation process, etc. The n-type semiconductor region NV is a region having a higher impurity concentration than that of the n-type embedded well DNW. Subsequently, the p-type semiconductor region PV is formed in the formation region of the p-channel type MIS•FET of the high-voltage resistant portion by the lithography process, the ion implantation process, etc. The p-type semiconductor region PV is a region having a higher impurity concentration than that of the p-type embedded well DPW.

Subsequently, the p-type well PW is formed in the formation region of the n-channel type MIS•FET of the low-voltage resistant portion by the lithography process, the ion implantation process, etc. The p-type well PW is a region having a higher impurity concentration than that of the p-type embedded well DPW and a higher impurity concentration than that of the p-type semiconductor region PV. Subsequently, the n-type well NW is formed in the formation region of the p-channel type MIS•FET of the low-voltage resistant portion by the lithography process, the ion implantation process, etc. The n-type well NW is a region having a higher impurity concentration than that of the n-type embedded well DNW and a higher impurity concentration than that of the n-type semiconductor region NV.

Subsequently, the p-type wells HPW1 to HPW3 are formed simultaneously in the memory cell array of the flash memory by the lithography process, the ion implantation process, etc. The p-type wells HPW1 to HPW3 are regions having a higher impurity concentration than that of the p-type embedded well DPW and an impurity concentration about the same as that of the p-type semiconductor region PV.

The relationship in magnitude among the impurity concentrations of these n-type embedded well DNW, p-type embedded well DPW, n-type semiconductor region NV, p-type semiconductor region PV, n-type well NW, p-type well PW, and p-type wells HPW1 to HWP3 is the same as that in the embodiments to be described later.

Then, after the gate insulating films 10b, 10e, 10f, and 10g and the capacity insulating films 10c, 10d are formed by the thermal oxidation method etc., a conductive film 20 made of, for example, a low-resistance polycrystal silicon film is formed over the main surface (first main surface) of the substrate 1S (semiconductor wafer) by the CVD (Chemical Vapor Deposition) method etc. At this time, the gate insulating film 10f of the MIS•FET of the high-voltage resistant portion is formed by a gate insulating film thicker than the gate insulating film 10g of the MIS•FET of the low-voltage resistant portion so that it can withstand a voltage of 25 V. The thickness of the gate insulating film 10f of the high-voltage resistant MIS•FET is, for example, 50 to 100 nm. It is also possible to laminate an insulating film deposited by the CVD method etc. in addition to the oxide film by the thermal oxidation method.

In the present first embodiment, the gate insulating films 10b, 10e and the capacity insulating films 10c, 10d of the nonvolatile memory are formed by the same process as that for the gate insulating film 10g of the MIS•FET of the low-voltage resistant portion (here, MIS•FET having an operating voltage of, for example, 6.0 V). Because of this, the thickness of the gate insulating films 10b, 10e and the capacity insulating films 10c, 10d of the flash memory is the same as that of the gate insulating film 10g of the MIS FET of the low-voltage resistant portion. Because of the same reason of the insulating film 10a etc. described above, preferably, the film thickness of the gate insulating films 10b, 10e, 10g and the capacity insulating films 10c, 10d is not less than 10 nm and not more than 20 nm, and for example, it is 13.5 nm.

Figure 20:
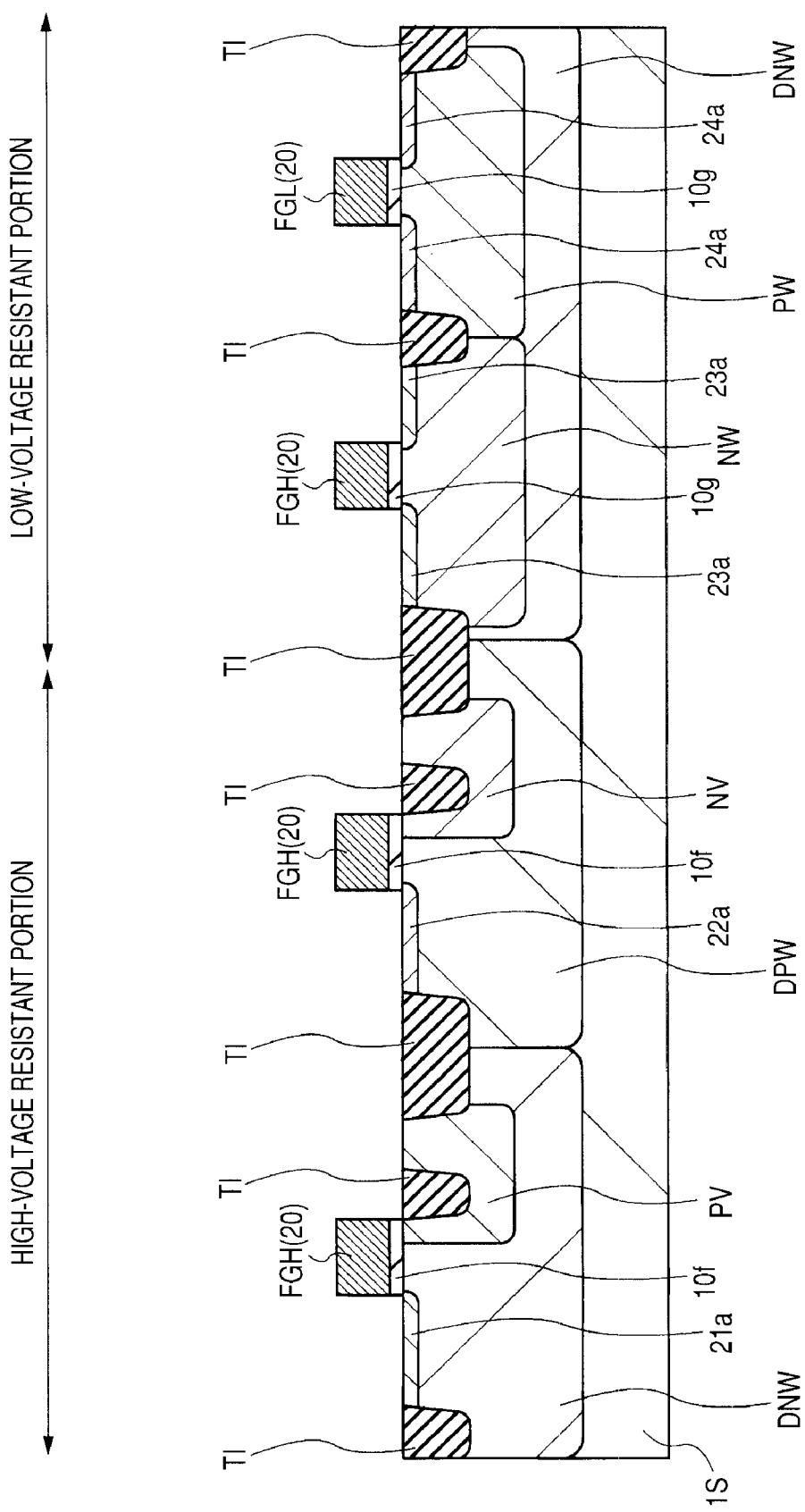
FIG. 20 is a cross sectional view of essential parts of the semiconductor substrate in the main circuit formation region during the period of the manufacturing process of the semiconductor device, following FIG. 18 and FIG. 19.
Figure 21:
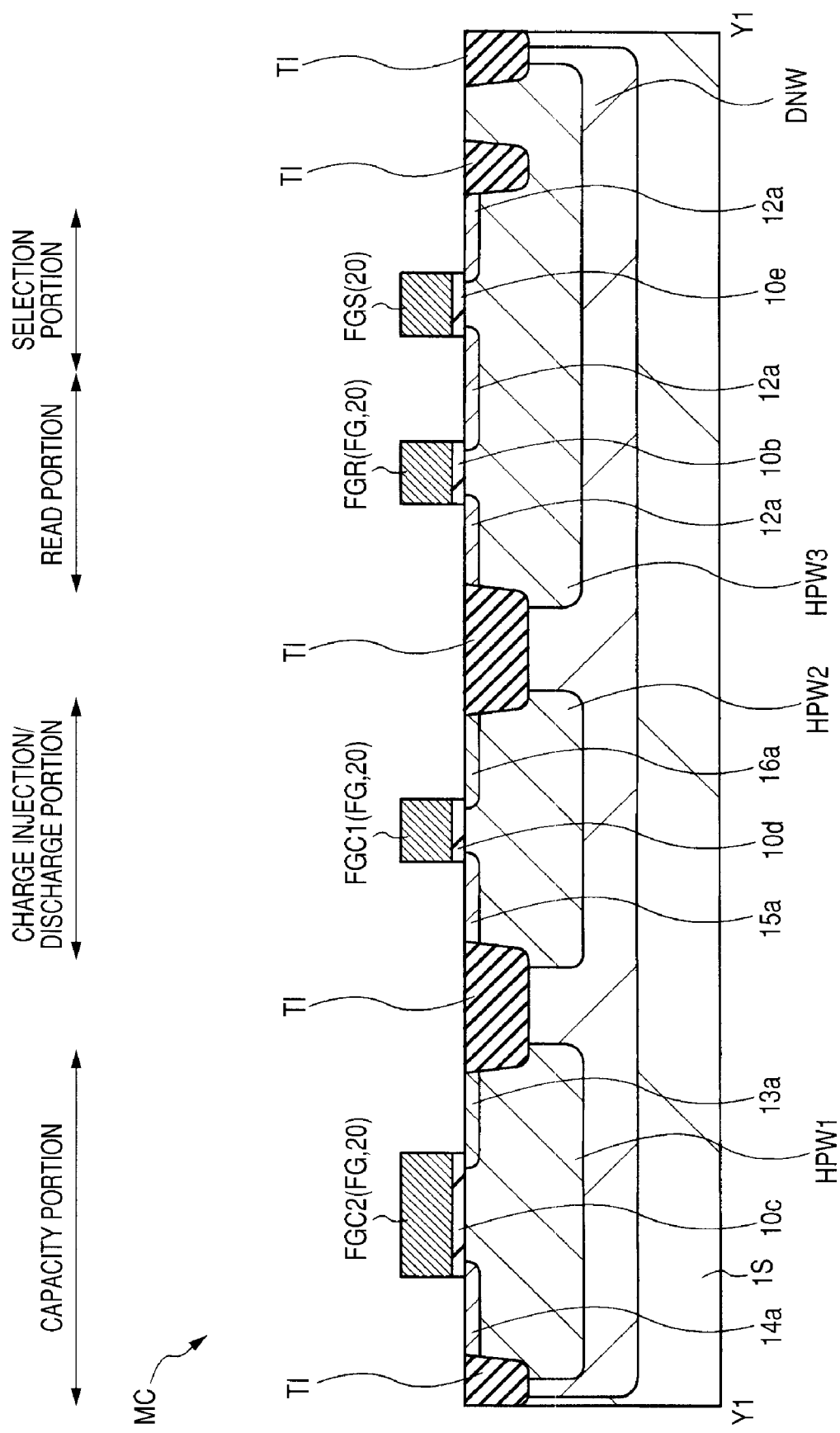
FIG. 21 is a cross sectional view of essential parts of the semiconductor substrate in the nonvolatile memory region during the period of the same process as that in FIG. 20.

Next, as shown in FIG. 20 and FIG. 21, the gate electrodes FGH, FGL, FGS and the floating gate FG (gate electrode FGR and capacity electrodes FGC1, FGC2) are formed simultaneously by patterning the conductive film 20 by the lithography process and the etching process. Subsequently, in the formation region of the p-channel type MIS•FET of the high-voltage resistant portion, the formation region of the capacity portion C, and the formation region of the capacity portion CWE for data write/erase, the p$^-$-type semiconductor regions 21a, 13a, 16a are formed simultaneously by the lithography process, the ion implantation method, etc. Subsequently, in the formation region of the n-channel type MIS FET of the high-voltage resistant portion, the formation region of the MIS•FETQR for data read, the formation region of the capacity portion C, the formation region of the capacity portion CWE for data write/erase, and the formation region of the selection MIS•FETQS, the n$^-$-type semiconductor regions 22a, 12a, 14a, 15a are formed simultaneously by the lithography process, the ion implantation method, etc. Subsequently, in the formation region of the p-channel type MIS•FET of the low-voltage resistant portion, the p$^-$-type semiconductor region 23a is formed by the lithography process, the ion implantation method, etc. Subsequently, in the formation region of the n-channel type MIS•FET of the low-voltage resistant portion, the n$^-$-type semiconductor regions 24a is formed by the lithography process, the ion implantation method, etc.

Figure 22:
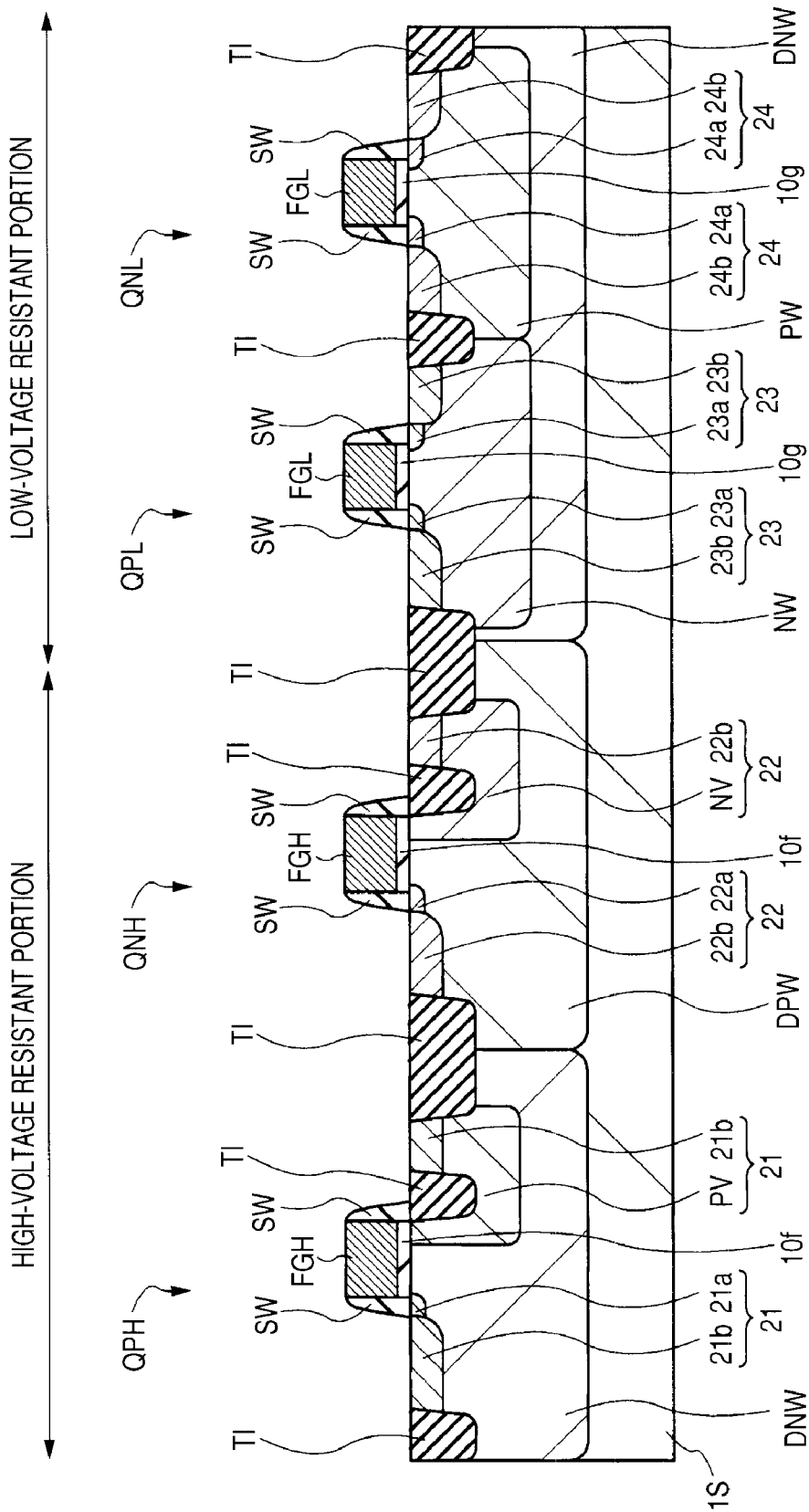
FIG. 22 is a cross sectional view of essential parts of the semiconductor substrate in the main circuit formation region during the period of the manufacturing process of the semiconductor device, following FIG. 20 and FIG. 21.
Figure 23:
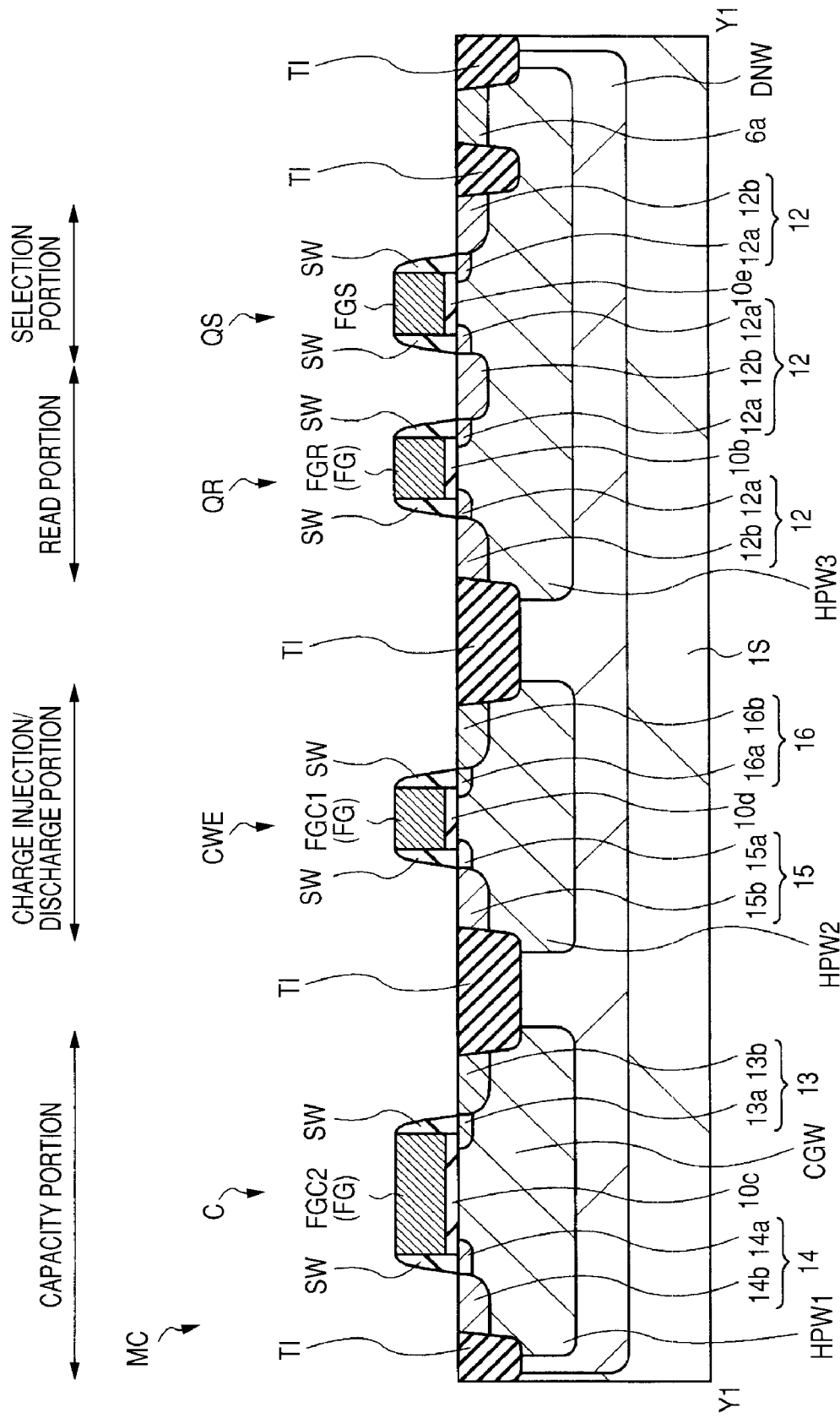
FIG. 23 is a cross sectional view of essential parts of the semiconductor substrate in the nonvolatile memory region during the period of the same process as that in FIG. 22.

Next, as shown in FIG. 22 and FIG. 23, after an insulating film made of, for example, silicon oxide, is deposited over the main surface of the substrate 1S (semiconductor wafer) by the CVD method etc., the sidewall SW is formed on the side surface of the gate electrodes FGH, FGL, FGR, FGS and the capacity electrode, FGC1, FGC2 by etching back the insulating film with anisotropic dry-etching.

Subsequently, in the formation region of the p-channel type MIS•FET of the high-voltage resistant portion and the low-voltage resistant portion, the formation region of the capacity portion and the capacity portion for write/erase, and the region where the p-type well HPW3 has been drawn, the p$^+$-type semiconductor regions 21b, 23b, 13b, 15b, 6a are formed simultaneously by the lithography method, the ion implantation method, etc. With these, the p-type semiconductor region 21 for source and drain is formed in the high-voltage resistant portion and the p-channel type MIS•FETQPH is formed. In the low-voltage resistant portion, the p-type semiconductor region 23 for source and drain is formed and the p-channel type MIS•FETQPL is formed. In the formation region of the capacity portion, the p-type semiconductor region 13 is formed. In the formation region of the capacity portion for write/erase, the p-type semiconductor region 15 is formed.

Subsequently, in the formation region of the high-voltage resistant portion, the low-voltage resistant portion, the read portion, the capacity portion, and the capacity portion for write/erase and the formation region of the n-channel type MIS•FET of the selection portion, the n$^+$-type semiconductor regions 22b, 24b, 12b, 14b, 16b are formed simultaneously by the lithography process, the ion implantation method, etc. With these, in the high-voltage resistant portion, the n-type semiconductor region 22 for source and drain is formed and the n-channel type MIS•FETQNH is formed. In the low-voltage resistant portion, the n-type semiconductor region 24 for source and drain is formed and the n-channel type MIS•FETQNL is formed. In the read portion and selection portion, the n-type semiconductor region 12 is formed and the MIS•FETQR for data read and the selection MIS•FETQS are formed. In the formation region of the capacity portion, the n-type semiconductor region 14 is formed. In the formation region of the capacity portion for write/erase, the n-type semiconductor region 16 is formed.

Figure 24:
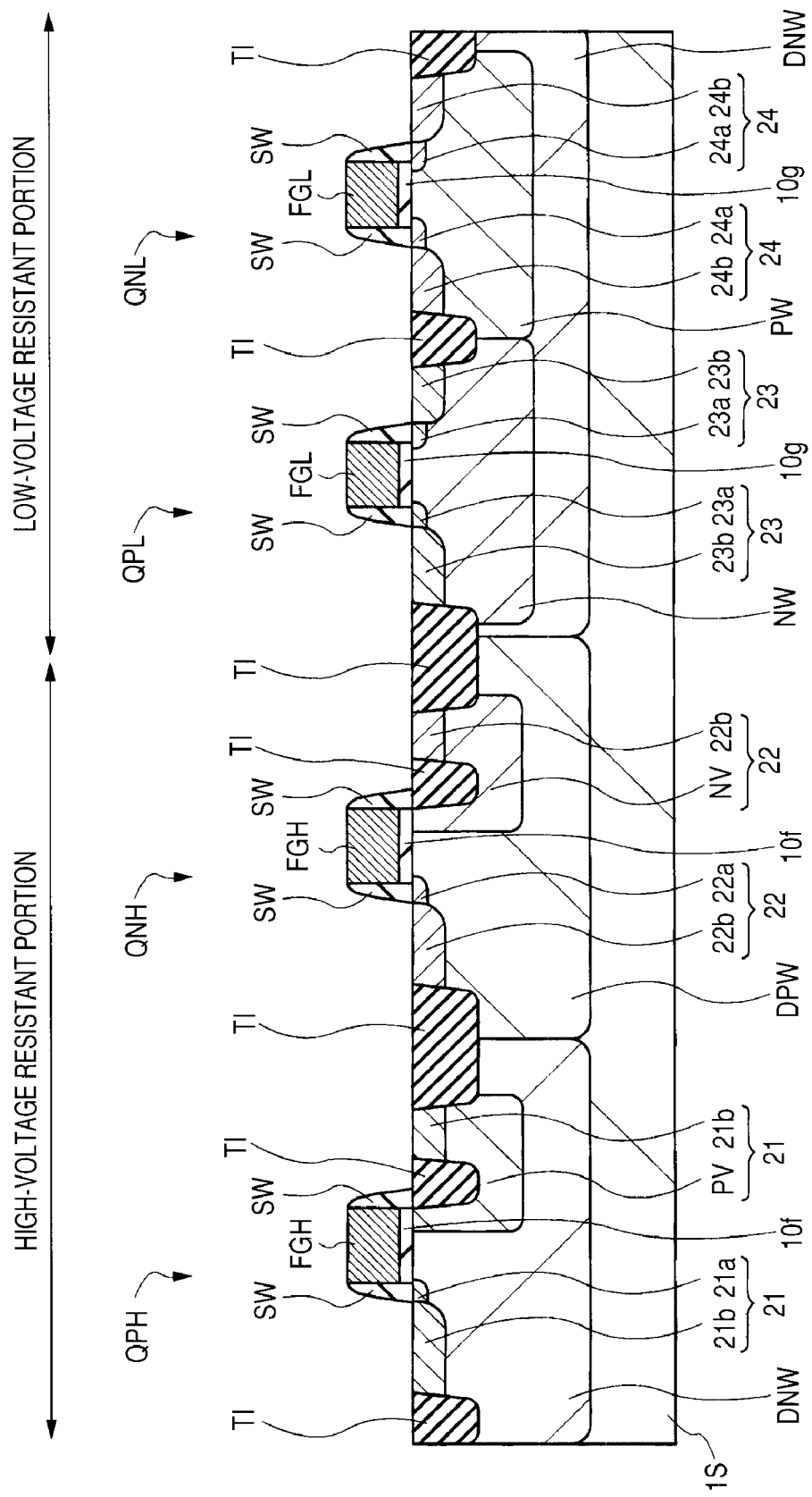
FIG. 24 is a cross sectional view of essential parts of the semiconductor substrate in the main circuit formation region during the period of the manufacturing process of the semiconductor device, following FIG. 22 and FIG. 23.
Figure 25:
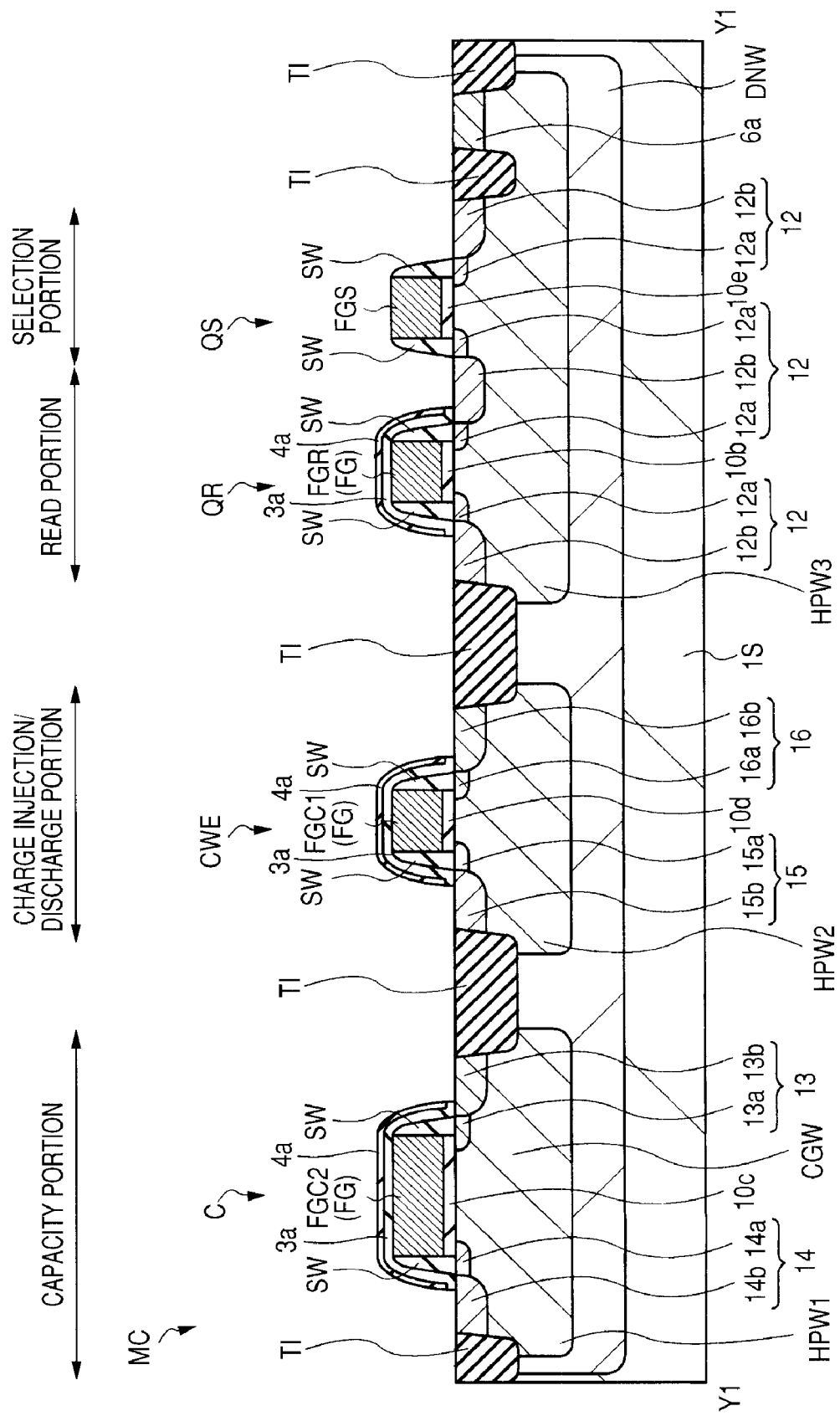
FIG. 25 is a cross sectional view of essential parts of the semiconductor substrate in the nonvolatile memory region during the period of the same process as that in FIG. 24.

Next, as shown in FIG. 24 and FIG. 25, a cap insulating film made of, for example, a silicon oxide film is deposited over the main surface of the substrate 1S by the CVD method and after an insulating film made of, for example, a silicon nitride film is deposited thereover by the low-pressure CVD method, the pattern of the cap insulating film 3a and the insulating film 4a is formed by patterning it by the lithography process and the etching process. The cap insulating film 3a and the insulating film 4a are formed into a pattern that covers the floating gate electrode FG of the memory cell MC and are not formed in other regions.

The insulating film 4a is formed by the low-pressure (depressurized) CVD (LPCVD) method without plasma, as described above. When forming a silicon nitride film (insulating film 4a) by the low-pressure CVD method, it is generated by the thermal reaction between, for example, dichlorosilane ($SiH_2Cl_2$) and ammonia ($NH_3$). The treatment temperature is, for example, 650° C. to 800° C.

In the case of the low-pressure CVD method, because the length of average free travel of reactive molecules is great, it is possible to deposit a thin film excellent in step coverage. In addition, the uniformity of film thickness and film quality is excellent.

The pattern of the cap insulating film 3a and the insulating film 4a is formed so that it covers the top surface of the floating gate electrode FG and the surface of the sidewall SW on the side surface of the floating gate electrode FG, and further, it covers part of the main surface of the substrate 1S. Because the insulating film 4a is provided, it is possible to suppress or prevent water and hydrogen ions from diffusing to the floating gate electrode FG and therefore the data retention characteristics of the flash memory can be improved.

In the case of the low-pressure CVD method, although it requires more time for forming a film compared to the plasma CVD method, the thickness of the insulating film 4a by the low-pressure CVD method is, for example, 5 to 20 nm, and therefore, it is unlikely that the formation of the insulating film 4a considerably increases the time required for manufacturing the semiconductor device because it can be thinner than the insulating film 2a by the plasma CVD method.

Figure 26:
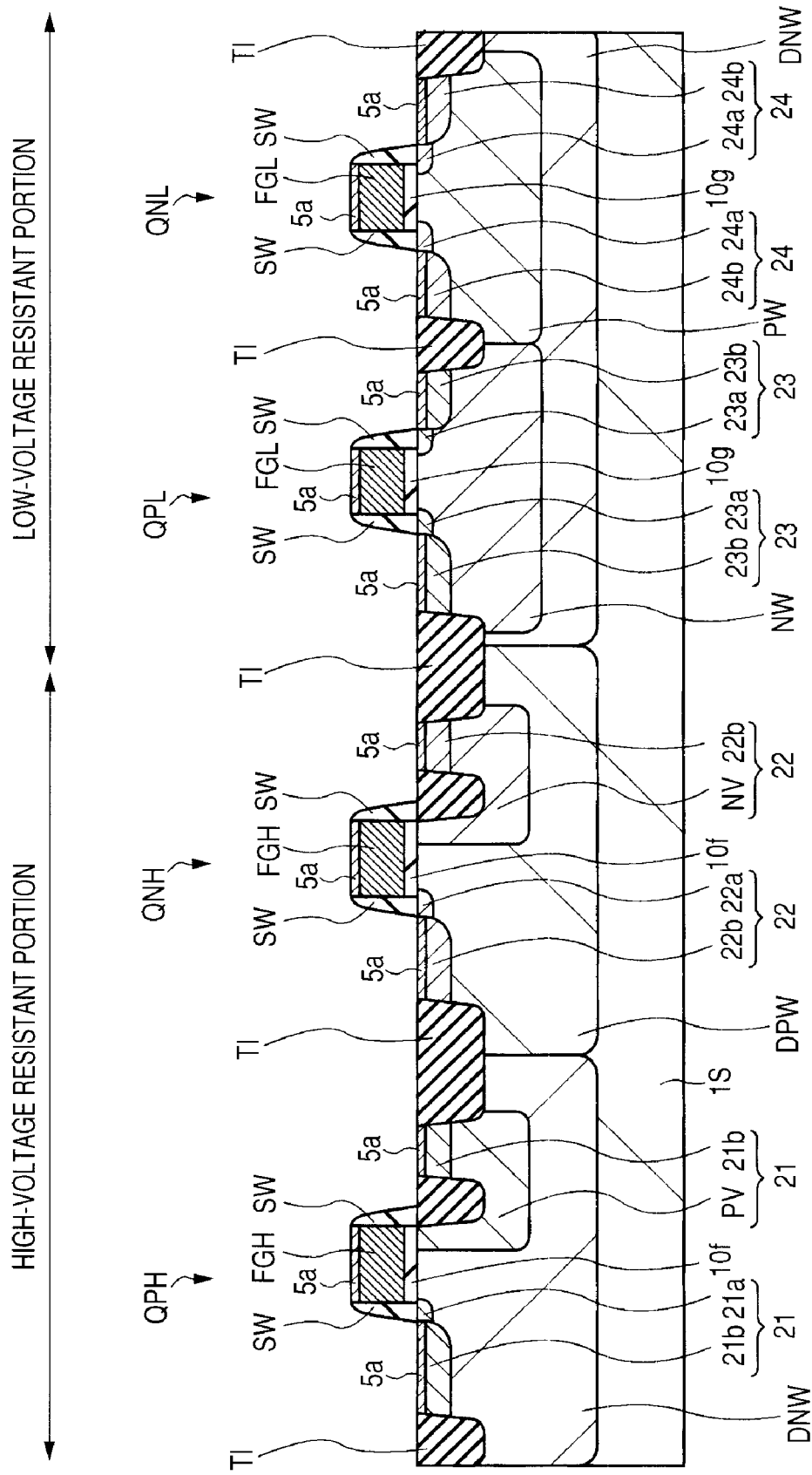
FIG. 26 is a cross sectional view of essential parts of the semiconductor substrate in the main circuit formation region during the period of the manufacturing process of the semiconductor device, following FIG. 24 and FIG. 25.
Figure 27:
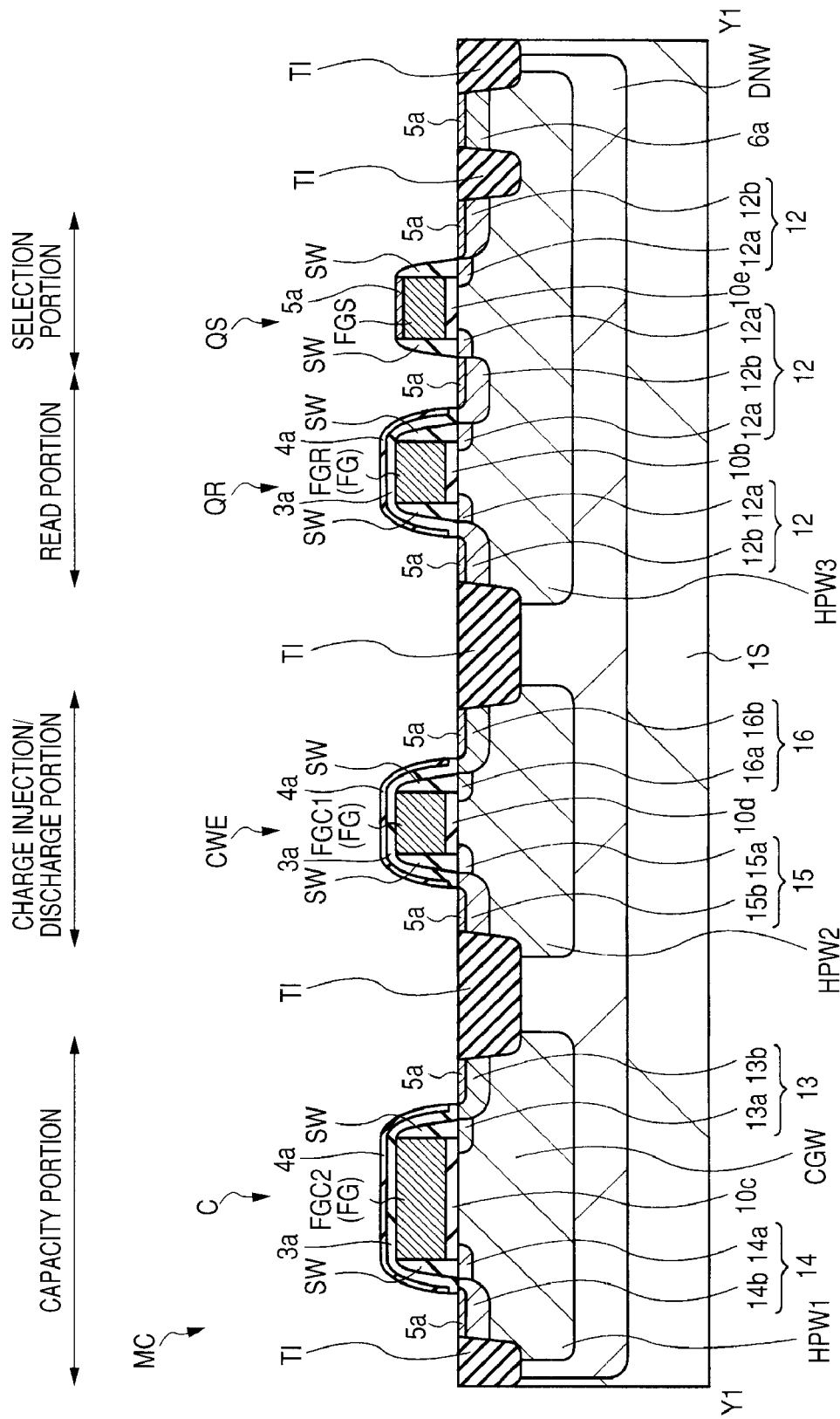
FIG. 27 is a cross sectional view of essential parts of the semiconductor substrate in the nonvolatile memory region during the period of the same process as that in FIG. 26.

In addition, the pattern of the cap insulating film 3a and the insulating film 4a is formed at a portion where the silicide layer 5a is not formed simultaneously with the lithography process and the etching process for forming a mask pattern (pattern for insulating film). Due to this, it is unlikely that the formation of the pattern of the cap insulating film 3a and the insulating film 4a increases the time required for the manufacturing process of the semiconductor device and its manufacturing time. Next, as shown in FIG. 26 and FIG. 27, the silicide layer 5a is formed selectively. Since the cap insulating film 3a and the insulating film 4a are formed as described above, it is possible to separate the end portion of the silicide layer 5a over the substrate 1S from the side surface of the floating gate electrode FG (that is, the n$^-$-type semiconductor region 12a, the p$^-$-type semiconductor region 13a, the n$^-$-type semiconductor region 14a, the p$^-$-type semiconductor region 15a, the n$^-$-type semiconductor region 16a), and therefore, the occurrence of the junction leak between the silicide layer 5a and the substrate 1S can be suppressed or prevented.

Figure 28:
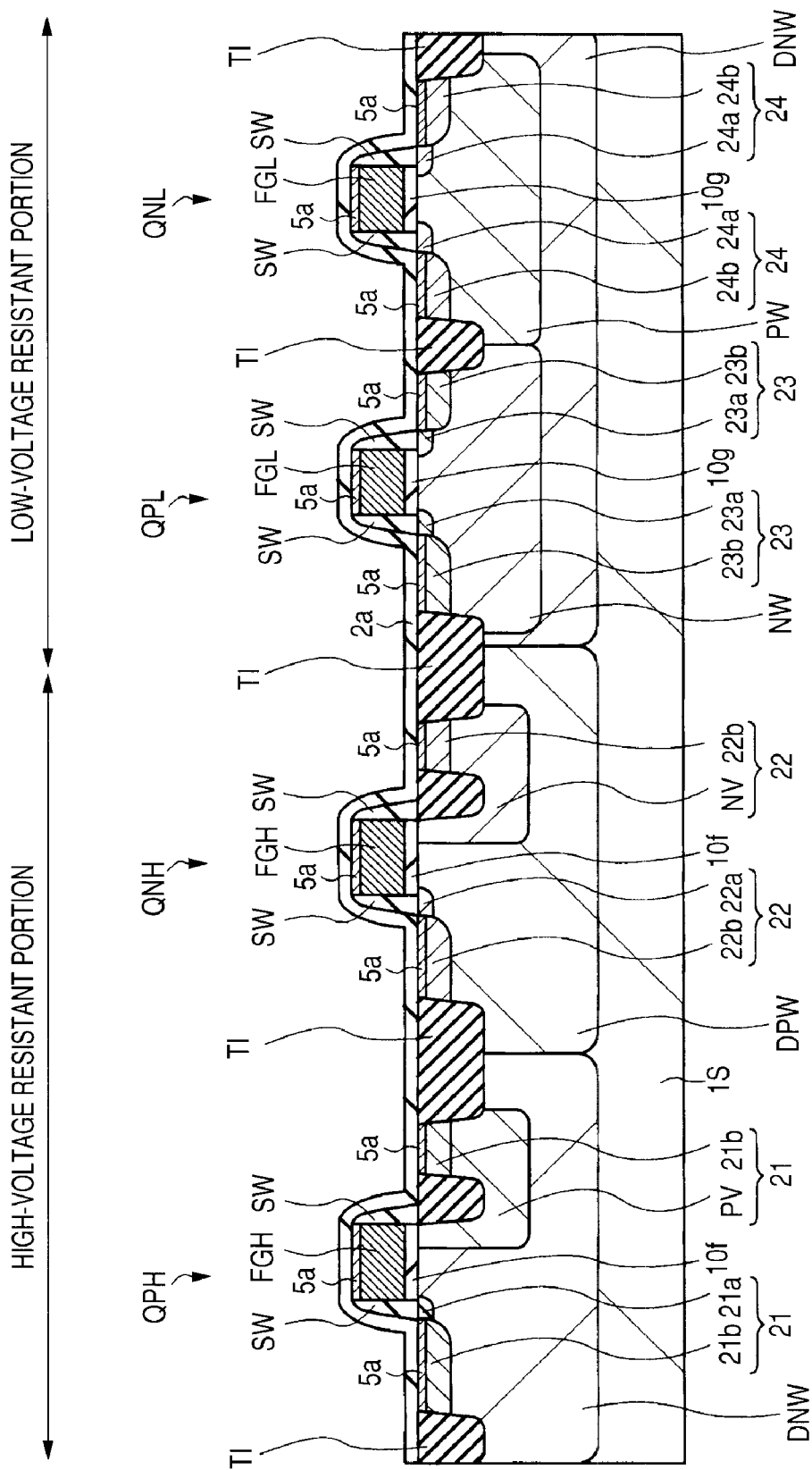
FIG. 28 is a cross sectional view of essential parts of the semiconductor substrate in the main circuit formation region during the period of the manufacturing process of the semiconductor device, following FIG. 26 and FIG. 27.
Figure 29:
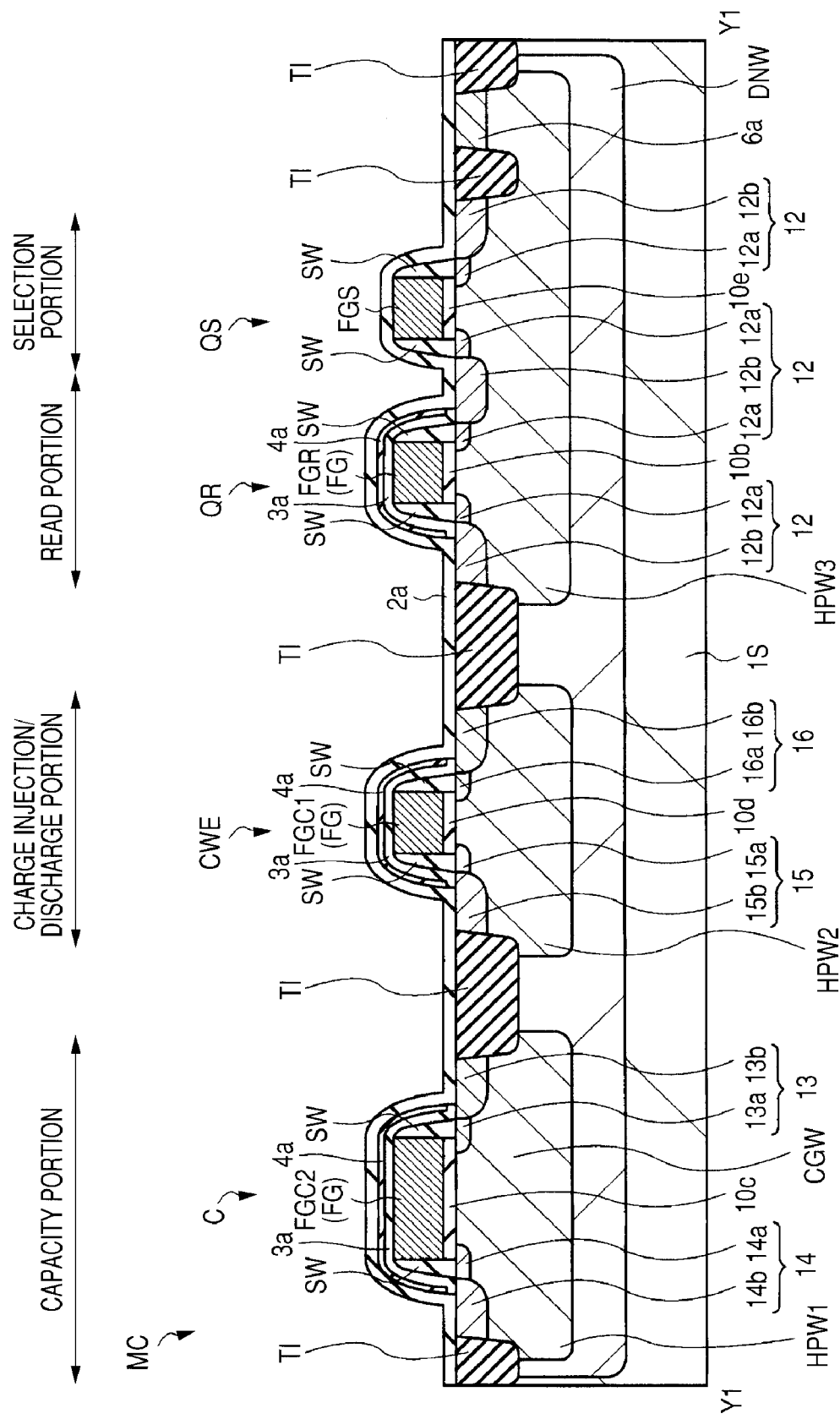
FIG. 29 is a cross sectional view of essential parts of the semiconductor substrate in the nonvolatile memory region during the period of the same process as that in FIG. 28.

Subsequently, as shown in FIG. 28 and FIG. 29, the insulating film 2a made of, for example, a silicon nitride film is deposited over the main surface of the substrate 1S (semiconductor wafer) by the CVD method etc. so that it covers the floating gate electrode FG and the gate electrodes FGH, FGL. Due to this, the insulating film 2a is deposited both in the memory cell array region and in the LCD driver circuit region. The thickness of the insulating film 2a is, for example, 30 to 100 nm.

The insulating film 2a is formed by the plasma CVD method as described above. When forming a silicon nitride film (insulating film 2a) by the plasma CVD method, a mixed gas of, for example, silane ($SiH_4$) and ammonia ($NH_3$) is used. In plasma, gas molecules dissociate to promote chemical reaction (radical reaction) and thus a film is formed, and therefore, it is possible to form a film at temperatures lower than the low-pressure CVD method. The treatment temperature is, for example, 250 to 400° C. The pressure used in the plasma CVD method is, for example, 30 to 500 Pa. In the plasma CVD method, a high-frequency power supply is used. An insulating film formed by the plasma CVD method is more excellent than a phosphor glass film in humidity resistance and mechanical strength.

Next, as shown in FIG. 11 and FIG. 12, the insulating film 2b made of, for example, a silicon oxide film is deposited over the main surface of the substrate 1S by the CVD method etc. so that it is thicker than the insulating film 2a in the lower layer and further, the top surface of the insulating film 2b is subjected to the chemical mechanical polishing (CMP) process to flatten the top surface of the insulating film 2b.

Subsequently, after the contact hole CT is formed in the insulating films 2a, 2b of the memory cell array and the LCD driver circuit region by the lithography process and the etching process, a conductive film made of, for example, tungsten (W) is deposited over the main surface of the substrate 1S (semiconductor wafer) by the CVD method etc. and the conductor portions 7a to 7k are formed in the contact hole CT by polishing it by the CMP method etc.

At this time, the insulating film 2a is designed to function as an etching stopper at the time of etching to form the contact hole CT. By providing such an insulating film 2a, it is made possible to mainly reduce the dimensions of the element of the main circuit region N.

After the above, the semiconductor device is manufactured by the normal wiring forming process, inspection process, and assembly process.

According to the method of manufacturing a semiconductor device in the present first embodiment, the constituent portion of the MIS•FETQPH, QNH, QPL, QNL for the LCD driver circuit and the constituent portion of the capacity portions C, CWE of the memory cell MC and the MIS•FETQR, QS can be formed simultaneously, and therefore, the manufacturing process of the semiconductor device can be simplified. Due to this, the manufacturing time of the semiconductor device can be shortened. In addition, the cost of the semiconductor device can be reduced.

Second Embodiment

Figure 30:
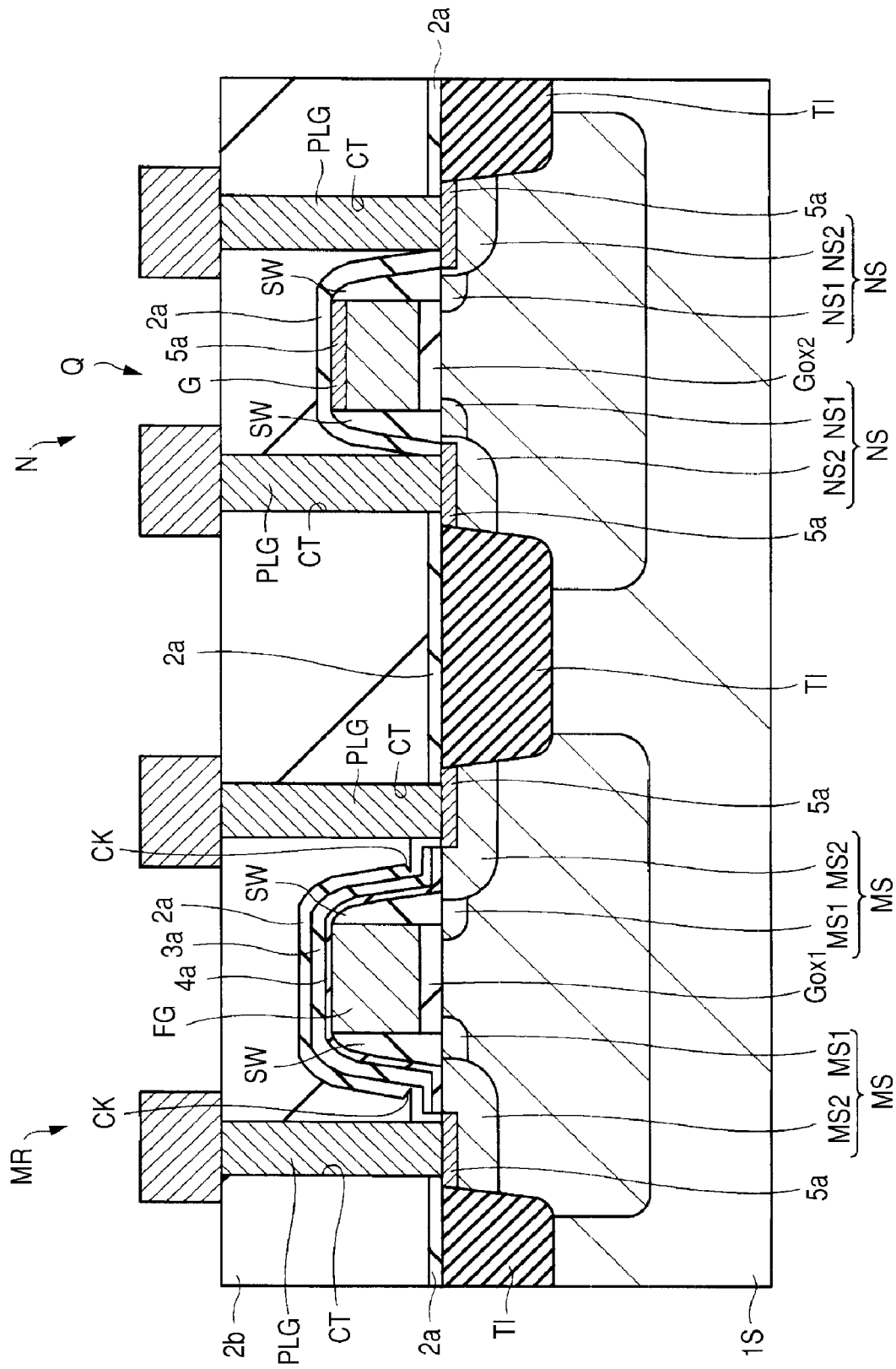
FIG. 30 is a cross sectional view of essential parts of a semiconductor device having a nonvolatile memory in another embodiment (second embodiment) of the present invention.

FIG. 30 shows a cross sectional view of essential parts of a semiconductor device having a flash memory in a present second embodiment. In the present second embodiment, the order of lamination of the cap insulating film 3a and the insulating film 4a is reversed. That is, the pattern of the cap insulating film 3a is formed over the pattern of the insulating film 4a.

The pattern of the insulating film 4a is formed so that it covers the top surface of the floating gate electrode FG and the surface of the sidewall SW on the side surface of the floating gate electrode FG in a state of being in direct contact therewith, and further it covers part of the main surface of the substrate 1S. The pattern of the cap insulating film 3a is formed so that it overlaps the insulating film 4a. Further, over the entire main surface of the substrate 1S, the insulating film 2a is deposited so that it covers the pattern of the cap insulating film 3a and the gate electrode G.

Other portions are the same as those in the first embodiment described above. The specific example of the flash memory is also the same as that described in the first embodiment except for the characteristic parts of the present second embodiment.

In the present second embodiment also, because of the provision of the insulating film 4a, it is possible to suppress or prevent water or hydrogen ions from diffusing to the floating gate electrode FG, and therefore, the data retention characteristics of the flash memory can be improved.

Third Embodiment

Figure 31:
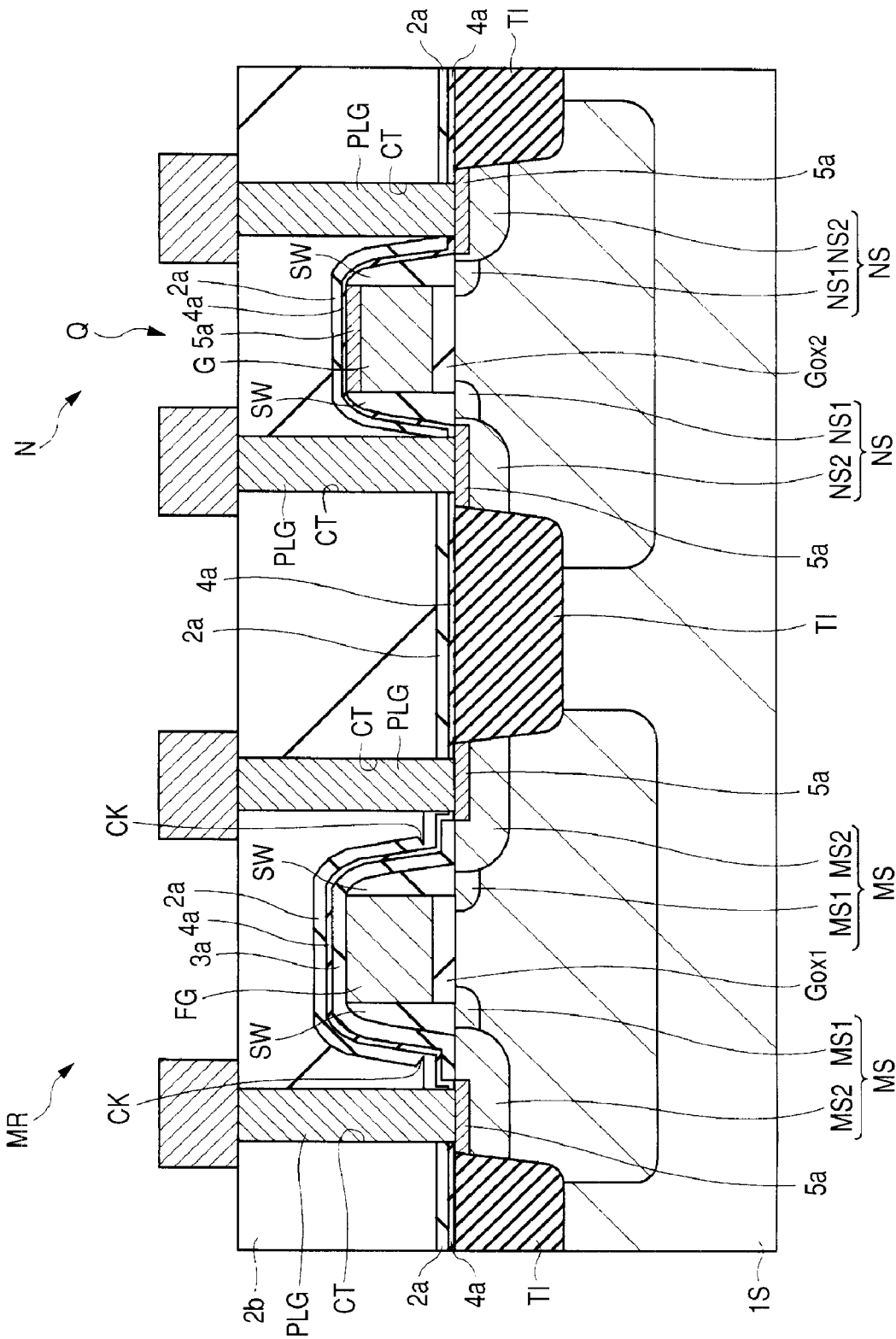
FIG. 31 is a cross sectional view of essential parts of a semiconductor device having a nonvolatile memory in another embodiment (third embodiment) of the present invention.

FIG. 31 shows a cross sectional view of essential parts of a semiconductor device having a flash memory in a present third embodiment. In the present third embodiment, the insulating film 4a is not patterned but deposited over the entire main surface of the substrate 1S.

In the memory cell array MR, the insulating film 4a is formed between the insulating film 2a and the cap insulating film 3a. That is, in the memory cell array MR, the cap insulating film 3a is formed so that it covers the top surface of the floating gate electrode FG and the surface of the sidewall SW on the side surface of the floating gate electrode FG in a state of being in direct contact therewith, and further it covers part of the main surface of the substrate 1S. In addition, in the memory cell array MR, the insulating film 4a is deposited so that it covers the surface of the cap insulating film 3a in a state of being in direct contact therewith. Further, in the memory cell array MR, the insulating film 2a is deposited so that it covers the surface of the insulating film 4a in a state of being in contact therewith.

In the main circuit region N, the insulating film 4a is deposited so that is covers the top surface of the gate electrode G and the surface of the sidewall SW on the side surface of the gate electrode G in a state of being in direct contact therewith. In the main circuit region N, the insulating film 2a is deposited so that it covers the surface of the insulating film 4a in a state of being in contact therewith.

Other portions are the same as those in the first embodiment described above. The specific example of the flash memory is also the same as that described in the first embodiment except for the characteristic parts of the present third embodiment.

In the present third embodiment also, because of the provision of the insulating film 4a, it is possible to suppress or prevent water or hydrogen ions from diffusing to the floating gate electrode FG, and therefore, the data retention characteristics of the flash memory can be improved.

In the present third embodiment, it is not necessary to pattern the insulating film 4a, and therefore, the manufacturing process of the semiconductor device can be simplified accordingly. Because of this, the manufacturing time of the semiconductor device can be reduced.

Fourth Embodiment

Figure 32:
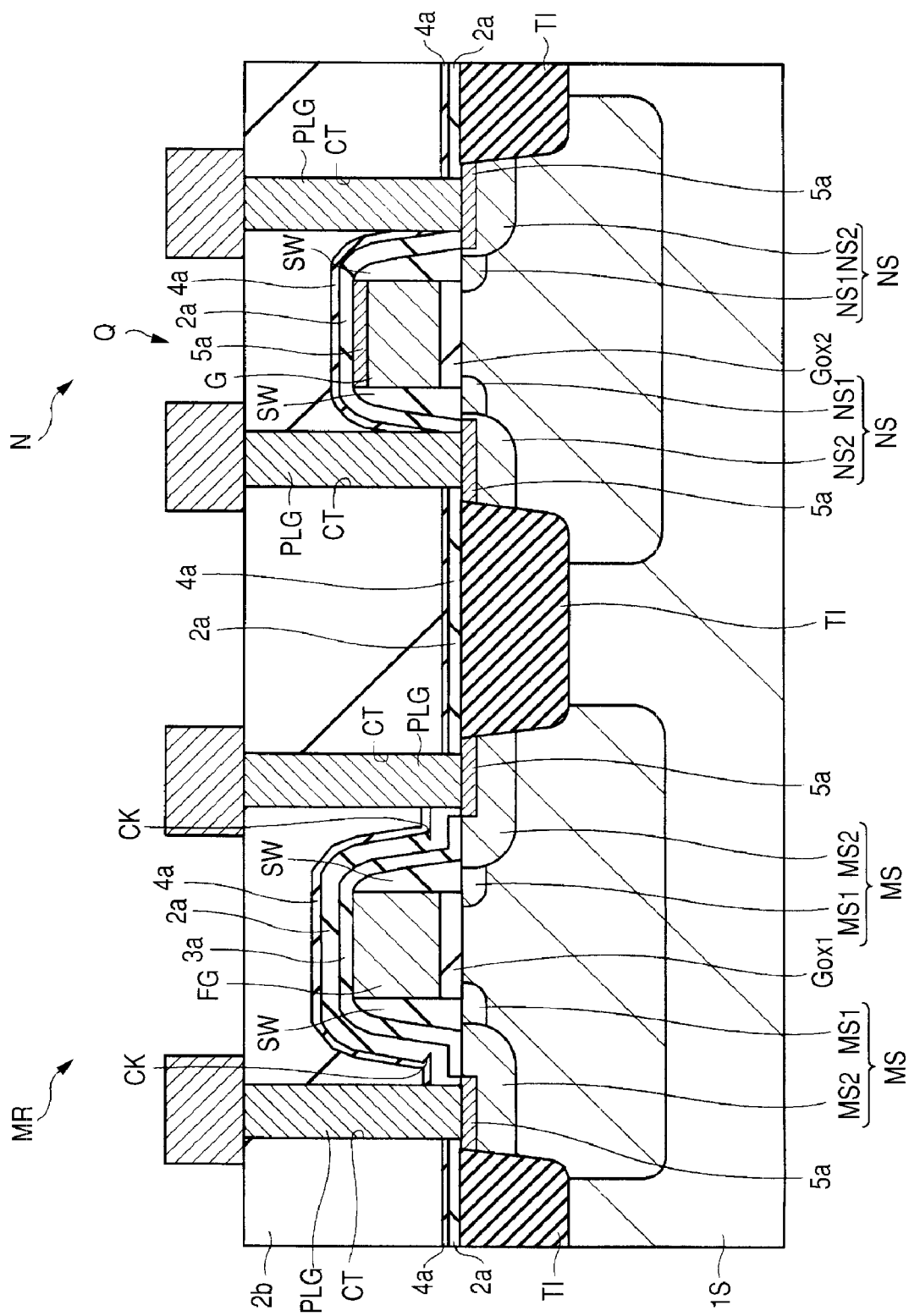
FIG. 32 is a cross sectional view of essential parts of a semiconductor device having a nonvolatile memory in another embodiment (fourth embodiment) of the present invention.

FIG. 32 shows a cross sectional view of essential parts of a semiconductor device having a flash memory in a present fourth embodiment. In the present fourth embodiment, the insulating film 4a is not patterned but deposited over the insulating film 2a (over the entire main surface of the substrate 1S).

In the memory cell array MR, the cap insulating film 3a is formed so that it covers the top surface of the floating gate electrode FG and the surface of the sidewall SW on the side surface of the floating gate electrode FG in a state of being in direct contact therewith, and further it covers part of the main surface of the substrate 1S.

In addition, in the memory cell array MR, the insulating film 2a is deposited so that it covers the pattern of the cap insulating film 3a and over the insulating film 2a, the insulating film 4a is further deposited so that it covers the surface thereof. As described above, the insulating film 4a formed by the low-pressure CVD method is excellent in step coverage, and therefore, the crack CK at the foot of the insulating film 2a that covers the floating gate electrode FG is covered with the insulating film 4a in an excellent manner.

In the main circuit region N, the insulating film 2a is formed so that is covers the top surface of the gate electrode G and the surface of the sidewall SW on the side surface of the gate electrode G in a state of being in direct contact therewith. In the main circuit region N, the insulating film 4a is formed so that it covers the surface of the insulating film 2a in a state of being in contact therewith.

Other portions are the same as those in the first embodiment described above. The specific example of the flash memory is also the same as that described in the first embodiment except for the characteristic parts of the present fourth embodiment.

In the present fourth embodiment also, because of the provision of the insulating film 4a, it is possible to suppress or prevent water or hydrogen ions from diffusing to the floating gate electrode FG, and therefore, the data retention characteristics of the flash memory can be improved.

In the present fourth embodiment also, it is not necessary to pattern the insulating film 4a, and therefore, the manufacturing process of the semiconductor device can be simplified accordingly and the manufacturing time of the semiconductor device can be reduced.

Fifth Embodiment

Figure 33:
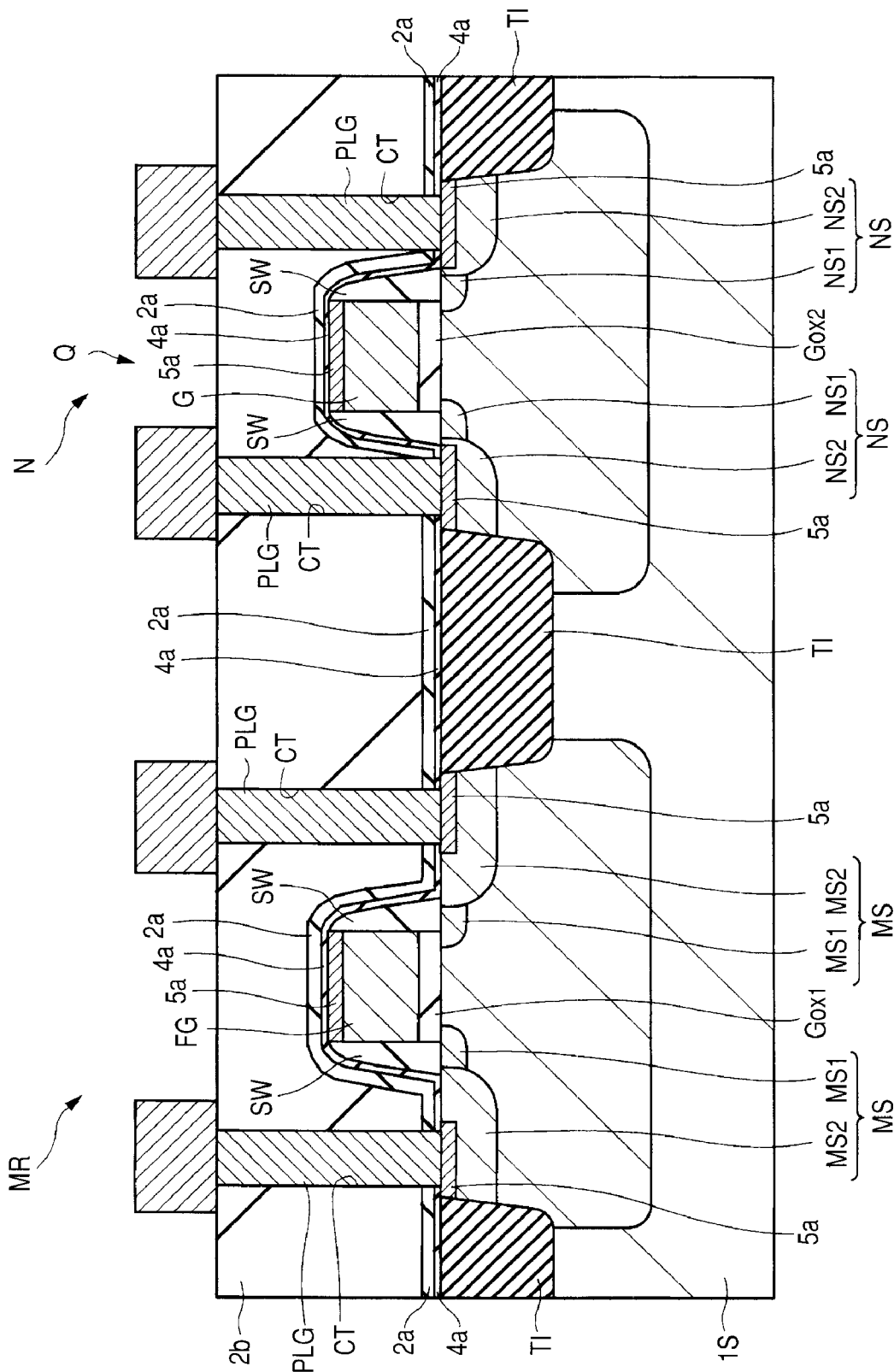
FIG. 33 is a cross sectional view of essential parts of a semiconductor device having a nonvolatile memory in another embodiment (fifth embodiment) of the present invention.

FIG. 33 shows a cross sectional view of essential parts of a semiconductor device having a flash memory in a present fifth embodiment. In the present fifth embodiment, the cap insulating film 3a is not formed or the insulating film 4a is not patterned but deposited over the entire main surface of the substrate 1S.

In the memory cell array MR, the insulating film 4a is deposited so that it covers the top surface of the floating gate electrode FG and the surface of the sidewall SW on the side surface of the floating gate electrode FG in a state of being in direct contact therewith, and further it covers the main surface of the substrate 1S. In the memory cell array MR, the insulating film 2a is deposited so that it covers the surface of the insulating film 4a in a state of being in contact therewith. In the top of the gate electrode FG, the silicide layer 5a is formed.

In the main circuit region N, the insulating film 4a is deposited so that is covers the top surface of the gate electrode G and the surface of the sidewall SW on the side surface of the gate electrode G in a state of being in direct contact therewith. In the main circuit region N, the insulating film 2a is deposited so that it covers the surface of the insulating film 4a in a state of being in contact therewith.

Other portions are the same as those in the first embodiment described above. The specific example of the flash memory is also the same as that described in the first embodiment except for the characteristic parts of the present fifth embodiment.

In the present fifth embodiment also, because of the provision of the insulating film 4a, it is possible to suppress or prevent water or hydrogen ions from diffusing to the floating gate electrode FG, and therefore, the data retention characteristics of the flash memory can be improved.

In the present fifth embodiment also, it is not necessary to pattern the insulating film 4a, and therefore, the manufacturing process of the semiconductor device can be simplified accordingly and the manufacturing time of the semiconductor device can be reduced.

Sixth Embodiment

Figure 34:
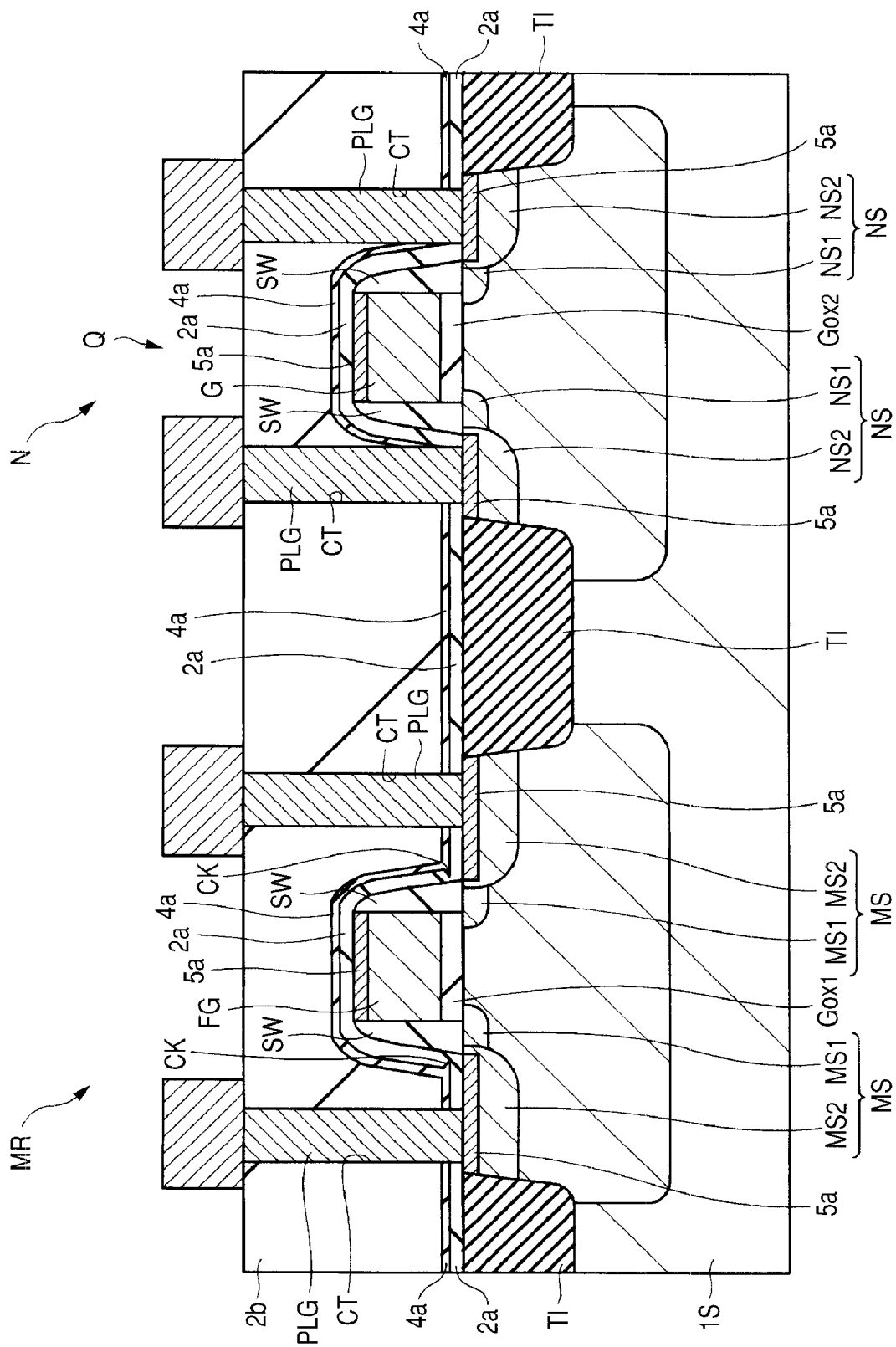
FIG. 34 is a cross sectional view of essential parts of a semiconductor device having a nonvolatile memory in another embodiment (sixth embodiment) of the present invention.

FIG. 34 shows a cross sectional view of essential parts of a semiconductor device having a flash memory in a present sixth embodiment. In the present sixth embodiment, the cap insulating film 3a is not formed or the insulating film 4a is not patterned but deposited over the insulating film 2a (over the entire main surface of the substrate 1S) In the memory cell array MR, the insulating film 2a is deposited so that it covers the top surface of the floating gate electrode FG and the surface of the sidewall SW on the side surface of the floating gate electrode FG in a state of being in direct contact therewith, and further it covers the main surface of the substrate 1S.

In addition, in the memory cell array MR, the insulating film 4a is deposited so that it covers the surface of the insulating film 2a in a state of being in contact therewith. As described above, the insulating film 4a formed by the low-pressure CVD method is excellent in step coverage, and therefore, the crack CK at the foot of the insulating film 2a that covers the floating gate electrode FG is covered with the insulating film 4a in an excellent manner.

In the main circuit region N, the insulating film 2a is deposited so that it covers the top surface of the gate electrode G and the surface of the sidewall SW on the side surface of the gate electrode G in a state of being in direct contact therewith. In the main circuit region N, the insulating film 4a is deposited so that it covers the surface of the insulating film 2a in a state of being in contact therewith.

Other portions are the same as those in the first embodiment described above. The specific example of the flash memory is also the same as that described in the first embodiment except for the characteristic parts of the present sixth embodiment.

In the present sixth embodiment also, because of the provision of the insulating film 4a, it is possible to suppress or prevent water or hydrogen ions from diffusing to the floating gate electrode FG, and therefore, the data retention characteristics of the flash memory can be improved.

In the present sixth embodiment also, it is not necessary to pattern the insulating film 4a, and therefore, the manufacturing process of the semiconductor device can be simplified accordingly and the manufacturing time of the semiconductor device can be reduced.

Seventh Embodiment

Figure 35:
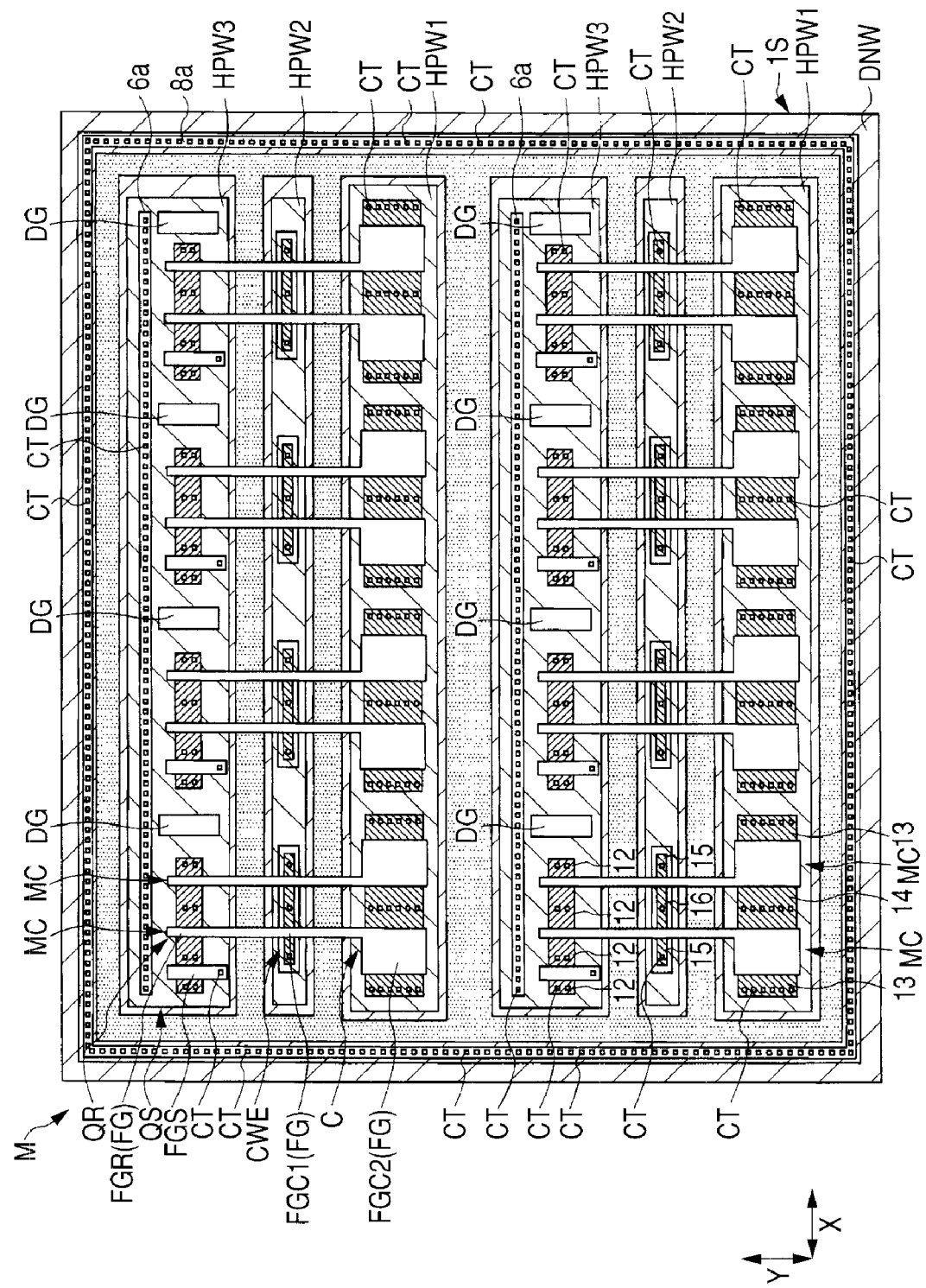
FIG. 35 is a plan view of a flash memory in a semiconductor device in another embodiment (seventh embodiment) of the present invention.

FIG. 35 shows a plan view of essential parts of the memory cell array MR of the flash memory of a semiconductor device in a present seventh embodiment. The cross sectional configuration of the semiconductor device in the present seventh embodiment is the same as those described in the above first to sixth embodiments, and therefore, it is not shown and its description is omitted. The arrangement configuration of the insulating films 2a, 4a and the cap insulating film 3a is also the same as those described in the above first to sixth embodiments, and therefore, its description is omitted.

In the present seventh embodiment, in the memory cell array MR of the flash memory over the main surface (first main surface) of the substrate 1S constituting a semiconductor chip, a plurality of the memory cells MS having, for example, an 8×2 bit configuration are regularly arranged side by side in an array (matrix).

The p-type wells HPW1 to HPW2 are formed so that they extend in the second direction X. In the p-type well HPW1, the capacity portions C corresponding to two or more bits are arranged. In the p-type well HPW2, the capacity portions CWE for data write/erase corresponding to two or more bits are arranged. In the p-type well HPW3, the MIS•FETQRs for data read and the selection MIS•FETQSs corresponding to two or more bits are arranged.

With such an array configuration, the region occupied by the flash memory can be reduced, and therefore, the added value of the semiconductor device can be improved without an increase in size of the semiconductor chip.

In the present seventh embodiment, a dummy gate electrode DG is arranged in an empty region of the substrate 1S of the memory cell array MR. The dummy gate electrode DG is provided in consideration of the flatness and the repetitive arrangement of pattern of the interlayer insulating film 2b and is a pattern that is not electrically coupled to other portions in particular.

By providing such a dummy gate electrode DG, the flatness of the interlayer insulating film 2b can be improved. Because of this, the working precision of, for example, the wire formed over the interlayer insulating film 2b and the contact hole CT formed in the interlayer insulating film 2b can be improved.

The configuration of the dummy gate electrode DG is the same as the configuration of the floating gate electrode FG and is formed in the same process. Because of this, it is possible to arrange the dummy gate electrode DG in the memory cell array MR without additional manufacturing process in particular.

Eighth Embodiment

Figure 36:
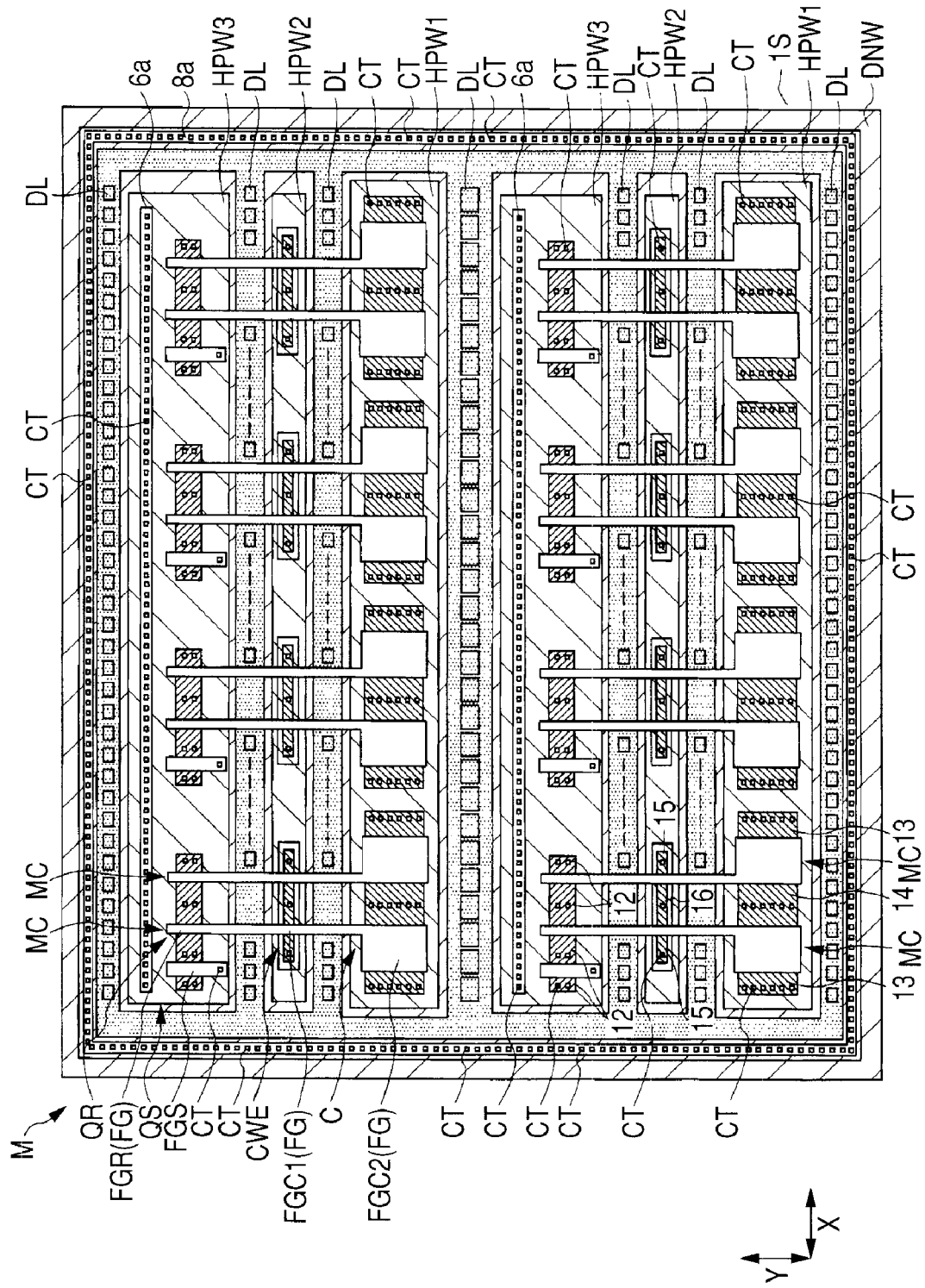
FIG. 36 is a plan view of a flash memory in a semiconductor device in another embodiment (eighth embodiment) of the present invention.

FIG. 36 is a plan view of the flash memory in a semiconductor device in a present eighth embodiment. The cross sectional configuration of the semiconductor device in the present eighth embodiment is the same as those described in the above first to sixth embodiments, and therefore, it is not shown and its description is omitted. The arrangement configuration of the insulating films 2a, 4a and the cap insulating film 3a is also the same as those described in the above first to sixth embodiments, and therefore, its description is omitted.

In the present eighth embodiment, a dummy active region DL is arranged in an empty region of the substrate 1S of the memory cell array MR. The dummy active region DL is provided in consideration of the flatness of the isolation portion TI and is a region in which no semiconductor element is formed.

By providing such a dummy active region DL, the flatness of the top surface of the isolation portion TI can be improved. Because of this, the flatness of, for example, the interlayer insulating film 2b and the wire formed over the isolation portion TI can be improved.

The configuration of the dummy active region DL is the same as that of the active region described above. In addition, the dummy active region DL is formed simultaneously with the active region L. Because of this, it is unlikely that the provision of the dummy active region DL increases the number of manufacturing processes of the semiconductor device.

Although a case is illustrated here, where a plurality of dummy active regions DL having the shape of a plane square is arranged, this is not limitative and the plane shape of the dummy active region DL may a rectangle or strip.

It is also possible to combine the dummy active region DL in the present eighth embodiment with the dummy gate electrode DG in the above seventh embodiment. In this case, it is possible to further improve the flatness of the interlayer insulating film 2b.

Ninth Embodiment

Figure 37:
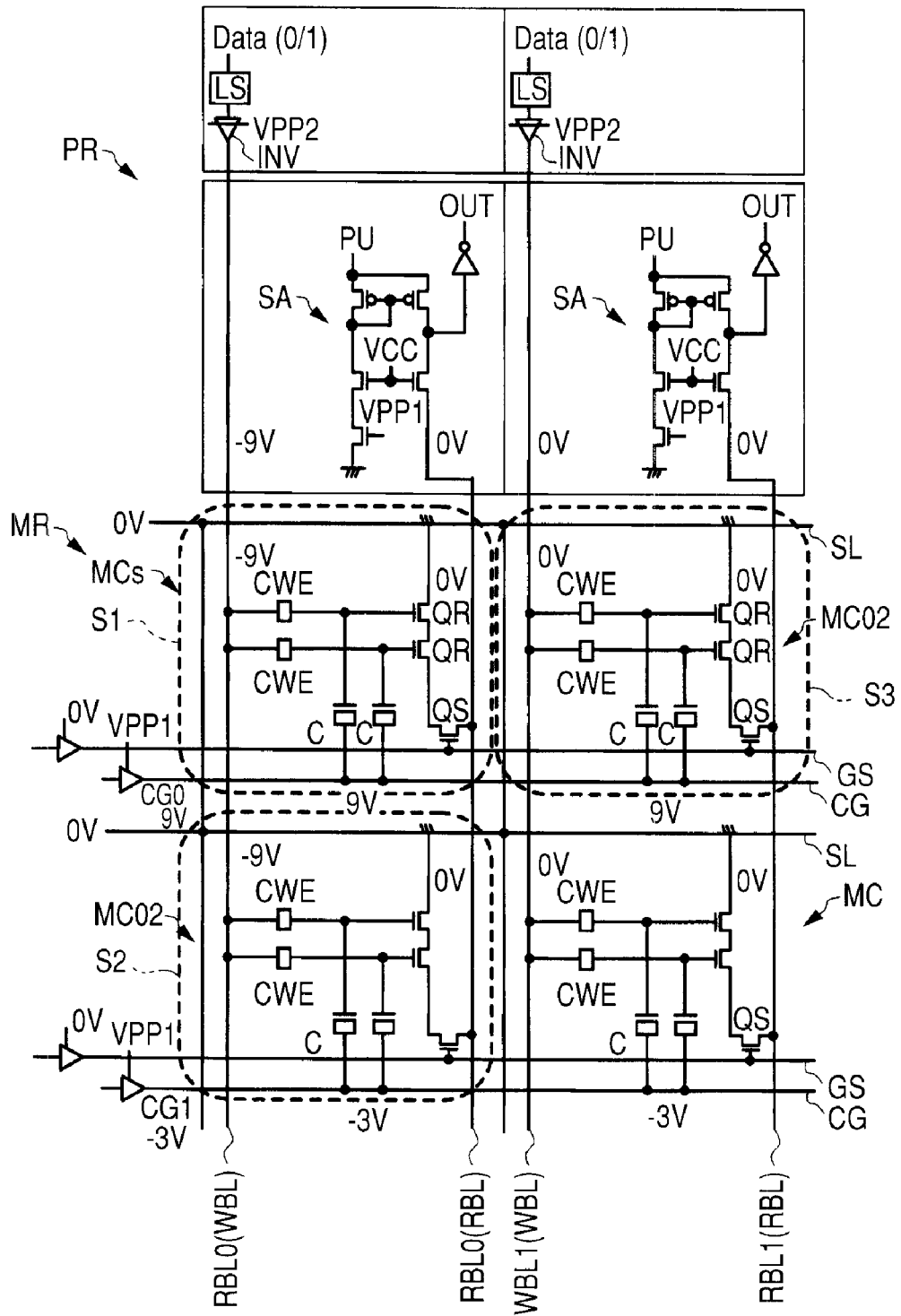
FIG. 37 is a circuit diagram of essential parts of a flash memory in a semiconductor device in another embodiment (ninth embodiment) of the present invention.

FIG. 37 is a circuit diagram of essential parts of the flash memory in a semiconductor device in a present ninth embodiment, a circuit diagram showing a voltage to be applied to each portion at the time of data write operation. Here, the memory cell MCs surrounded by the dashed line S1 shown in FIG. 37 is a memory cell to which data is written (hereinafter, referred to as selected memory cell MCs). The write operation of the selected memory cell MCs is the same as that described in FIG. 6 and FIG. 13 in the first embodiment described above, that is, 9 V is applied to the selection control gate wire CG0 and −9 V is applied to the selection bit line WBL0.

A memory cell MC01 surrounded by the dashed line S2 and a memory cell MC02 surrounded by the dashed line S3 are each a memory cell to which data is not written (hereinafter, referred to as unselected memory cell). In the unselected memory cell MC01, −3 V is applied to the unselection control gate wire CG1 and −9 V is applied to the selection bit line WBL0. In the unselected memory cell MC02, 9 V is applied to the selection control gate wire CG0 and 0 V is applied to the unselection bit line WBL0.

That is, the application of −3 V to the unselection control gate wire CG1 at the time of write operation of the selected memory cell MCs is different from the above first to eighth embodiments.

Figure 38:
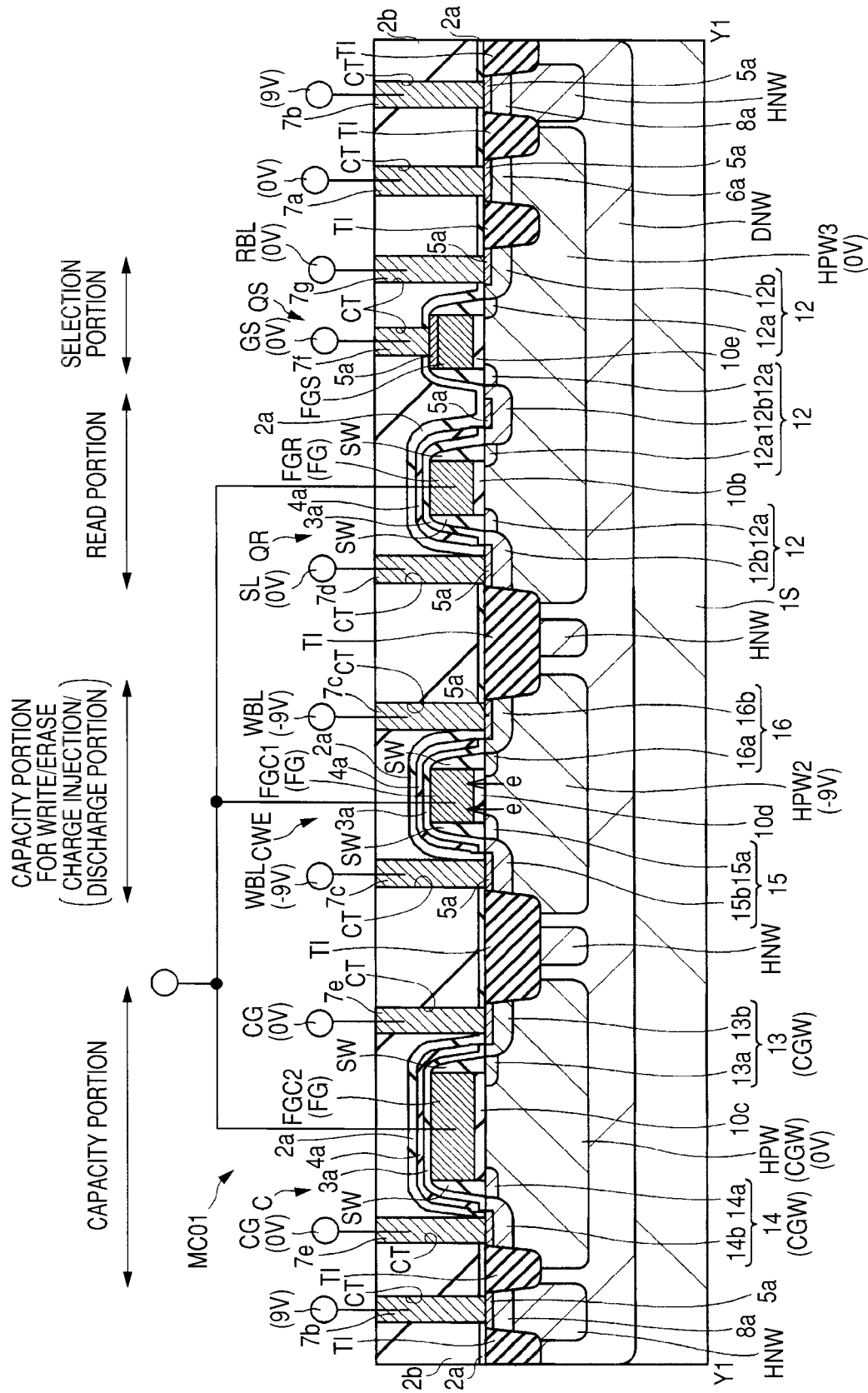
FIG. 38 is a cross sectional view along the Y1-Y1 line of FIG. 10 showing an example of a voltage to be applied to an unselected memory cell MC01 at the time of data write operation of the nonvolatile memory in an embodiment (first to eighth embodiments) of the present invention.
Figure 39:
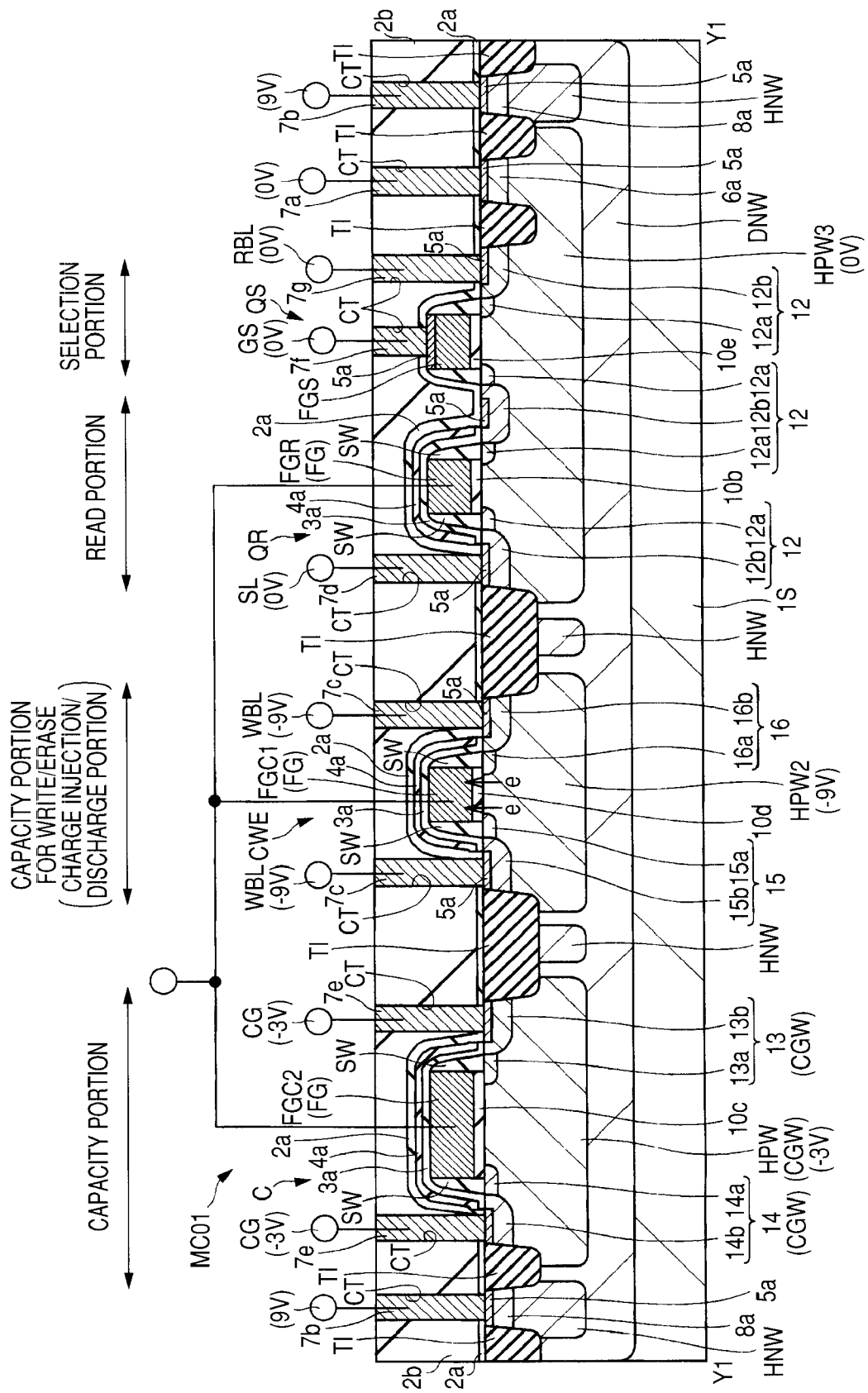
FIG. 39 is a cross sectional view along the Y1-Y1 line of FIG. 10 showing an example of a voltage to be applied to the unselected memory cell MC01 at the time of data write operation of the nonvolatile memory in another embodiment (ninth embodiment) of the present invention.
Figure 40:
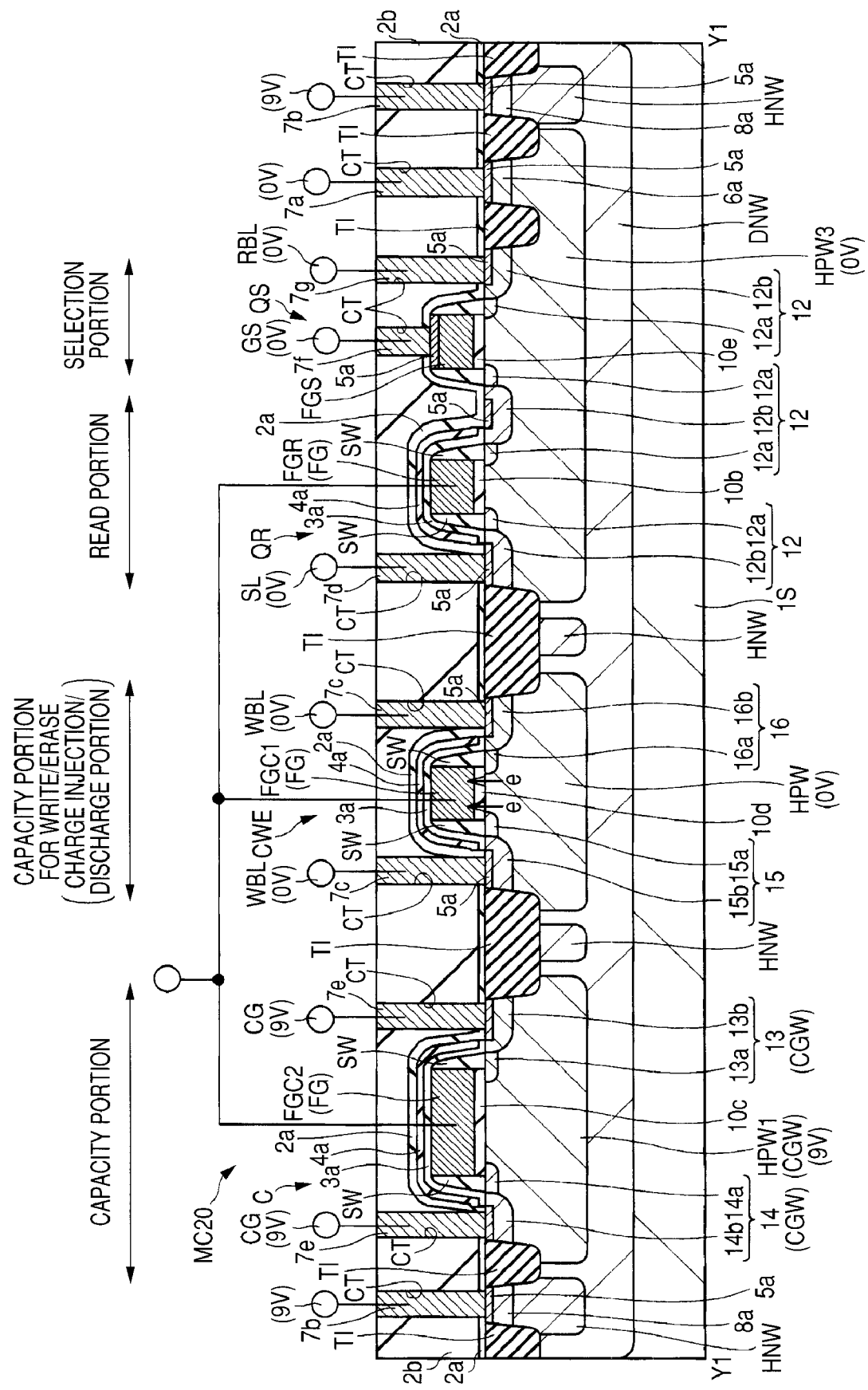
FIG. 40 is a cross sectional view along the Y1-Y1 line of FIG. 10 showing an example of a voltage to be applied to an unselected memory cell MC02 at the time of data write operation of the nonvolatile memory in another embodiment (ninth embodiment) of the present invention.

The reason of applying −3 V to the unselection control gate wire CG1 as described above is described below using FIG. 38 and FIG. 39. FIG. 38 shows a state where the voltage applied to the unselected memory cell MC01 is the same as the voltage applied at the time of data write in the first to eighth embodiments described above and FIG. 39 shows a state where the voltage applied to the unselected memory cell MC01 is a voltage to be applied at the time of data write in the ninth embodiment. FIG. 38, FIG. 39, and FIG. 40 to be described later, are described using the cross sectional view along the Y1-Y1 line of FIG. 10, as FIG. 13 described above.

As shown in FIG. 38, in the unselected memory cell MC01 in the first to eighth embodiments, 0 V is applied to the unselection control gate wire CG1 and −9 V is applied to the selection bit line WBL0, and therefore, a strong electric field is generated in the p-type well HPW2 under the capacity insulating film 10d of the electron injection/discharge portion CWE and there is a possibility that electrons are erroneously injected to the capacity electrode FGC1.

Because of this, in the unselected memory cell MC01 in the present ninth embodiment, as shown in FIG. 39, the voltage to be applied to the unselection control gate wire CG1 is set to −3 V, and therefore, the strong electric field in the p-type well HPW2 under the capacity insulating film 10d is relaxed and thus the electrons can be prevented from being erroneously injected to the capacity electrode FGC1. That is, it is possible to prevent the unselection memory cell MC01 from erroneously entering the write state at the time of data write operation of the selected memory cell MCs.

In addition, as shown in FIG. 40, in the unselected memory cell MC02 in the present ninth embodiment, 9 V is applied to the selection control gate wire CG0 as in the first to eighth embodiments. Because of this, a strong electric field is generated in the p-type well HPW2 under the capacity insulating film 10d of the unselected memory cell MC02, however, the potential of the p-type well HPWL3 of the read portion is also 0 V, and therefore, the electric field generated in the p-type well 2 is weaker than the electric field generated in the memory cell MC01 due to the relationship of the capacity coupling ratio. As a result, it is unlikely that electrons are injected to the capacity electrode FGC1 and the unselected memory cell MC02 enters the write state erroneously at the time of data write operation of the selected memory cell MCs.

The invention made by the present inventors has been described in reference to preferred embodiments thereof. However, the invention is not limited thereto and it is obvious that various variations and modifications can be made without departing from the spirit and scope of the invention.

In the first to ninth embodiments described above, a case is described, where one bit is composed of two memory cells MC (one-bit/two-cell configuration), however, this is not limited, but one bit may be composed of one memory cell MC (one-bit/one-cell configuration). In the case where one bit is composed of two memory cells MC, as in the embodiments described above, even if a defect occurs in one of the memory cells MC and data cannot be retained any longer, it is possible for the other memory cell MC to compensate for this situation, and therefore, the reliability of data retention can be further improved. In the case where one bit is composed of one memory cell MC, the area occupied by the memory cell per bit can be reduced compared to the case where one bit is composed of two memory cells MC, and therefore, miniaturization of a semiconductor device can be promoted.

It may also be possible to form the cap insulating film 3b so that it covers only the top surface of the floating gate electrode FG (capacity electrodes FGC1, FGC2, gate electrode FGR, etc.) and the top surface of the gate electrode FGS of the selection MIS•FETQS.

In the above description, the cases are described, where the present invention made by the present inventors is applied to the method of manufacturing a semiconductor device in the field of application, which is the background of the present invention, however, the present invention is not limited thereto, but can be applied in a variety of ways, and for example, the present invention can be applied to a method of manufacturing a micromachine. In this case, it is possible to store simple information of a micromachine by forming the flash memory over a substrate in which the micromachine is formed.

The present invention can be applied to the manufacturing industry of the semiconductor device having a nonvolatile memory.

What is claimed is:

1. A method of manufacturing a semiconductor device, comprising the steps of:
   (a) preparing a semiconductor substrate having a first main surface and a second main surface located on opposite sides to each other along a thickness direction thereof;
   (b) depositing a conductive film over the first main surface of the semiconductor substrate via an insulating film;
   (c) forming a gate electrode in a second circuit region other than a first circuit region of the first main surface of the semiconductor substrate as well as forming a floating gate electrode for nonvolatile memory in the first circuit region of the first main surface of the semiconductor substrate by patterning the conductive film;
   (d) depositing a first insulating film containing nitrogen by a thermochemical vapor deposition method over the first main surface of the semiconductor substrate so that it covers the floating gate electrode and the gate electrode;
   (e) after the step (d), removing the first insulating film in the second circuit region and forming a pattern of the first insulating film so that it covers the floating gate electrode in the first circuit region by subjecting the first insulating film to etching processing;
   (f) after the step (e), depositing a second insulating film containing nitrogen over the first main surface of the semiconductor substrate by a plasma chemical vapor deposition method so that it covers the pattern of the first insulating film and the gate electrode;
   (g) after the step (f), depositing a third insulating film containing oxygen over the second insulating film; and
   (h) after the step (g), forming a connection hole in the third insulating film and the second insulating film in the first circuit region and the second circuit region.

2. The method of manufacturing a semiconductor device according to claim 1, wherein:
   in the first circuit region, there are formed: a first well of first conductivity type formed on the first main surface of the semiconductor substrate; a second well of second conductivity type having a conductivity type opposite to the first conductivity type and arranged so that it is included in the first well; a third well of the second conductivity type and arranged so that it is included in the first well along the second well in a state of being electrically isolated from the second well; a fourth well of the second conductivity type and arranged so that it is included in the first well along the second well in a state of being electrically isolated from the second well and the third well; and a nonvolatile memory cell arranged so that it overlaps the second well, the third well, and the fourth well in a planar manner;

the nonvolatile memory cell has: a floating gate electrode arranged so that it extends in a first direction while overlapping the second well, the third well, and the fourth well in a planar manner; an element for data write and erase formed at a first position where the floating gate electrode overlaps the second well in a planar manner; a field effect transistor for data read formed at a second position where the floating gate electrode overlaps the third well in a planar manner; and a capacitive element formed at a third position where the floating gate electrode overlaps the fourth well in a planar manner;

the element for data write and erase has: a first electrode formed at the first position of the floating gate electrode; an insulating film formed between the first electrode and the semiconductor substrate; a semiconductor region formed at a position where the first electrode is sandwiched in the second well; and the second well;

the field effect transistor for data read has: a second electrode formed at the second position of the floating gate electrode; an insulating film formed between the second electrode and the semiconductor substrate; and a pair of semiconductor regions of first conductivity type formed at a position where the second electrode is sandwiched in the third well; and the capacitive element has: a third electrode formed at the third position of the floating gate electrode; an insulating film formed between the third electrode and the semiconductor substrate; a semiconductor region formed at a position where the third electrode is sandwiched in the fourth well; and the fourth well.

3. The method of manufacturing a semiconductor device according to claim 1, further comprising the step of, after the step (c) and before the step (d), forming a cap insulating film containing oxygen so that it covers the floating gate electrode in the first circuit region.

4. The method of manufacturing a semiconductor device according to claim 3, further comprising the step of, after forming the cap insulating film, forming a silicide layer over the first main surface of the semiconductor substrate, wherein:

in the step of forming the cap insulating film, the cap insulating film is formed so that part of the cap insulating film covers part of the first main surface of the semiconductor substrate and the silicide layer is separated from the side surface of the floating gate electrode.

5. The method of manufacturing a semiconductor device according to claim 1, wherein the first insulating film includes a silicon nitride film formed by the thermochemical vapor deposition method, the second insulating film includes a silicon nitride film formed by the plasma chemical vapor deposition method, and the third insulating film includes a silicon oxide film.

* * * * *